(12) United States Patent  (10) Patent No.: US 8,559,564 B2
Kim et al.  (45) Date of Patent: Oct. 15, 2013

(54) TRANSMITTING/RECEIVING SYSTEM AND METHOD OF PROCESSING BROADCAST SIGNAL IN TRANSMITTING/RECEIVING SYSTEM

(75) Inventors: Jin Woo Kim, Seoul (KR); Byoung Gill Kim, Seoul (KR); Won Gyu Song, Seoul (KR); Hyoung Gon Lee, Seoul (KR); In Hwan Choi, Seoul (KR)

(73) Assignee: LG Electronics Inc., Seoul (KR)

( * ) Notice: Subject to any disclaimer, the term of this patent is extended or adjusted under 35 U.S.C. 154(b) by 573 days.

(21) Appl. No.: 12/783,871

(22) Filed: May 20, 2010

(65) Prior Publication Data

US 2010/0309969 A1  Dec. 9, 2010

Related U.S. Application Data

(60) Provisional application No. 61/180,427, filed on May 21, 2009.

(51) Int. Cl.
H04L 27/00 (2006.01)
(52) U.S. Cl.
USPC .......... 375/326; 375/324; 375/322; 329/311; 329/315; 329/345; 329/347; 455/214
(58) Field of Classification Search
None
See application file for complete search history.

(56) References Cited

U.S. PATENT DOCUMENTS

| | | | |
|---|---|---|---|
| 6,839,388 B2* | 1/2005 | Vaidyanathan | 375/326 |
| 2004/0184521 A1* | 9/2004 | Chen et al. | 375/231 |
| 2007/0172003 A1* | 7/2007 | Kim et al. | 375/326 |
| 2007/0195891 A1* | 8/2007 | Park et al. | 375/240.25 |
| 2007/0201544 A1* | 8/2007 | Zhu et al. | 375/229 |
| 2007/0217551 A1* | 9/2007 | Kang et al. | 375/343 |
| 2007/0297544 A1* | 12/2007 | Choi et al. | 375/346 |
| 2009/0028080 A1* | 1/2009 | Song et al. | 370/310 |
| 2009/0028081 A1* | 1/2009 | Song et al. | 370/310 |
| 2009/0028272 A1* | 1/2009 | Song et al. | 375/322 |
| 2009/0083606 A1* | 3/2009 | Choi et al. | 714/776 |

* cited by examiner

*Primary Examiner* — Shuwang Liu
*Assistant Examiner* — Gina McKie
(74) *Attorney, Agent, or Firm* — Lee, Hong, Degerman, Kang & Waimey

(57) ABSTRACT

A receiving system and a method of processing broadcast signals in the receiving system are disclosed. The receiving system includes a tuner, a known sequence detector, a carrier recovery unit, a baseband processor, and a channel equalizer. The tuner receives a broadcast signal of a passband including a data group. Herein, the data group comprises mobile service data, a plurality of known data sequences, and signaling data. The known sequence detector estimates an initial frequency offset and detects a position of each known data sequence based on the known data sequence having the first data pattern. The carrier recovery unit acquires an initial frequency synchronization using the initial frequency offset estimated by the known sequence detector and estimates a residual frequency offset based upon the known data sequences having the second data pattern so as to perform carrier recovery. The baseband processor performs complex multiplication between the received broadcast signal and an output of the carrier recovery unit, thereby converting the passband broadcast signal to a baseband broadcast signal.

21 Claims, 57 Drawing Sheets

| Type Indicator (3) | Error Indicator (1) | Stuff Indicator (1) | Pointer Field (11) | Payload (N-2) bytes |
|---|---|---|---|---|

FIG. 26
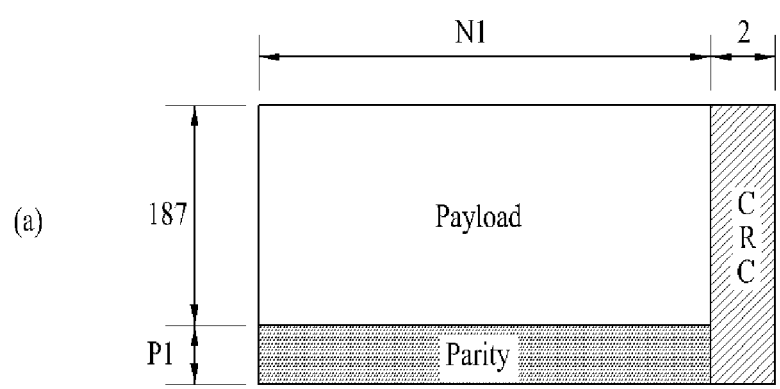
(a)
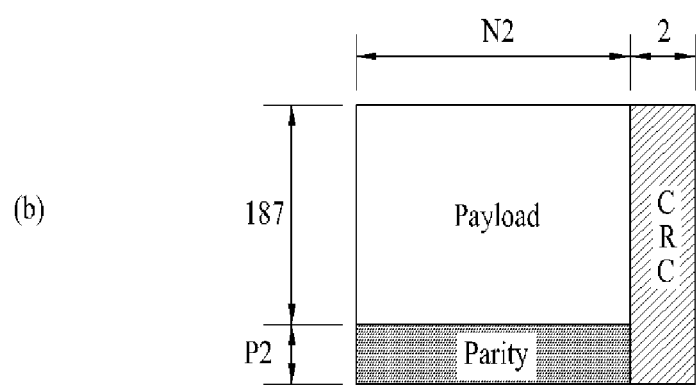
(b)

FIG. 30

| i | 0 | 1 | 2 | 3 | 4 | 5 | 6 | 7 | 8 | 9 | 10 | 11 | 12 | 13 | 14 | 15 | ... | 2110 | 2111 |
|---|---|---|---|---|---|---|---|---|---|---|---|---|---|---|---|---|---|---|---|
| P'(i) | 0 | 89 | 267 | 534 | 890 | 1335 | 1869 | 2492 | 3204 | 4005 | 799 | 1778 | 2846 | 4003 | 1153 | 2488 | ... | 2809 | 2272 |
| P(i) | 0 | 89 | 267 | 534 | 890 | 1335 | 1869 | 799 | 1778 | 1153 | 1329 | 526 | 79 | 2037 | 253 | 874 | ... | 444 | 2048 |

N : Normal mode, I : Initialization mode

FIG. 36
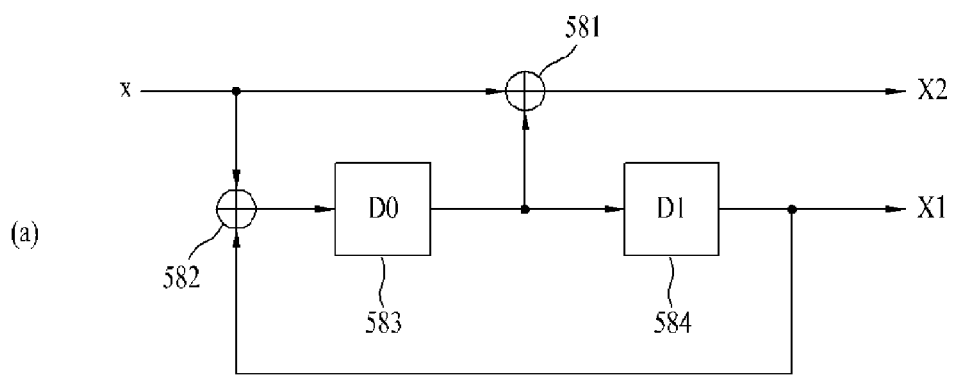
(a)
even component encoder
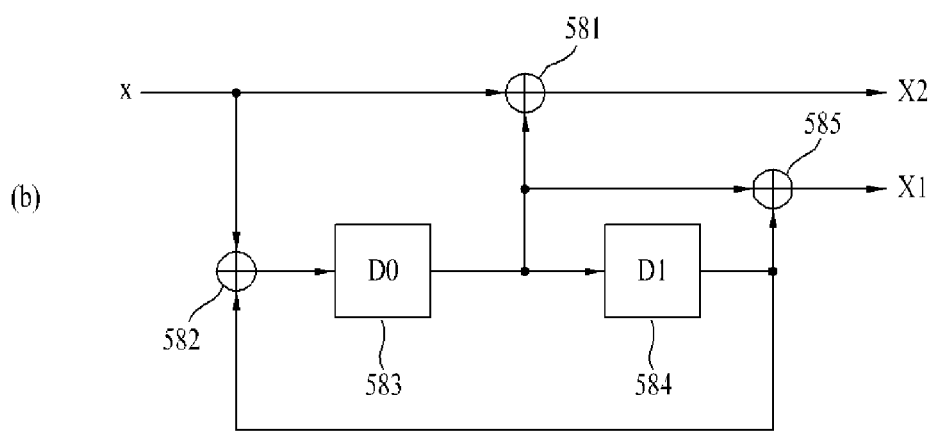
(b)
odd component encoder

FIG. 38

| Syntax | No. of bits | Format |
|---|---|---|
| TPC_data { | | |
|     Sub-Frame_number | 3 | uimsbf |
|     Slot_number | 4 | uimsbf |
|     Parade_id | 7 | uimsbf |
|     starting_Group_number | 4 | uimsbf |
|     number_of_Groups | 3 | uimsbf |
|     Parade_repetition_cycle | 3 | uimsbf |
|     RS_Frame_mode | 2 | bslbf |
|     RS_code_mode_primary | 2 | bslbf |
|     RS_code_mode_secondary | 2 | bslbf |
|     SCCC_Block_mode | 2 | bslbf |
|     SCCC_outer_code_mode_A | 2 | bslbf |
|     SCCC_outer_code_mode_B | 2 | bslbf |
|     SCCC_outer_code_mode_C | 2 | bslbf |
|     SCCC_outer_code_mode_D | 2 | bslbf |
|     FIC_version | 5 | uimsbf |
|     Parade_continuity_counter | 4 | uimsbf |
|     TNoG | 5 | uimsbf |
|     reserved | 26 | bslbf |
| } | | |

FIG. 45
(a) 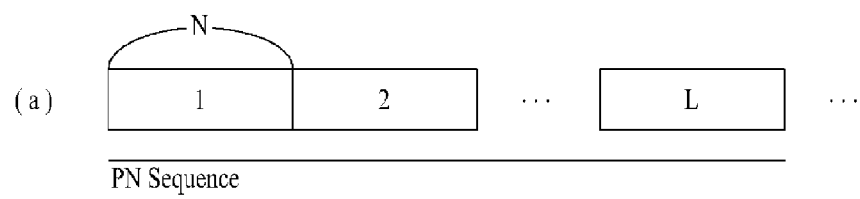
PN Sequence
(b) 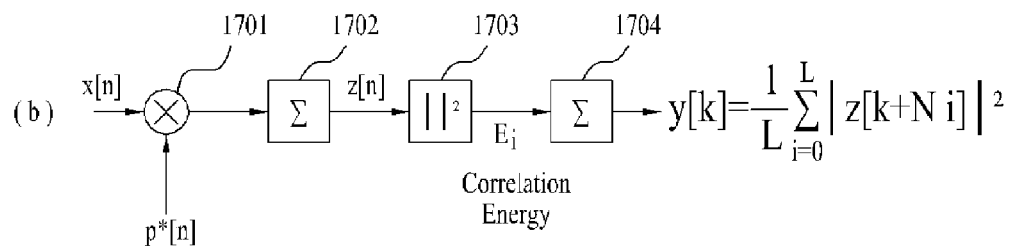
L : Number of parts
N : Length of each part

```
Index     :  0   1   2   3  ... 11997 11998 11999 12000 12001 12002 ... 23997 23998 23999 ...
Output    :  0  89  267 534 ...  6267  6089  6000  6000  6089  6267 ...   267    89     0 ...
Direction :  <----- forward -----><----- reverse ----->
```

FIG. 54
Interleaver Operation
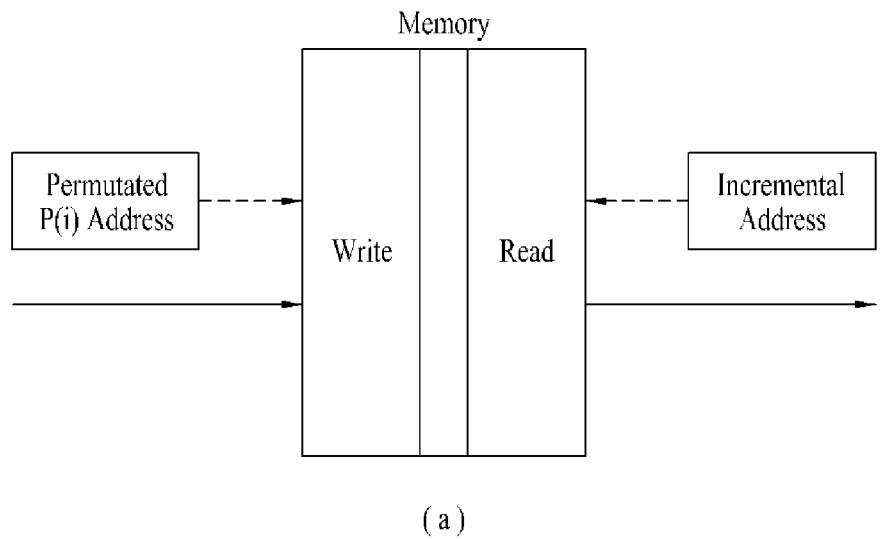
(a)
Deinterleaver Operation
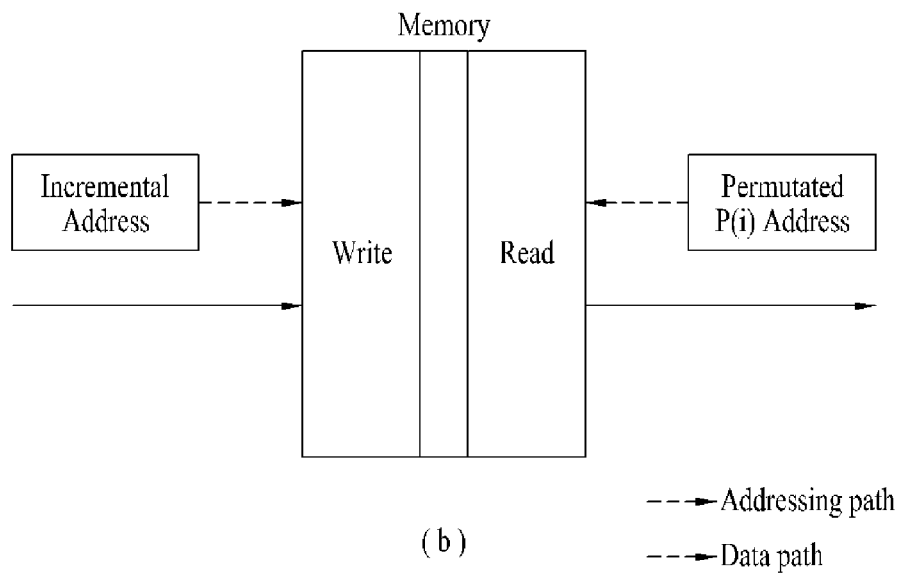
(b)

TRANSMITTING/RECEIVING SYSTEM AND METHOD OF PROCESSING BROADCAST SIGNAL IN TRANSMITTING/RECEIVING SYSTEM

CROSS-REFERENCE TO RELATED APPLICATIONS

Pursuant to 35 U.S.C. 119(e), this application claims the benefit of U.S. Provisional Application No. 61/180,427, filed on May 21, 2009, the contents of which are hereby incorporated by reference herein in their entirety.

BACKGROUND OF THE INVENTION

1. Field of the Invention

The present invention relates to a digital broadcasting system for transmitting and receiving a digital broadcast signal, and more particularly, to a transmitting system for processing and transmitting the digital broadcast signal, and a receiving system for receiving and processing the digital broadcast signal and, a method of processing data in the transmitting system and the receiving system.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Therefore, an object of the present invention is to provide a transmitting system, a receiving system, and a method for processing broadcast signals that are robust against channel changes and noise.

Another object of the present invention is to provide a transmitting system, a receiving system, and a method for processing broadcast signals that can enhance the receiving performance of the receiving system by having the transmitting system perform additional encoding on mobile service data and transmit the encoded mobile service data to the receiving system.

Another object of the present invention is to provide a transmitting system, a receiving system, and a method for processing broadcast signals that can enhance the receiving performance of the receiving system by inserting known data in a predetermined region of the data region, wherein the known data are pre-known in accordance with an agreement between the transmitting system and the receiving system.

A further object of the present invention is to provide a transmitting system, a receiving system, and a method for processing broadcast signals that can enhance the receiving performance of the receiving system by performing carrier recovery and channel equalization using the known data.

To achieve these objects and other advantages and in accordance with the purpose of the invention, as embodied and broadly described herein, a receiving system includes a tuner, a known sequence detector, a carrier recovery unit, a baseband processor, and a channel equalizer. The tuner receives a broadcast signal of a passband including a data group. Herein, the data group comprises mobile service data, a plurality of known data sequences, and signaling data. One of the plurality of known data sequences includes a first M symbol sequence and a second M symbol sequence each having a first data pattern and the remaining known data sequences include N symbol sequences having a second data pattern that is different from the first data pattern. The known sequence detector estimates an initial frequency offset and detects a position of each known data sequence based on the known data sequence having the first data pattern. The carrier recovery unit acquires an initial frequency synchronization using the initial frequency offset estimated by the known sequence detector and estimates a residual frequency offset based upon the known data sequences having the second data pattern so as to perform carrier recovery. The baseband processor performs complex multiplication between the received broadcast signal and an output of the carrier recovery unit, so as to convert the passband broadcast signal to a baseband broadcast signal. The channel equalizer estimates a channel impulse response (CIR) based upon position information of the known data sequences having the second data pattern detected by the known sequence detector and compensates a channel distortion in the baseband broadcast signal.

More specifically, the initial frequency offset comprises a rough frequency offset and a finer frequency offset.

The known sequence detector divides the known data sequence having the first data pattern into multiple parts. The known sequence detector calculates for each part a partial correlation value between the received broadcast signal and a known data sequence of a respective part and estimates the rough frequency offset. Also, the known sequence detector calculates a correlation value between the first M symbol sequence and the second M symbol sequence and estimates the finer frequency offset.

The known data sequences having the second data pattern are spaced 16 segments apart within the data group.

The carrier recovery unit includes an estimator for calculating correlation values between successive known data sequences spaced at 16 segments apart and taking an argument of the calculated correlation values, so as to estimate the residual frequency offset, a multiplexer for selecting the residual frequency offset estimated by the estimator based upon the position information of the known data sequence, a loop filter for performing low pass filtering on the initial frequency offset and the residual frequency offset being outputted from the multiplexer, and an oscillator for outputting a complex signal corresponding to the frequency offset being outputted from the loop filter to the baseband converter.

Herein, the signaling data comprises fast information channel (FIC) data and transmission parameter channel (TPC) data, the FIC data include information for rapid mobile service acquisition, and the TPC data include version information of the FIC data. In addition, the FIC data and the TPC data are positioned between the known data sequence having the first data pattern and one of the known data sequences having the second data pattern.

The receiving system according to the present invention further includes a signaling decoder for performing first decoding on the signaling data included in the channel-distortion-compensated broadcast signal, and a block decoder for performing second decoding on the mobile service data included in the channel-distortion-compensated broadcast signal, wherein the second decoding is different from the first decoding.

Herein, the first decoding corresponds to a Parallel Concatenated Convolutional Code (PCCC) type decoding and the second decoding corresponds to a Serial Concatenated Convolutional Code (SCCC) type decoding.

The receiving system according to the present invention further includes a Reed-Solomon (RS) frame decoder for configuring an RS frame by gathering the second decoded mobile service data, and performing Cyclic Redundancy Check (CRC)-decoding and RS-decoding on the RS frame.

In another aspect of the present invention, a method of processing a broadcast signal in a receiving system includes receiving the broadcast signal of a passband including a data group, the data group comprising mobile service data, a plurality of known data sequences, and signaling data, one of the plurality of known data sequences including a first M symbol sequence and a second M symbol sequence each having a first data pattern, and the remaining known data sequences including N symbol sequences having a second data pattern that is different from the first data pattern, estimating an initial frequency offset and detecting a position of each known data sequence based on the known data sequence having the first data pattern, acquiring an initial frequency synchronization using the estimated initial frequency offset and estimating a residual frequency offset based upon the known data sequences having the second data pattern so as to perform carrier recovery in a carrier recovery unit, performing complex multiplication between the received broadcast signal and an output of the carrier recovery unit, so as to convert the passband broadcast signal to a baseband broadcast signal, and estimating a channel impulse response (CIR) based upon position information of the known data sequences having the second data pattern detected by the known sequence detector and compensating a channel distortion in the baseband broadcast signal.

It is to be understood that both the foregoing general description and the following detailed description of the present invention are exemplary and explanatory and are intended to provide further explanation of the invention as claimed.

BRIEF DESCRIPTION OF THE DRAWINGS

FIG. 26(a) and FIG. 26(b) illustrate an example which a parade consists of two RS frames

FIG. 30 illustrates a symbol interleaver of the block processor;

FIG. 36(a) illustrates a detail block diagram of an even component encoder according to an embodiment of the present invention;

FIG. 36(b) illustrates a detail block diagram of an odd component encoder according to an embodiment of the present invention;

FIG. 37(a) illustrates an exemplary case in which a trellis encoder is serially concatenated with the even component encoder shown in FIG. 36(a);

FIG. 38 illustrates an example of a syntax structure of TPC data according to the present invention;

Figure 46:
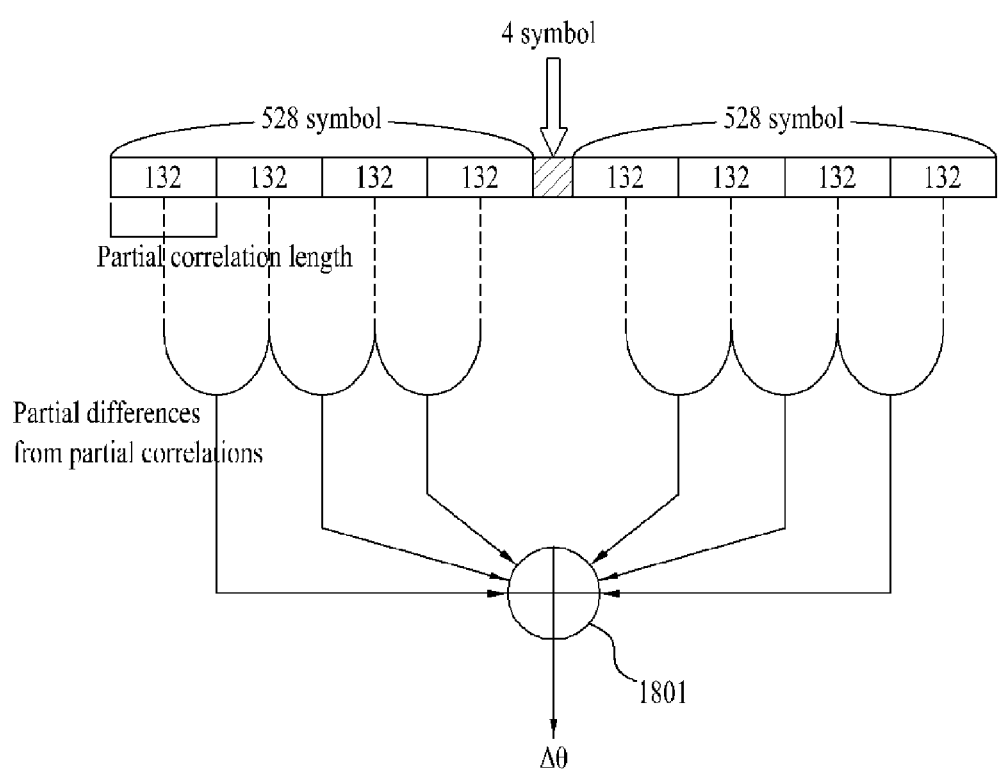
Figure 47:
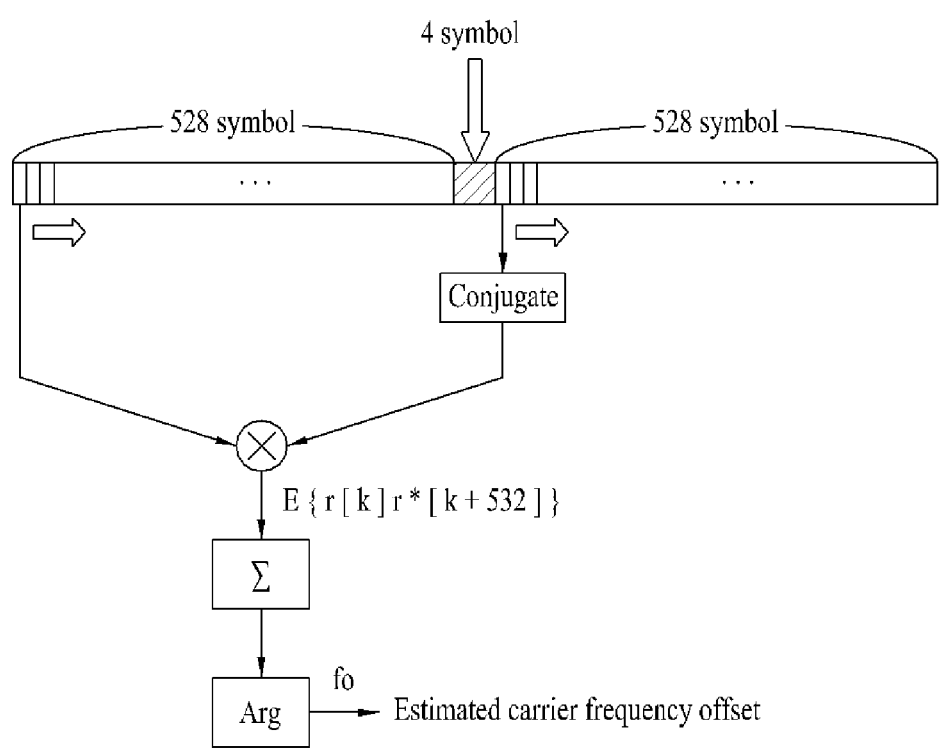
Figure 48:
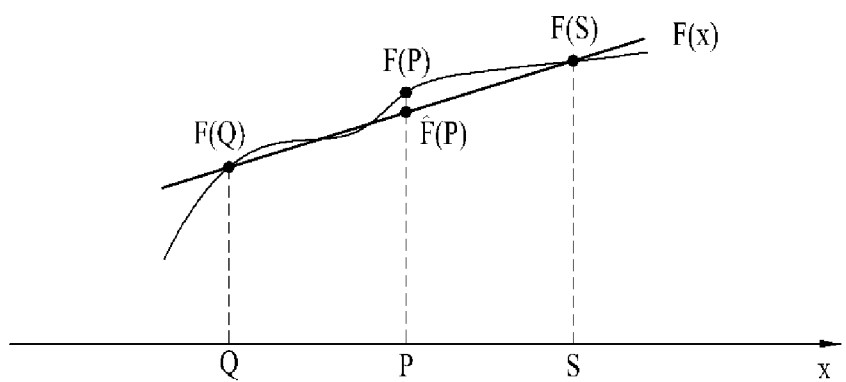
Figure 49:
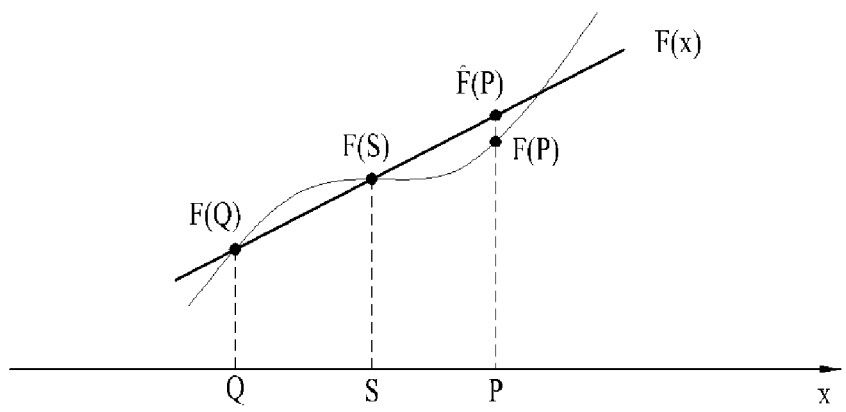
Figure 50:
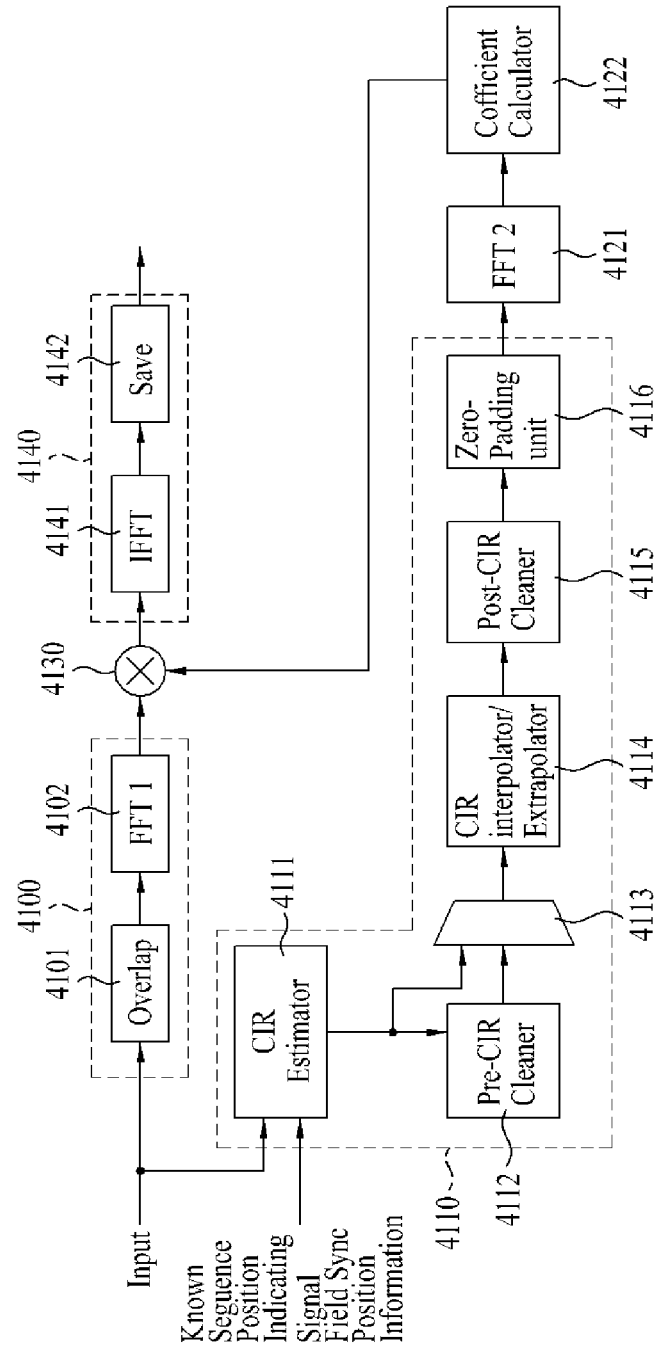
Figure 51:
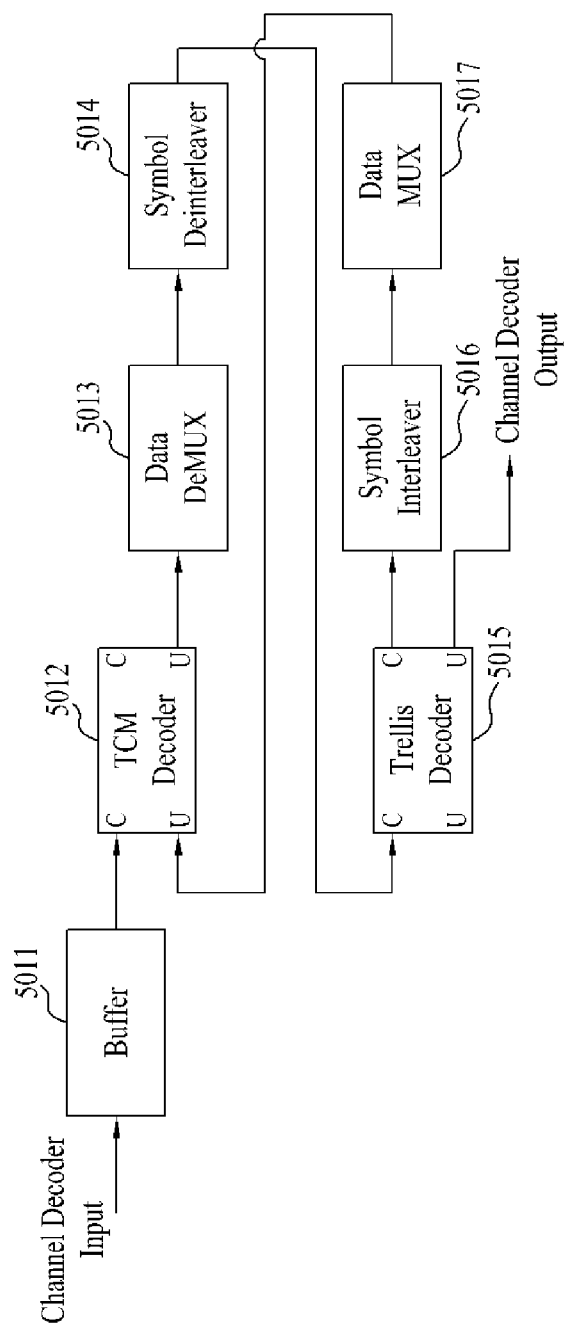
Figures 52, 53:
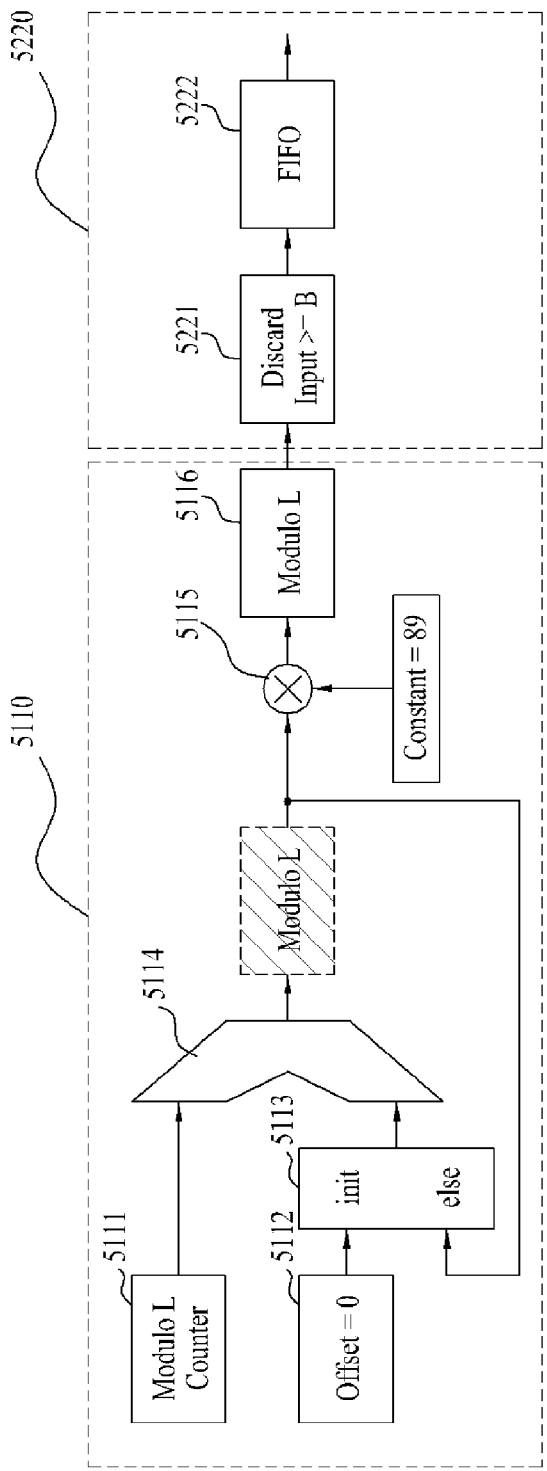
Figure 55:
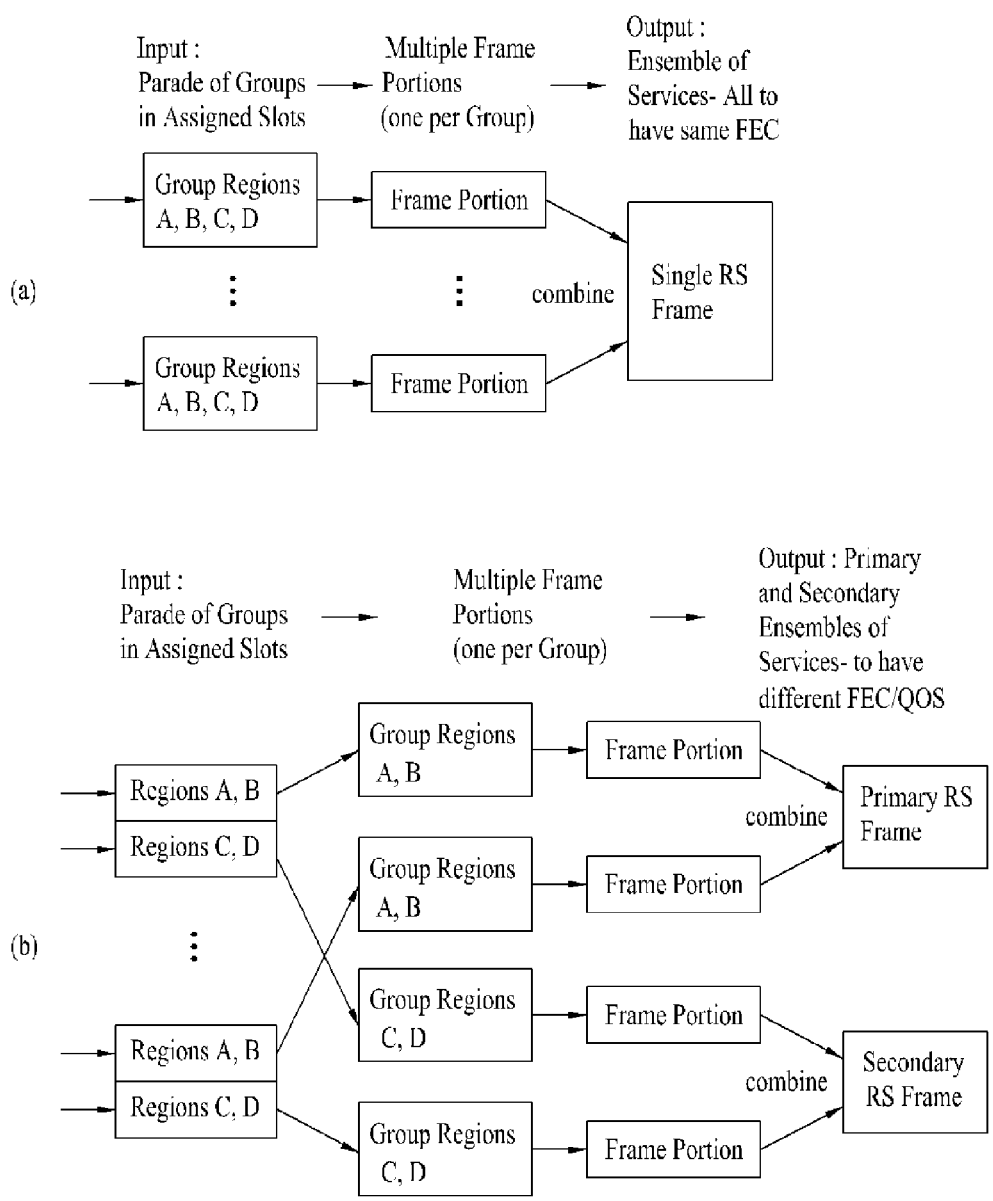
Figure 56:
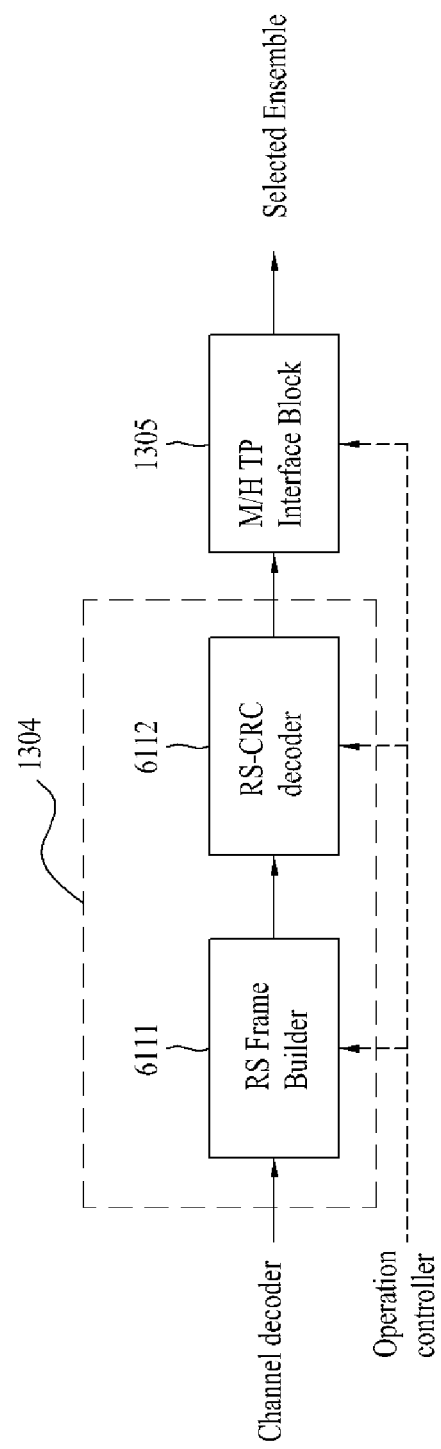
Figure 57:
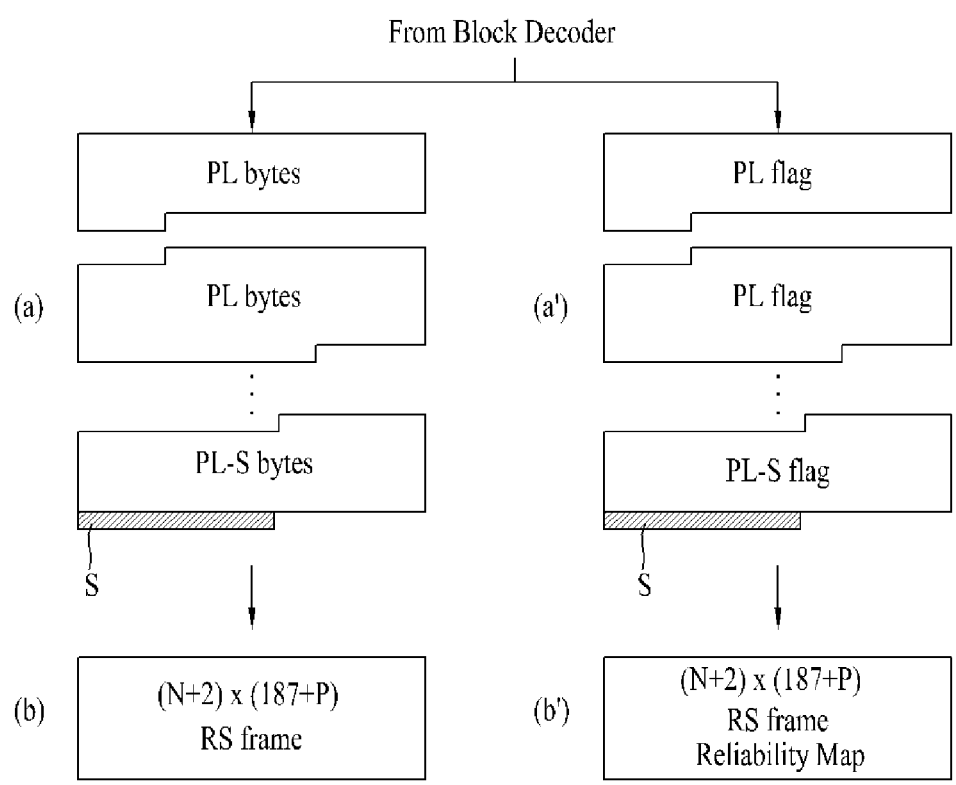
Figure 58:
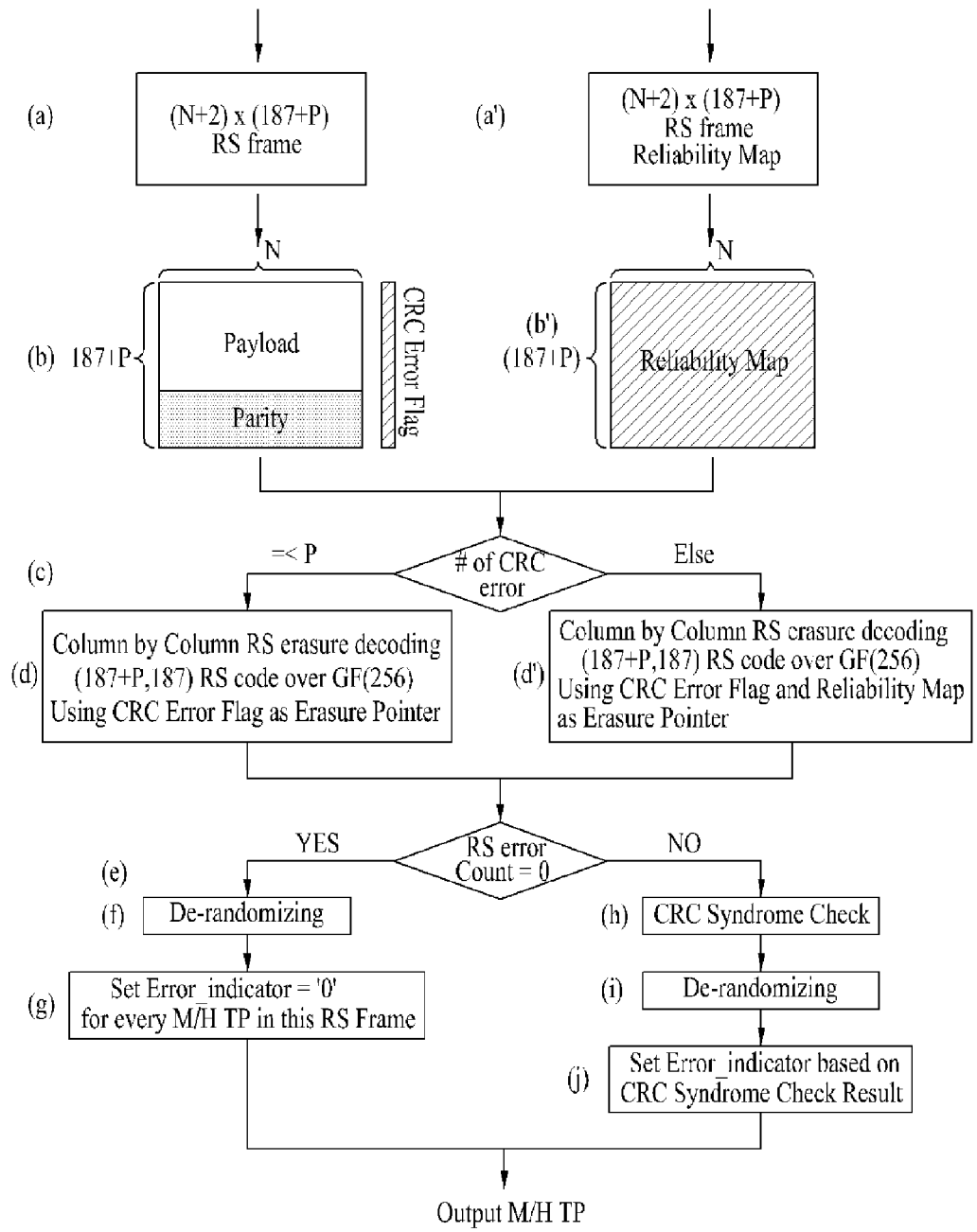
Figure 59:
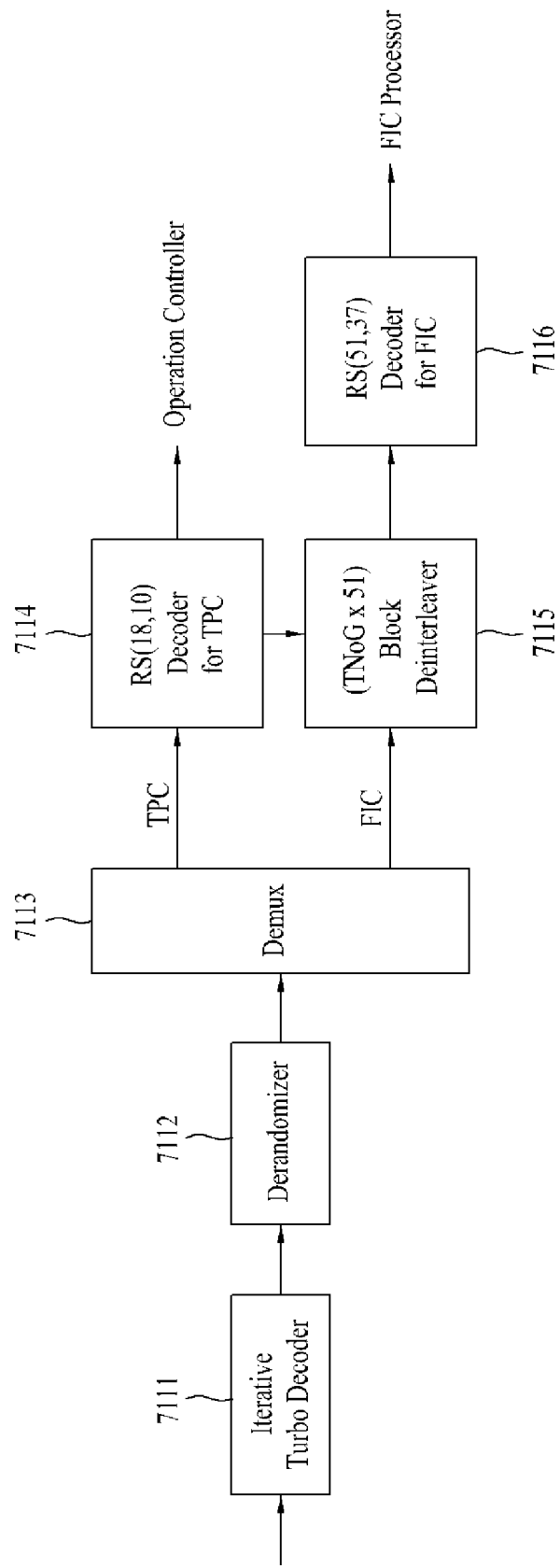
Figure 60:
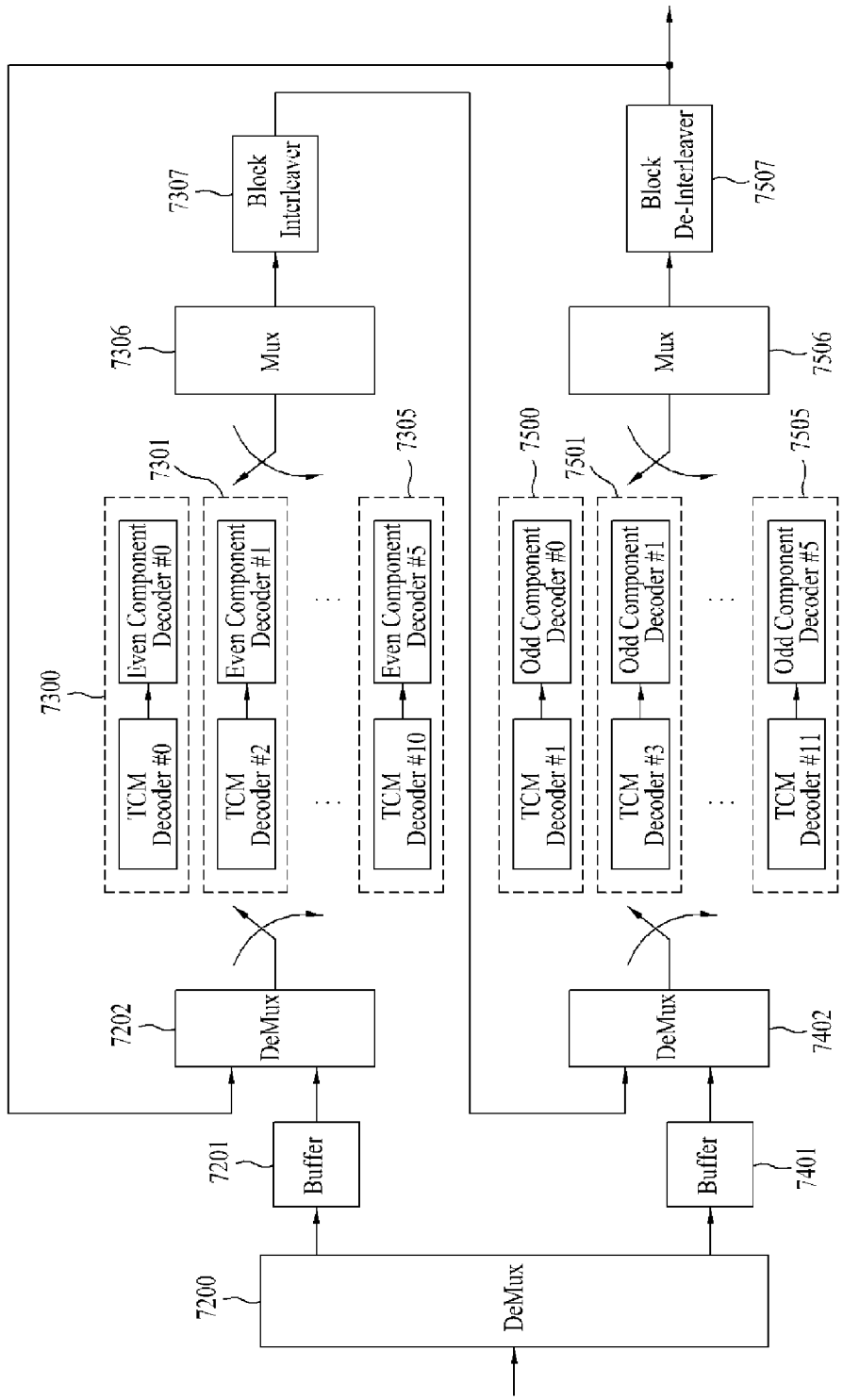
Figure 61:
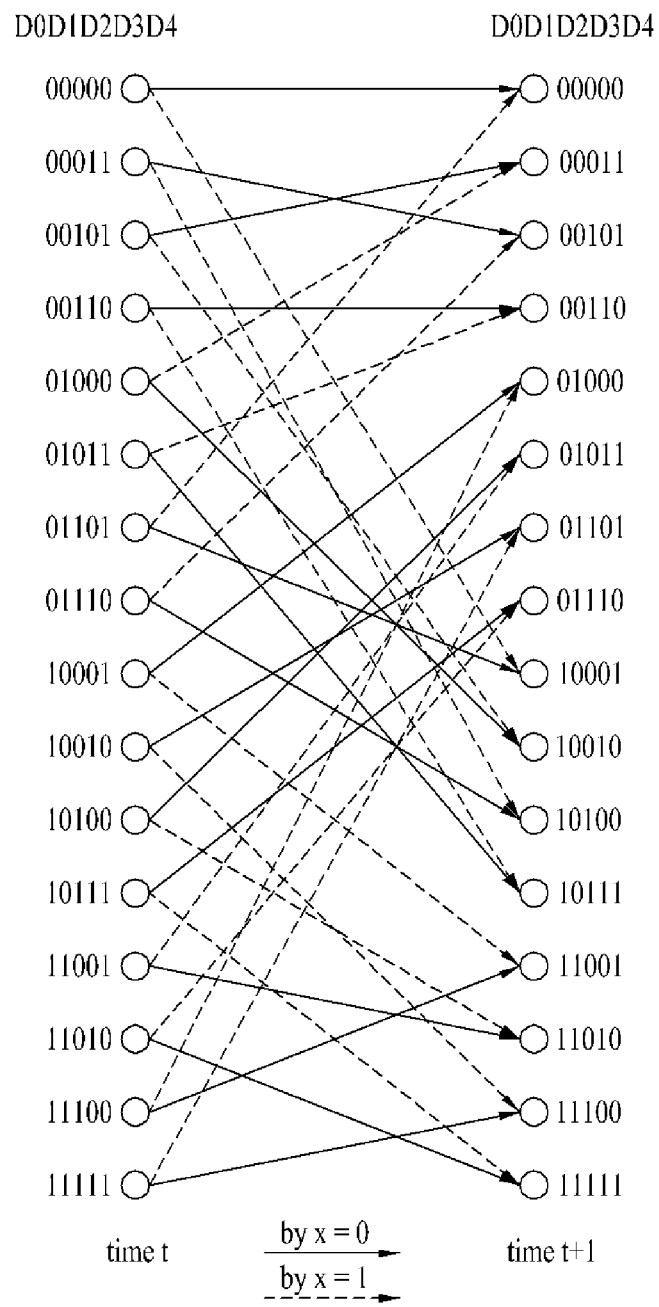
Figure 62:
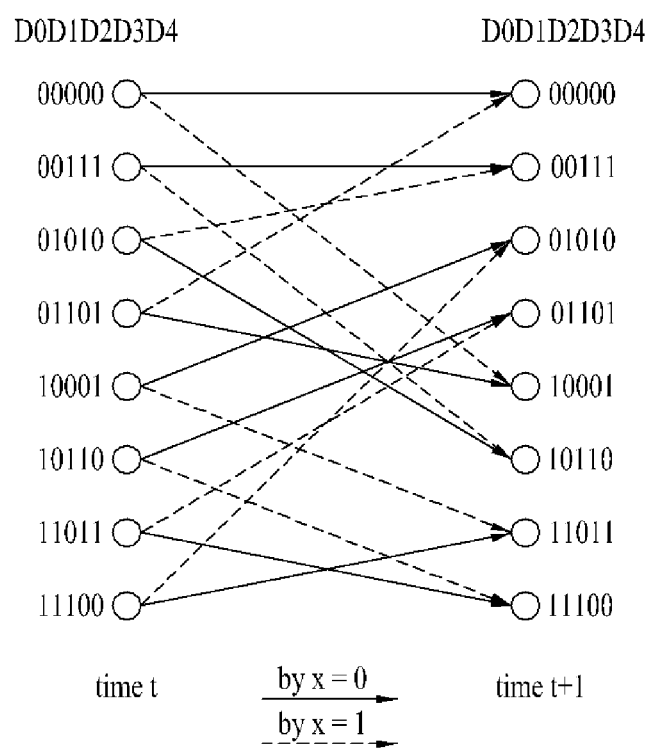
Figure 63:
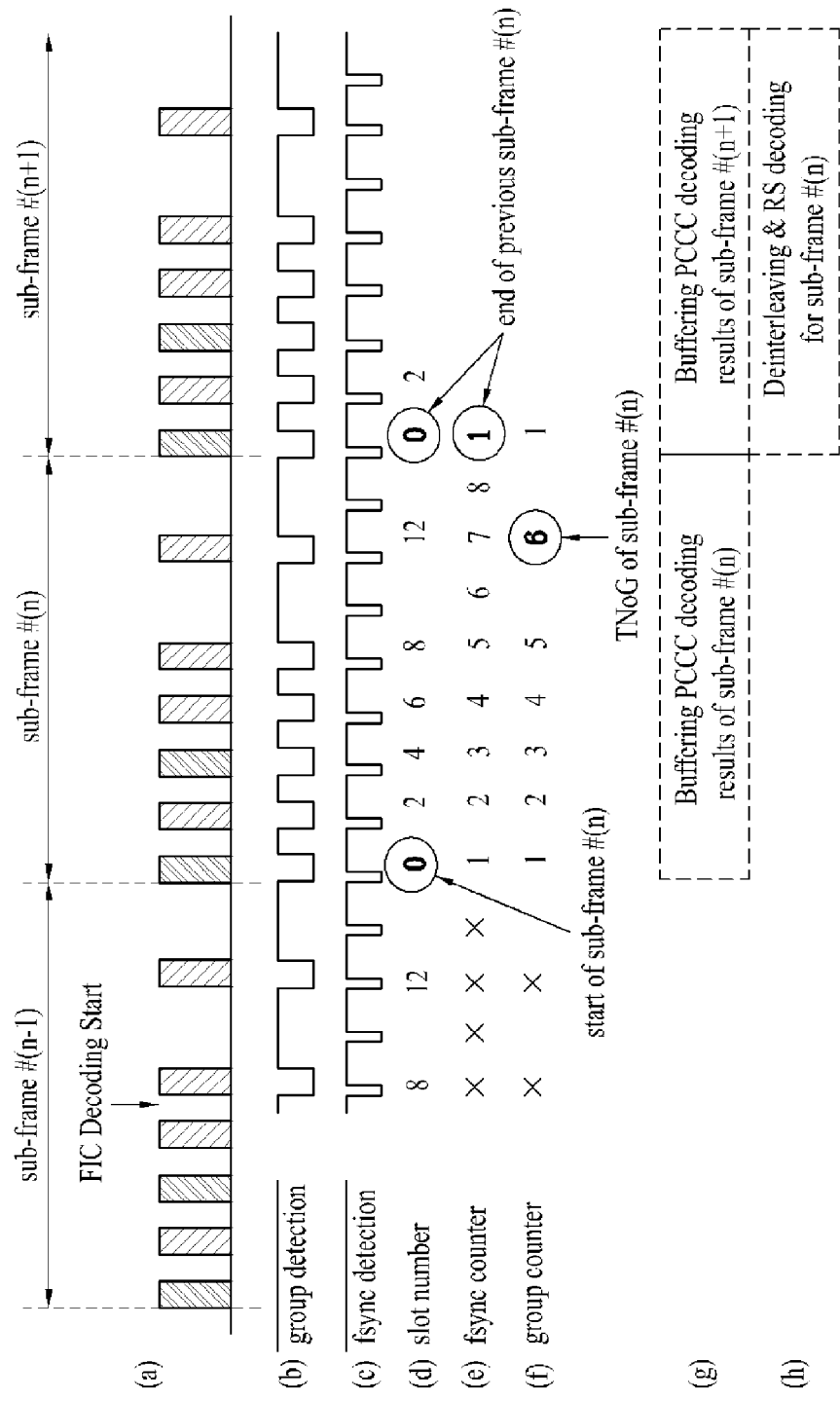

(a) and (b) of FIG. 45 illustrate a partial correlation method according to an embodiment of the present invention;

FIG. 46 illustrates an example of estimating a rough coarse frequency offset based upon partial correlation according to an embodiment of the present invention;

FIG. 47 illustrates an example of estimating a finer frequency offset based upon partial correlation according to an embodiment of the present invention;

FIG. 48 illustrates an example of linear interpolation process according to the present invention;

FIG. 49 illustrates an example of linear extrapolation process according to the present invention;

FIG. 50 illustrates a block diagram showing the structure of a channel equalizer according to an embodiment of the present invention;

FIG. 51 illustrates a block diagram showing the structure of a block decoder according to an embodiment of the present invention;

FIG. 52 illustrates a block diagram showing the structure of a symbol interleaver according to another embodiment of the present invention;

FIG. 53 illustrates an example of an interleaving pattern generated from a symbol interleaver according to the present invention;

(a) and (b) of FIG. 54 respectively illustrate an example of a symbol interleaver and a symbol deinterleaver sharing an address of a memory according to the present invention;

(a) and (b) of FIG. 55 respectively illustrate an exemplary process of gathering (or collecting) multiple portions so as to configure one RS frame or two RS frames;

FIG. 56 illustrates a block diagram showing the structure of a RS frame decoder according to an embodiment of the present invention;

FIG. 57 and FIG. 58 illustrate an error correction decoding process according to an embodiment of the present invention;

FIG. 59 illustrates a detailed block diagram of a signaling decoder according to an embodiment of the present invention;

FIG. 60 illustrates a detailed block diagram of a regressive turbo decoder of FIG. 59 according to an embodiment of the present invention;

FIG. 61 illustrates a trellis diagram including an attainable state according to an embodiment of the present invention, when a starting state with respect to an even component decoder is 00000;

FIG. 62 illustrates a trellis diagram including an attainable state according to an embodiment of the present invention, when a starting state with respect to an odd component decoder is 00000; and FIG. 63 illustrates a detailed example of acquiring a TNoG according to the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

M/H Frame Structure

In the embodiment of the present invention, the mobile service data are first multiplexed with main service data in M/H frame units and, then, modulated in a VSB mode and transmitted to the receiving system.

At this point, one M/H frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

Figure 1:
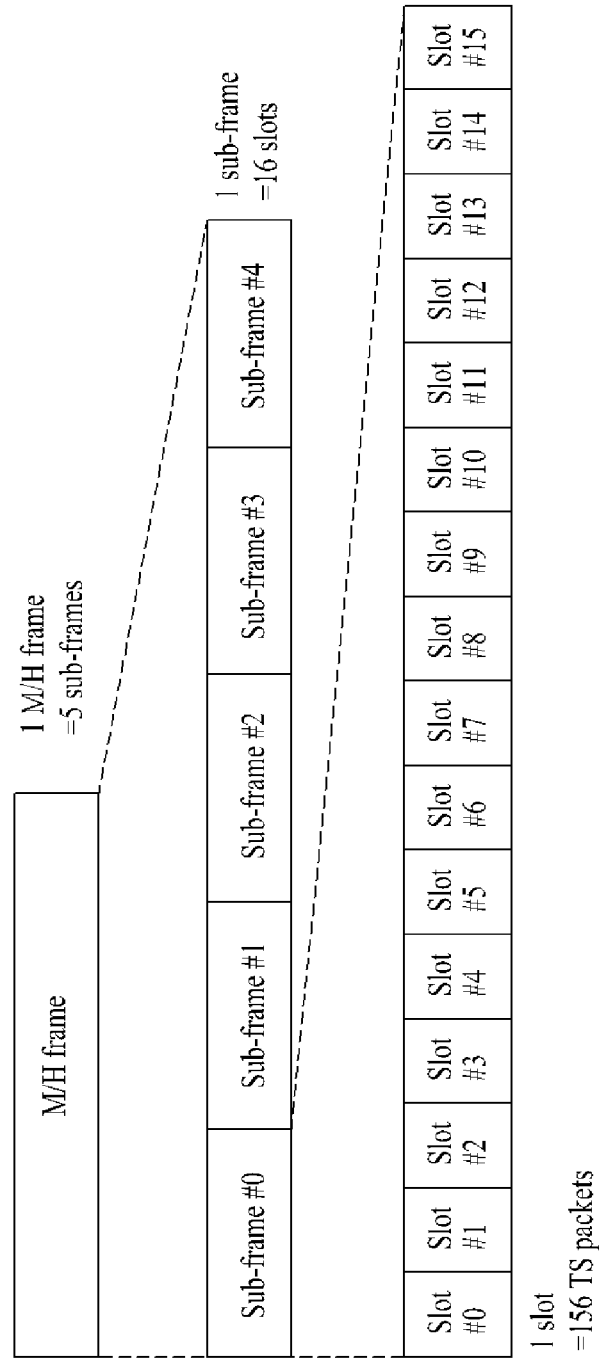
FIG. 1 illustrates a structure of a M/H frame for transmitting and receiving mobile service data according to the present invention.

FIG. 1 illustrates a structure of an M/H frame for transmitting and receiving mobile service data according to the present invention. In the example shown in FIG. 1, one M/H frame consists of 5 sub-frames, wherein each sub-frame includes 16 slots. In this case, the M/H frame according to the present invention includes 5 sub-frames and 80 slots. Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment.

At this point, two VSB fields are grouped to form a VSB frame.

Figure 2:
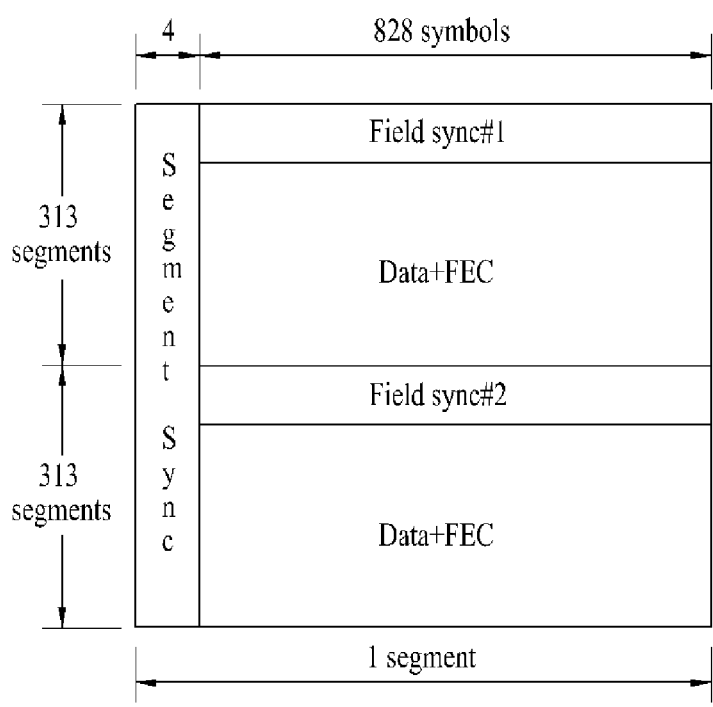
FIG. 2 illustrates an exemplary structure of a VSB frame.

FIG. 2 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time period for multiplexing the mobile service data and the main service data. Herein, one slot may either include the mobile service data or be configured only of the main service data.

If one M/H frame is transmitted during one slot, the first 118 data packets within the slot correspond to a data group. And, the remaining 38 data packets become the main service data packets. In another example, when no data group exists in a slot, the corresponding slot is configured of 156 main service data packets.

Meanwhile, when the slots are assigned to a VSB frame, an offset exists for each assigned position.

Figure 3:
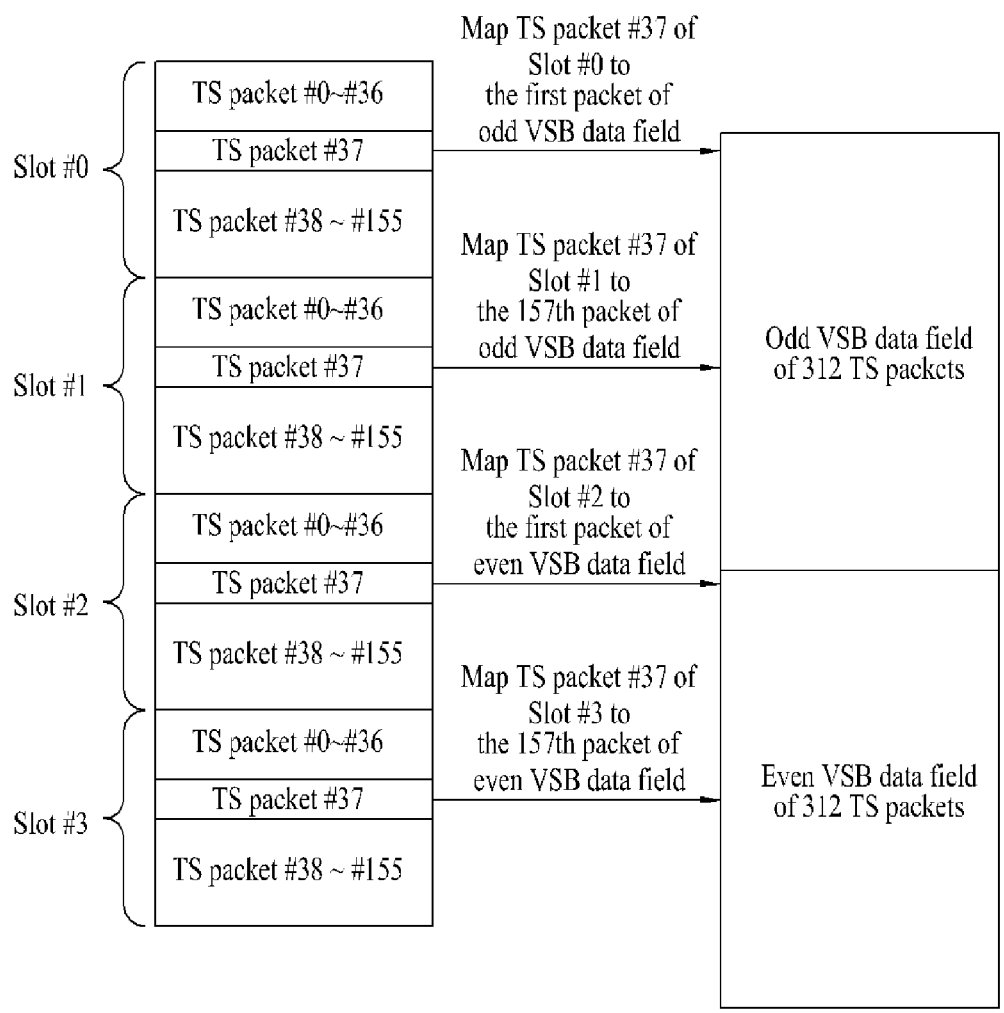
FIG. 3 illustrates a mapping example of the positions to which the first 4 slots of a sub-frame are assigned with respect to a VSB frame in a space region.

FIG. 3 illustrates a mapping example of the positions to which the first 4 slots of a sub-frame are assigned with respect to a VSB frame in a space region. And, FIG. 4 illustrates a mapping example of the positions to which the first 4 slots of a sub-frame are assigned with respect to a VSB frame in a time region.

Figure 4:
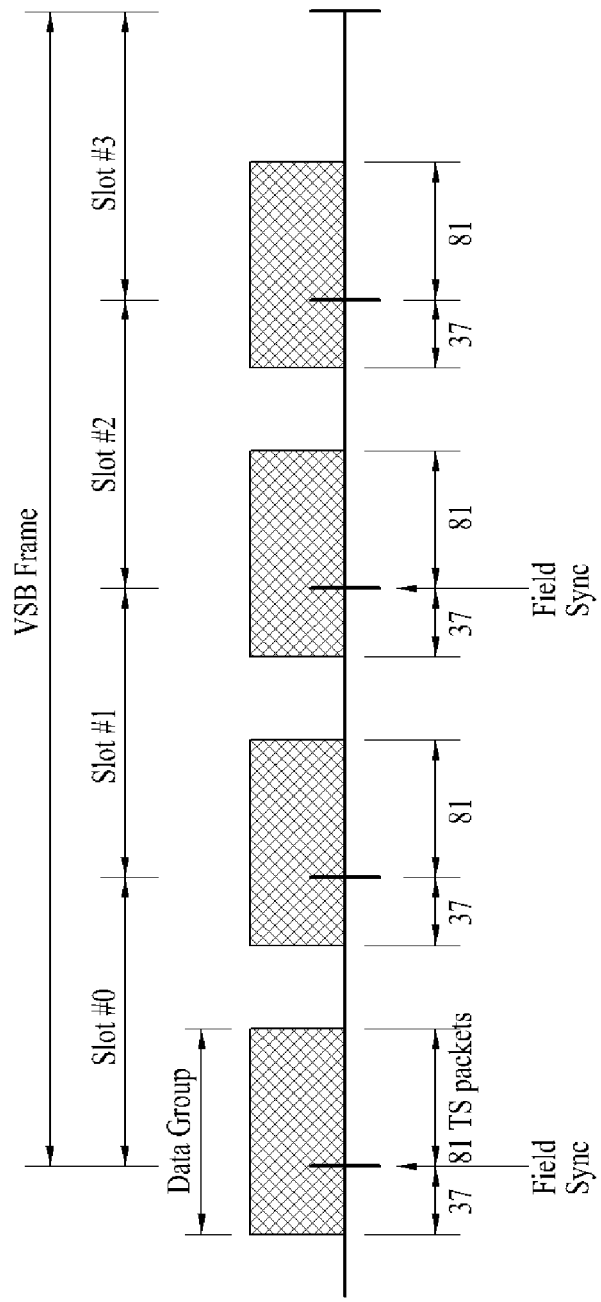
FIG. 4 illustrates a mapping example of the positions to which the first 4 slots of a sub-frame are assigned with respect to a VSB frame in a time region.

Referring to FIG. 3 and FIG. 4, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance.

In an example given in the present invention, a data group is divided into regions A, B, C, and D in a data configuration after data interleaving.

Figure 5:
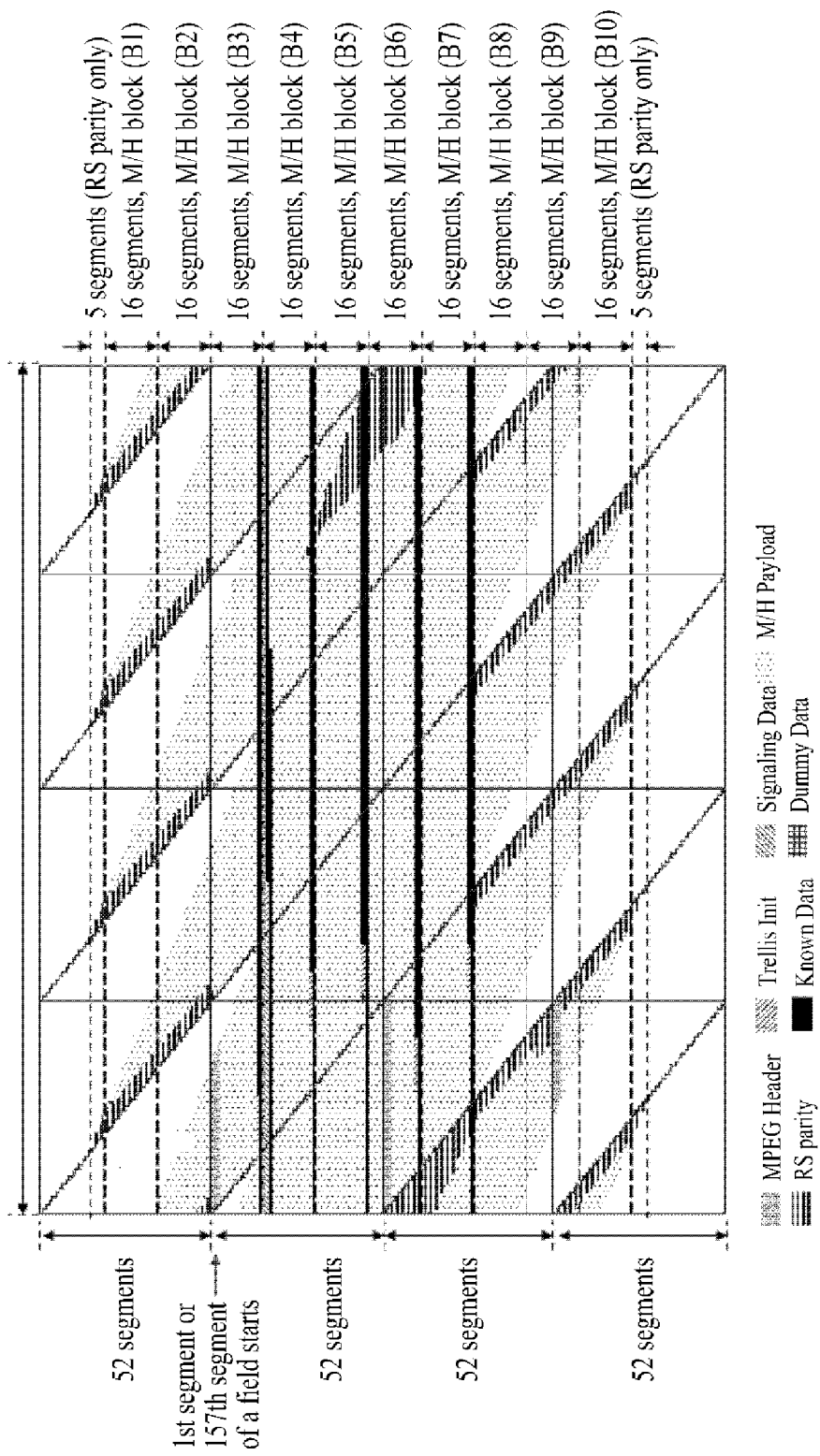
FIG. 5 illustrates an alignment of data after being data interleaved and identified.
Figure 6:
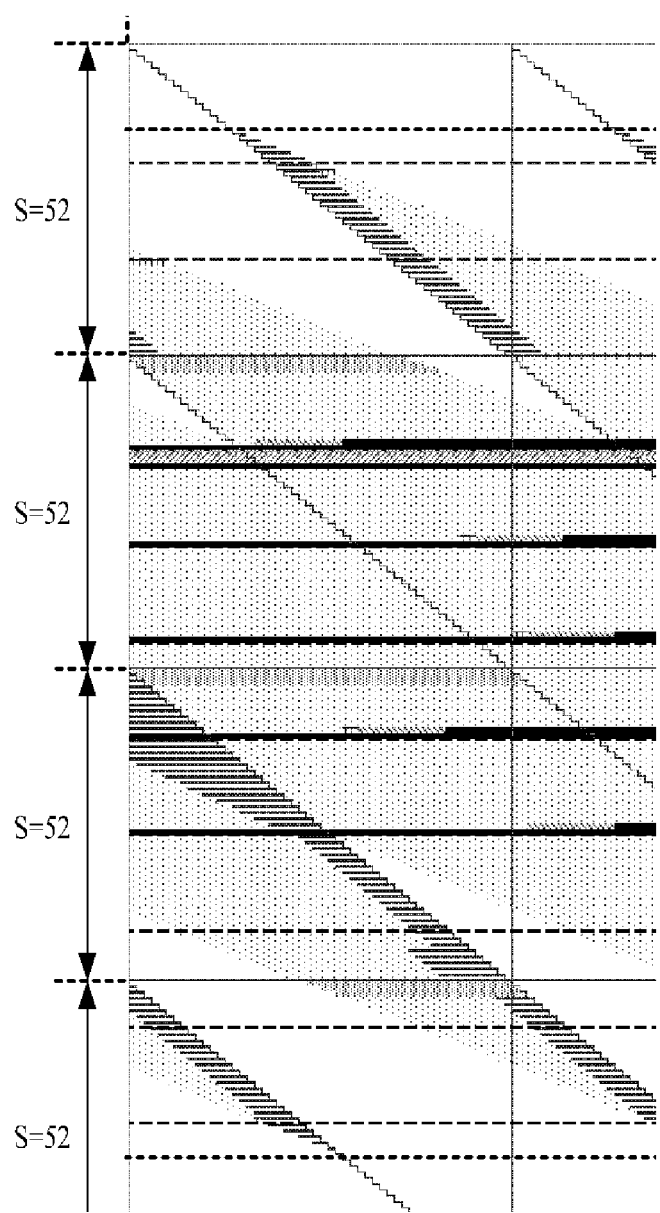
FIG. 6 illustrates an enlarged portion of the data group shown in FIG. 5 for a better understanding of the present invention.
Figure 7:
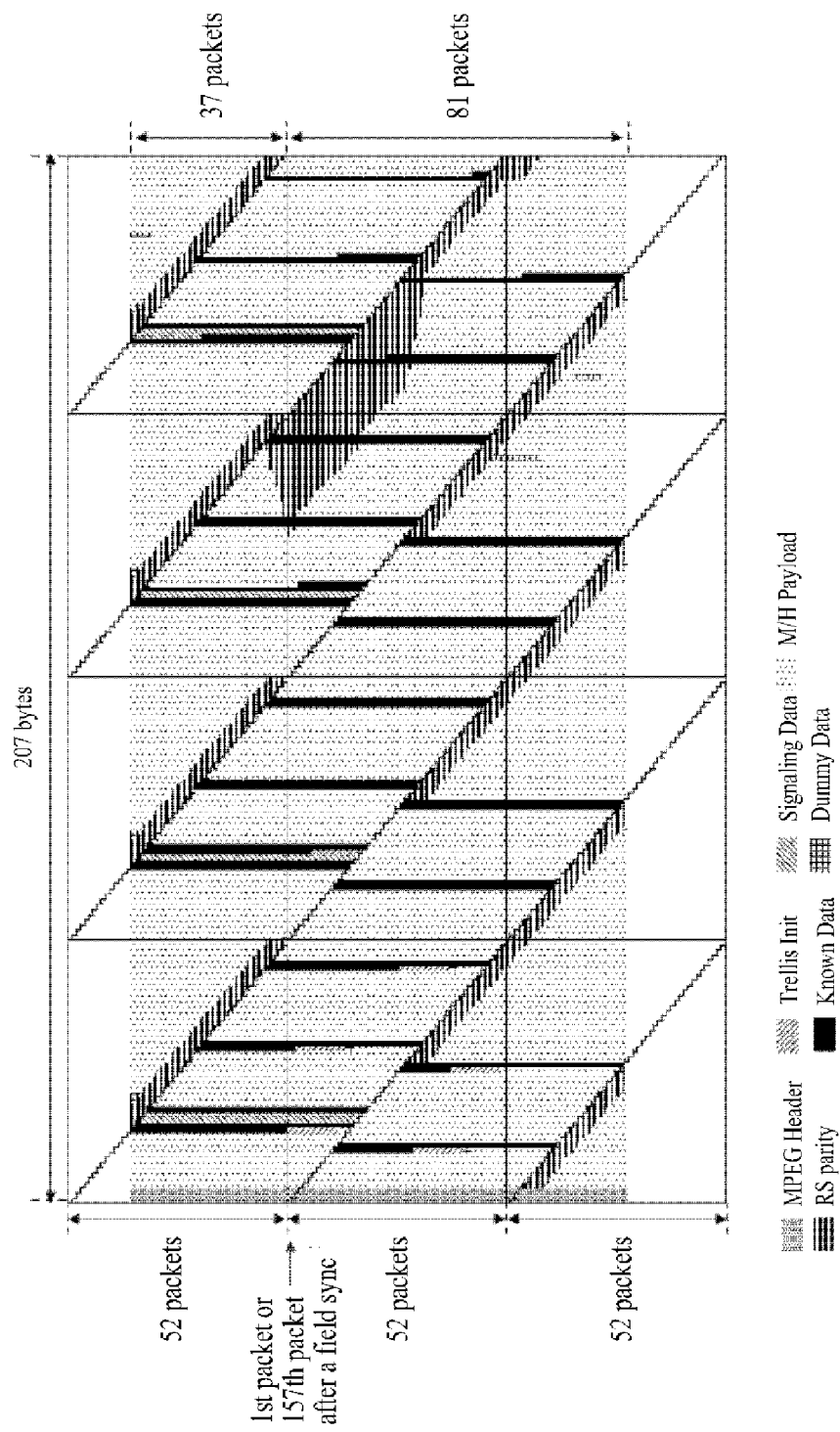
FIG. 7 illustrates an alignment of data before being data interleaved and identified.
Figure 8:
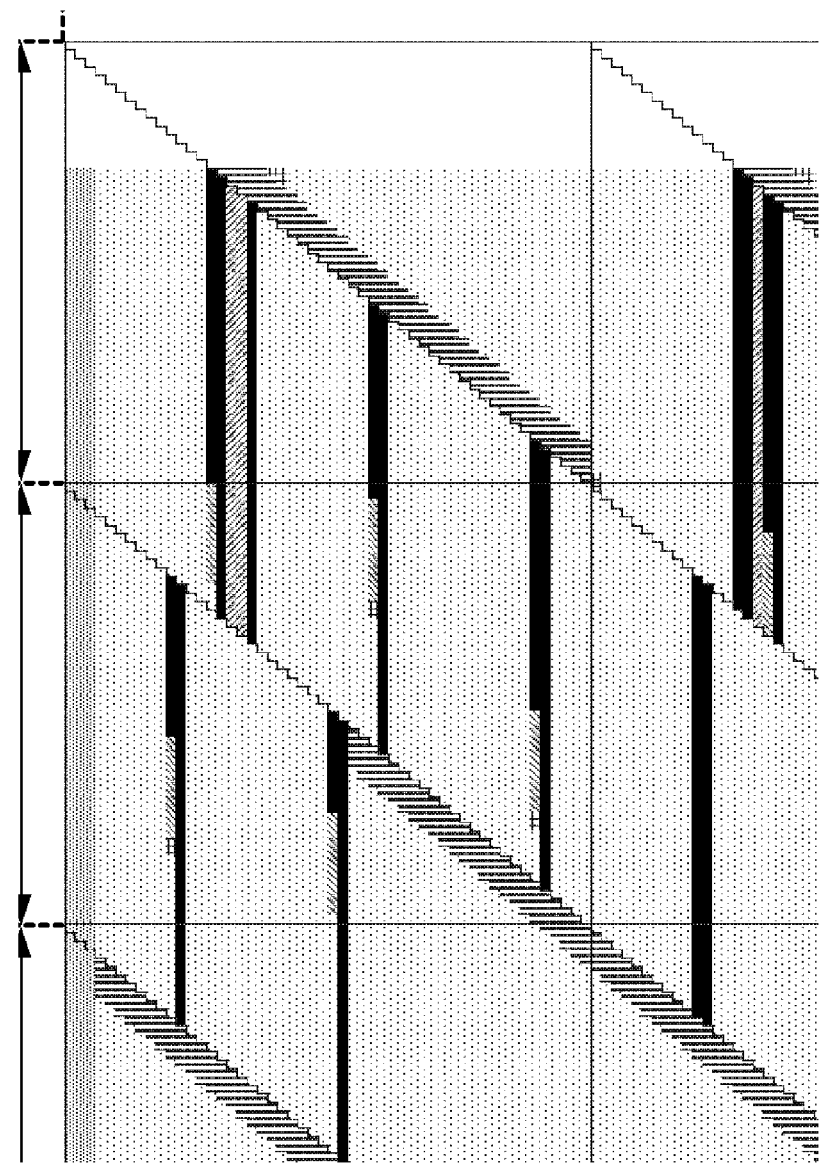
FIG. 8 illustrates an enlarged portion of the data group shown in FIG. 7 for a better understanding of the present invention.

FIG. 5 illustrates an alignment of data after being data interleaved and identified. FIG. 6 illustrates an enlarged portion of the data group shown in FIG. 5 for a better understanding of the present invention. FIG. 7 illustrates an alignment of data before being data interleaved and identified. And, FIG. 8 illustrates an enlarged portion of the data group shown in FIG. 7 for a better understanding of the present invention. More specifically, a data structure identical to that shown in FIG. 5 is transmitted to a receiving system. In other words, one data packet is data-interleaved so as to be scattered to a plurality of data segments, thereby being transmitted to the receiving system. FIG. 5 illustrates an example of one data group being scattered to 170 data segments. At this point, since one 207-byte packet has the same amount of data as one data segment, the packet that is not yet processed with data-interleaving may be used as the data segment.

FIG. 5 shows an example of dividing a data group prior to being data-interleaved into 10 M/H blocks (i.e., M/H block 1 (B1) to M/H block 10 (B10)). In this example, each M/H block has the length of 16 segments. Referring to FIG. 5, only the RS parity data are allocated to a portion of 5 segments before the M/H block 1 (B1) and 5 segments behind the M/H block 10 (B10). The RS parity data are excluded in regions A to D of the data group.

More specifically, when it is assumed that one data group is divided into regions A, B, C, and D, each M/H block may be included in any one of region A to region D depending upon the characteristic of each M/H block within the data group. At this point, according to an embodiment of the present invention, each M/H block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 5, M/H block 4 (B4) to M/H block 7 (B7) correspond to regions without interference of the main service data. M/H block 4 (B4) to M/H block 7 (B7) within the data group shown in FIG. 5 correspond to a region where no interference from the main service data occurs. In this example, a long known data sequence is inserted at both the beginning and end of each M/H block. In the description of the present invention, the region including M/H block 4 (B4) to M/H block 7 (B7) will be referred to as "region A (=B4+B5+B6+B7)". As described above, when the data group includes region A having a long known data sequence inserted at both the beginning and end of each M/H block, the receiving system is capable of performing equalization by using the channel information that can be obtained from the known data. Therefore, the strongest equalizing performance may be yielded (or obtained) from one of region A to region D.

In the example of the data group shown in FIG. 5, M/H block 3 (B3) and M/H block 8 (B8) correspond to a region having little interference from the main service data. Herein, a long known data sequence is inserted in only one side of each M/H block B3 and B8. More specifically, due to the interference from the main service data, a long known data sequence is inserted at the end of M/H block 3 (B3), and another long known data sequence is inserted at the beginning of M/H block 8 (B8). In the present invention, the region including M/H block 3 (B3) and M/H block 8 (B8) will be referred to as "region B(=B3+B8)". As described above, when the data group includes region B having a long known data sequence inserted at only one side (beginning or end) of each M/H block, the receiving system is capable of performing equalization by using the channel information that can be obtained from the known data. Therefore, a stronger equalizing performance as compared to region C/D may be yielded (or obtained).

Referring to FIG. 5, M/H block 2 (B2) and M/H block 9 (B9) correspond to a region having more interference from the main service data as compared to region B. A long known data sequence cannot be inserted in any side of M/H block 2 (B2) and M/H block 9 (B9). Herein, the region including M/H block 2 (B2) and M/H block 9 (B9) will be referred to as "region C(=B2+B9)". Finally, in the example shown in FIG. 5, M/H block 1 (B1) and M/H block 10 (B10) correspond to a region having more interference from the main service data as compared to region C. Similarly, a long known data sequence cannot be inserted in any side of M/H block 1 (B1) and M/H block 10 (B10).

Herein, the region including M/H block 1 (B1) and M/H block 10 (B10) will be referred to as "region D (=B1+B10)". Since region C/D is spaced further apart from the known data sequence, when the channel environment undergoes frequent and abrupt changes, the receiving performance of region C/D may be deteriorated.

FIG. 7 illustrates a data structure prior to data interleaving. More specifically, FIG. 7 illustrates an example of 118 data packets being allocated to a data group. FIG. 7 shows an example of a data group consisting of 118 data packets, wherein, based upon a reference packet (e.g., a $1^{st}$ packet (or data segment) or $157^{th}$ packet (or data segment) after a field synchronization signal), when allocating data packets to a VSB frame, 37 packets are included before the reference packet and 81 packets (including the reference packet) are included afterwards.

In other words, with reference to FIG. 5, a field synchronization signal is placed (or assigned) between M/H block 2 (B2) and M/H block 3 (B3). Accordingly, this indicates that the slot has an off-set of 37 data packets with respect to the corresponding VSB field.

The size of the data groups, number of hierarchical regions within the data group, the size of each region, the number of M/H blocks included in each region, the size of each M/H block, and so on described above are merely exemplary. Therefore, the present invention will not be limited to the examples described above.

Figure 9:
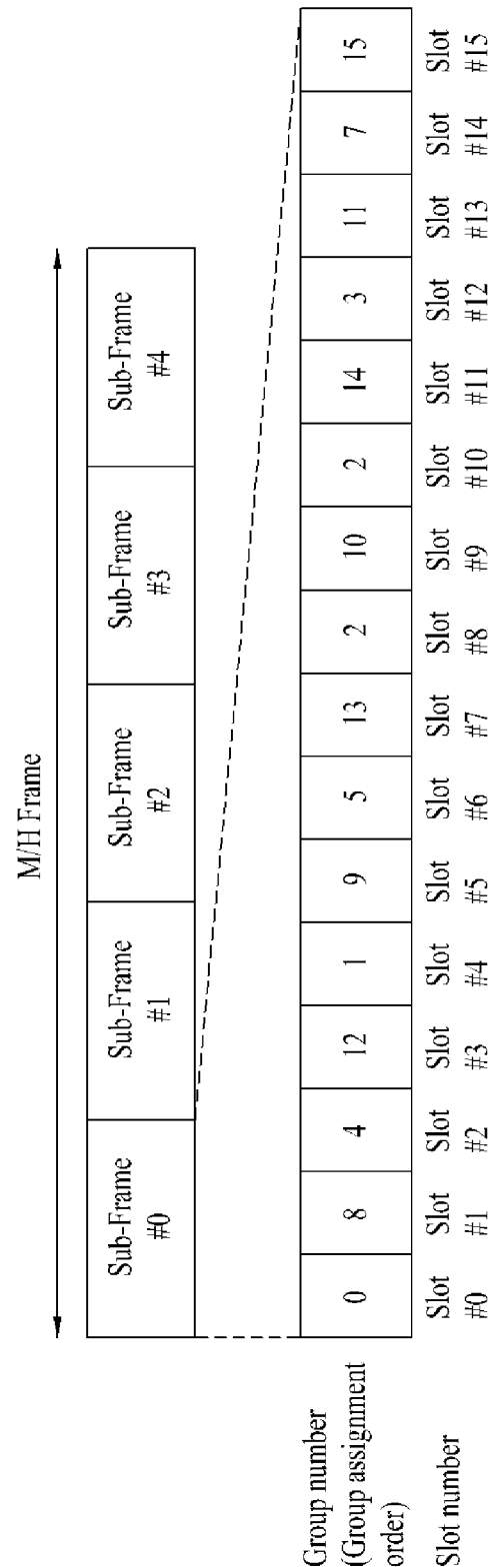
FIG. 9 illustrates an exemplary assignment order of data groups being assigned to one of 5 sub-frames according to the present invention.

FIG. 9 illustrates an exemplary assignment order of data groups being assigned to one of 5 sub-frames, wherein the 5 sub-frames configure an M/H frame. For example, the method of assigning data groups may be identically applied to all M/H frames or differently applied to each M/H frame. Furthermore, the method of assigning data groups may be identically applied to all sub-frames or differently applied to each sub-frame. At this point, when it is assumed that the data groups are assigned using the same method in all sub-frames of the corresponding M/H frame, the total number of data groups being assigned to an M/H frame is equal to a multiple of '5'.

According to the embodiment of the present invention, a plurality of consecutive data groups is assigned to be spaced as far apart from one another as possible within the M/H frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 9 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15. Equation 1 below shows the above-described rule (or pattern) for assigning data groups in a sub-frame.

$j=(4i+0)\bmod 16$         Equation 1

0=0 if i<4,
0=2 else if i<8,
Herein,
0=1 else if i<12,
0=3 else.

Herein, j indicates the slot number within a sub-frame. The value of j may range from 0 to 15 (i.e., 0≤j≤15). Also, value of i indicates the data group number. The value of i may range from 0 to 15 (i.e., 0≤i≤15).

In the present invention, a collection of data groups included in an M/H frame will be referred to as a "parade". Based upon the RS frame mode, the parade transmits data of at least one specific RS frame.

The mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

In the description of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. In this case, also the RS frame will be referred to as a "primary RS frame". Conversely, when the mobile service data within one RS frame are assigned either to at least one of regions A/B and regions C/D, one parade may transmit up to 2 RS frames.

More specifically, the RS frame mode indicates whether a parade transmits one RS frame, or whether the parade transmits two RS frames. Table 1 below shows an example of the RS frame mode.

TABLE 1

| RS frame mode (2 bits) | Description |
| --- | --- |
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the system can be capable of responding promptly and effectively to any burst error that may occur within a sub-frame.

Furthermore, the method of assigning parades may be identically applied to all sub-frames or differently applied to each sub-frame. According to the embodiment of the present invention, the parades may be assigned differently for each M/H frame and identically for all sub-frames within an M/H frame. More specifically, the M/H frame structure may vary by M/H frame units. Thus, an ensemble rate may be adjusted on a more frequent and flexible basis.

Figure 10:
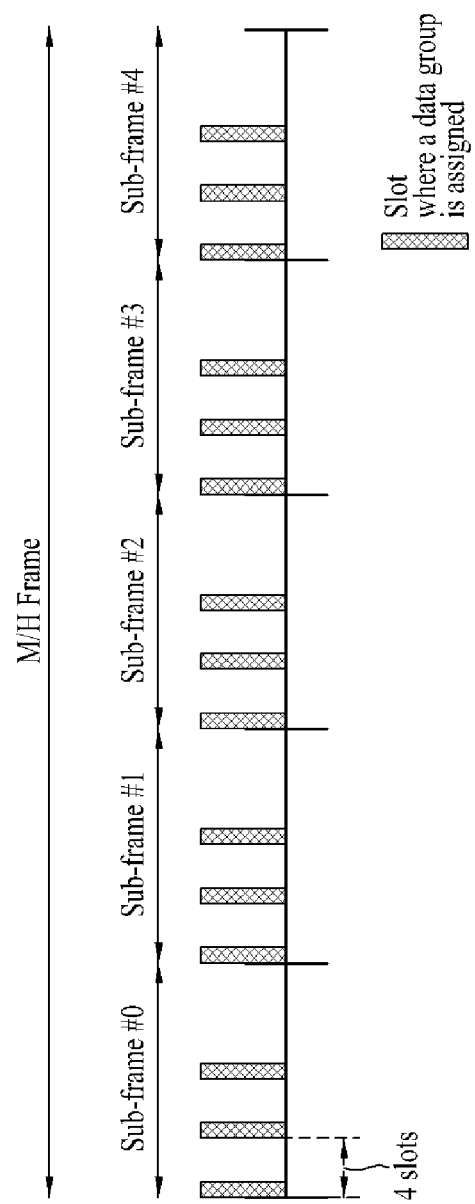
FIG. 10 illustrates an example of assigning a single parade to an M/H frame according to the present invention.

FIG. 10 illustrates an example of multiple data groups of a single parade being assigned (or allocated) to an M/H frame. More specifically, FIG. 10 illustrates an example of a plurality of data groups included in a single parade, wherein the number of data groups included in a sub-frame is equal to '3', being allocated to an M/H frame. Referring to FIG. 10, 3 data groups are sequentially assigned to a sub-frame at a cycle period of 4 slots. Accordingly, when this process is equally performed in the 5 sub-frames included in the corresponding M/H frame, 15 data groups are assigned to a single M/H frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder located in a later block performs RS-encoding on the corresponding RS frame, thereby adding 24 bytes of parity data to the corresponding RS frame and transmitting the processed RS frame, the parity data occupy approximately 11.37% (=24/(187+24)×100) of the total code word length. Meanwhile, when one sub-frame includes 3 data groups, and when the data groups included in the parade are assigned, as shown in FIG. 10, a total of 15 data groups form an RS frame. Accordingly, even when an error occurs in an entire data group due to a burst noise within a channel, the percentile is merely 6.67% (=1/15×100). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as described above, either main service data may be assigned between each data group, or data groups corresponding to different parades may be assigned between each data group. More specifically, data groups corresponding to multiple parades may be assigned to one M/H frame.

Basically, the method of assigning data groups corresponding to multiple parades is very similar to the method of assigning data groups corresponding to a single parade. In other words, data groups included in other parades that are to be assigned to an M/H frame are also respectively assigned according to a cycle period of 4 slots.

At this point, data groups of a different parade may be sequentially assigned to the respective slots in a circular method. Herein, the data groups are assigned to slots starting from the ones to which data groups of the previous parade have not yet been assigned.

For example, when it is assumed that data groups corresponding to a parade are assigned as shown in FIG. 10, data groups corresponding to the next parade may be assigned to a sub-frame starting either from the $12^{th}$ slot of a sub-frame. However, this is merely exemplary. In another example, the data groups of the next parade may also be sequentially assigned to a different slot within a sub-frame at a cycle period of 4 slots starting from the $3^{rd}$ slot.

Figure 11:
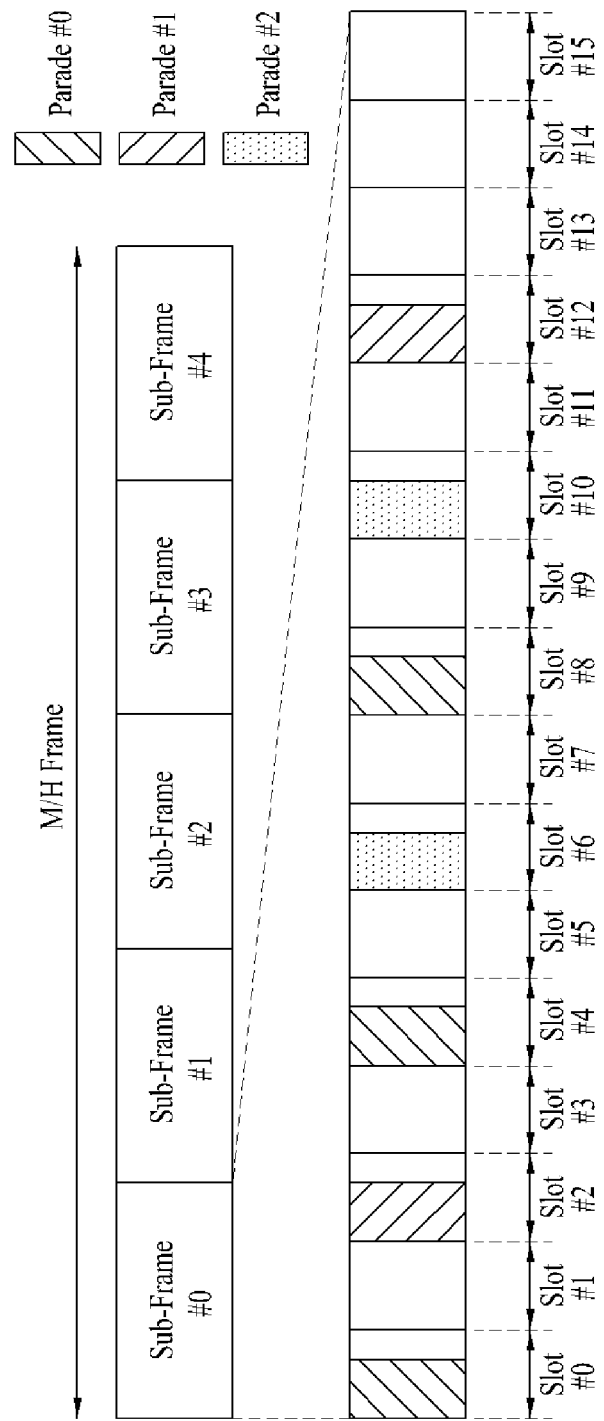
FIG. 11 illustrates an example of assigning 3 parades to an M/H frame according to the present invention.

FIG. 11 illustrates an example of transmitting 3 parades (Parade #0, Parade #1, and Parade #2) to an M/H frame. More specifically, FIG. 11 illustrates an example of transmitting parades included in one of 5 sub-frames, wherein the 5 sub-frames configure one M/H frame.

When the $1^{st}$ parade (Parade #0) includes 3 data groups for each sub-frame, the positions of each data groups within the sub-frames may be obtained by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame. Also, when the $2^{nd}$ parade includes 2 data groups for each sub-frame, the positions of each data groups within the sub-frames may be obtained by substituting values '3' and '4' for i in Equation 1.

More specifically, the data groups of the $2^{nd}$ parade (Parade #1) are sequentially assigned to the $2^{nd}$ and $12^{th}$ slots (Slot #3 and Slot #11) within the sub-frame.

Finally, when the $3^{rd}$ parade includes 2 data groups for each sub-frame, the positions of each data groups within the sub-frames may be obtained by substituting values '5' and '6' for i in Equation 1. More specifically, the data groups of the $3^{rd}$ parade (Parade #2) are sequentially assigned to the $7^{th}$ and $11^{th}$ slots (Slot #6 and Slot #10) within the sub-frame.

As described above, data groups of multiple parades may be assigned to a single M/H frame, and, in each sub-frame, the data groups are serially allocated to a group space having 4 slots from left to right. Therefore, a number of groups of one parade per sub-frame (NOG) may correspond to any one integer from '1' to '8'. Herein, since one M/H frame includes 5 sub-frames, the total number of data groups within a parade that can be allocated to an M/H frame may correspond to any one multiple of '5' ranging from '5' to '40'.

Figure 12:
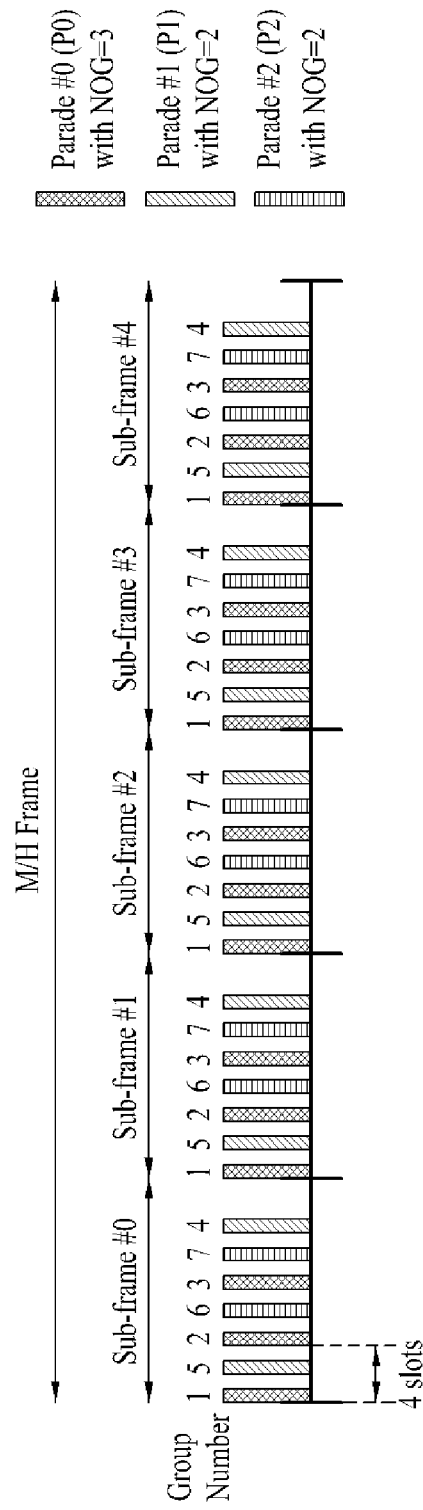
FIG. 12 illustrates an example of expanding the assignment process of 3 parades to 5 sub-frames within an M/H frame.

FIG. 12 illustrates an example of expanding the assignment process of 3 parades, shown in FIG. 11, to 5 sub-frames within an M/H frame.

Figure 13:
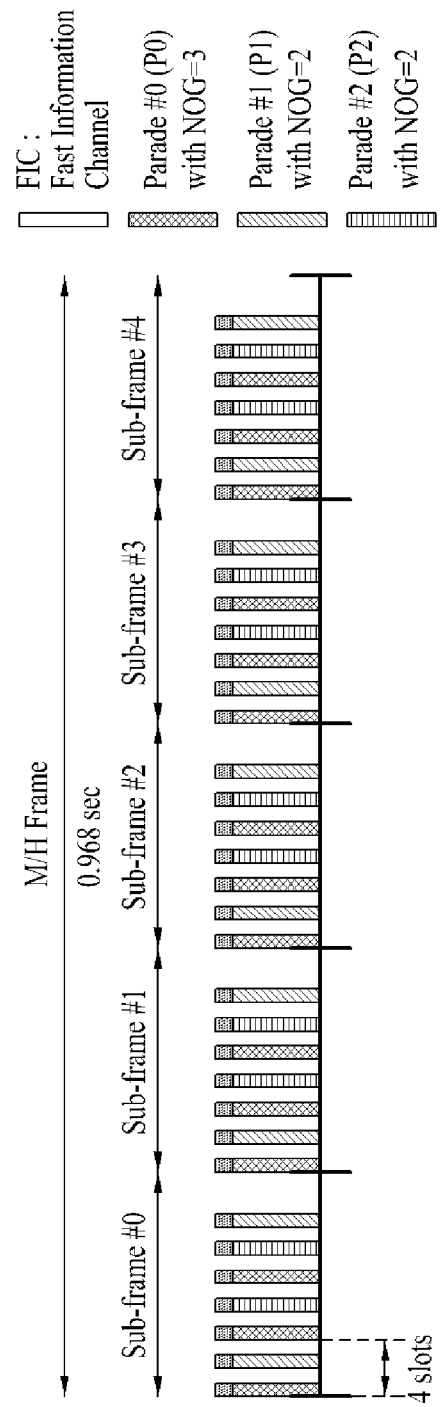
FIG. 13 illustrates a data transmission structure according to an embodiment of the present invention, wherein signaling data are included in a data group so as to be transmitted.

FIG. 13 illustrates a data transmission structure according to an embodiment of the present invention, wherein signaling data are included in a data group so as to be transmitted.

As described above, an M/H frame is divided into 5 sub-frames. Data groups corresponding to a plurality of parades co-exist in each sub-frame. Herein, the data groups corresponding to each parade are grouped by M/H frame units, thereby configuring a single parade.

Three parades (Parade #0, Parade #1, Parade #2) also exist in one M/H frame of FIG. 13. At this time, a part (e.g., 37 bytes/data group) of each data group is used to forward fast information channel (FIC) information of mobile service data, which is encoded separately from RS code. An FIC region within a signaling information area assigned to each data group constitutes one FIC segment.

Meanwhile, in this embodiment, a collection of services is defined by concept of M/H ensemble. One M/H ensemble has the same QoS, and is coded with the same FEC code. Also, the ensemble has unique identifier (i.e., ensemble id), and is a collection of consecutive RS frames having the same FEC code.

As shown in FIG. 13, FIC segment corresponding to each data group describes service information of M/H ensemble to which corresponding data group belongs.

In other words, the transmitting/receiving system according to one embodiment of the present invention manages two data channels. One data channel is an RS frame data channel for contents transmission, and the other data channel is a fast information channel (FIC) for service acquisition. The present invention is intended that mapping information between ensemble and mobile service is signaled using FIC chunk, which is split in a FIC segment unit and then transmitted through the FIC, whereby the receiving system can perform fast service acquisition.

General Description of the Transmitting System

Figure 14:
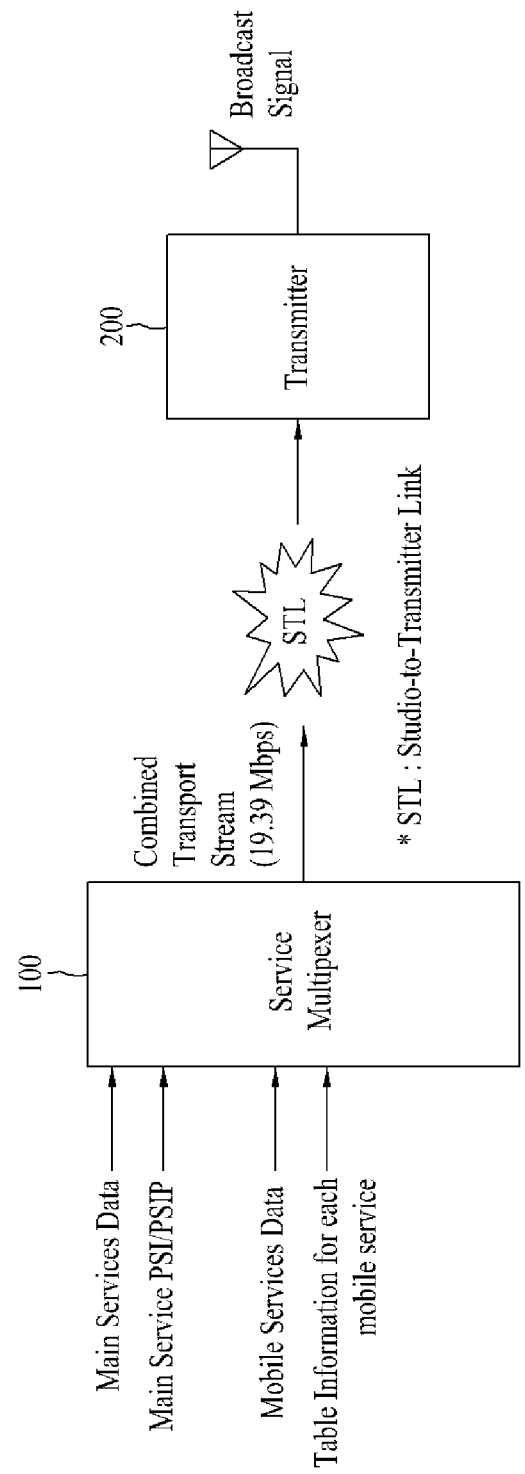
FIG. 14 illustrates a block diagram showing a general structure of a transmitting system according to an embodiment of the present invention.

FIG. 14 illustrates a block diagram showing a general structure of a digital broadcast transmitting system according to an embodiment of the present invention.

Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. This corresponds to data transmission using Single Frequency Network (SFN). Accordingly, in the receiving system, a channel equalizer may compensate signal distortion, which is caused by a reflected wave, so as to recover the original signal. In another example, the plurality of transmitters may have different frequencies with respect to the same channel. This corresponds to data transmission using Multi Frequency Network (MFN).

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of main service data and table information (e.g., PSI/PSIP table data) for each main service and encapsulates the received data into a transport stream (TS) packet.

Also, according to an embodiment of the present invention, the service multiplexer 100 receives at least one type of mobile service data and table information (e.g., PSI/PSIP table data) for each mobile service and encapsulates the received data into a transport stream (TS) packet.

According to another embodiment of the present invention, the service multiplexer 100 receives a RS frame (or RS frame payload), which is configured of at least one type of mobile service data and table information for each mobile service, and encapsulates the received RS frame data into mobile service data packets of a transport stream (TS) packet format.

And, the service multiplexer 100 multiplexes the encapsulated TS packets for main service and the encapsulated TS packets for mobile service based upon a predetermined multiplexing rule, thereby outputting the multiplexed TS packets to the transmitter 200.

Figures 15, 16:
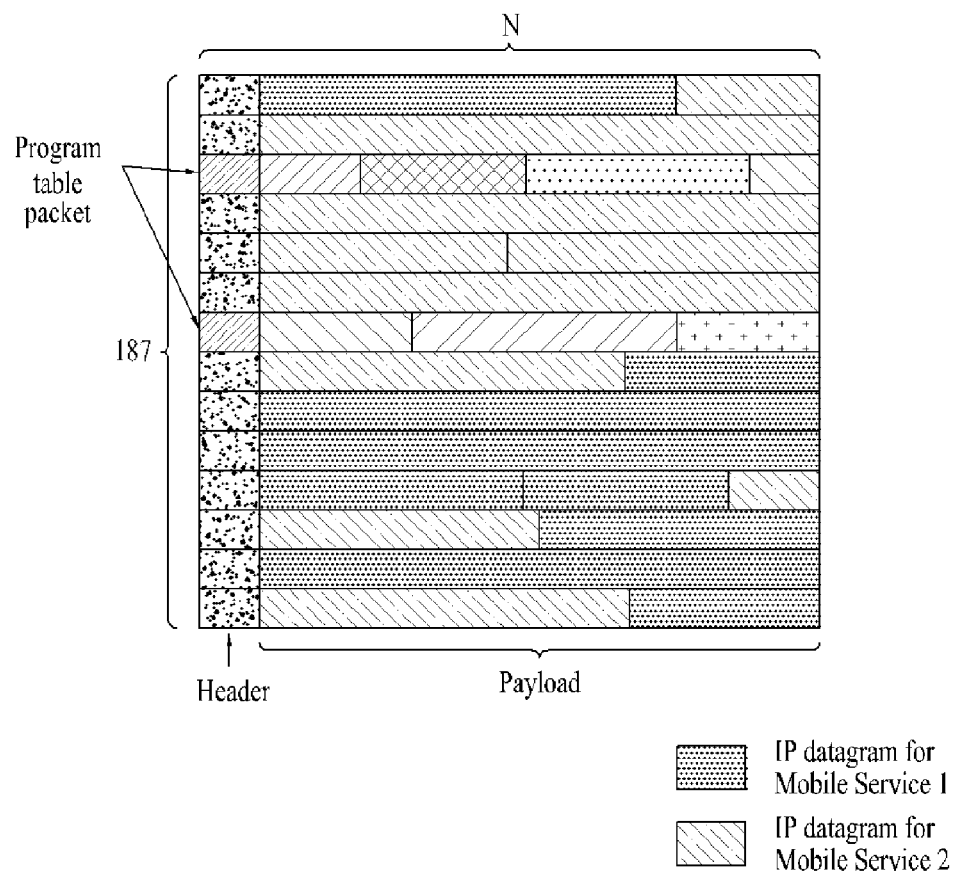
FIG. 15 is a diagram illustrating an example of RS frame payload according to the present invention.
FIG. 16 is a diagram illustrating a structure of an M/H header within an M/H service data packet according to the present invention.

At this point, the RS frame payload (or RS frame) has the size of N (row)×187 (column), as shown in FIG. 15. Herein, N represents the length of a row (i.e., number of columns), and 187 corresponds to the length of a column (i.e., number of rows.

In the present invention, for convenience of description, each row of the N bytes will be referred to as M/H service data packet (or M/H TP packet). The M/H service data packet includes M/H header of 2 bytes, a stuffing region of k bytes, and M/H payload of N−2−k bytes. At this time, k has a value of 0 or a value greater than 0. In this case, the M/H header of 2 bytes is only one example, and corresponding bytes can be varied depending on a designer. Accordingly, the present invention will not be limited to such example.

At this time, as the M/H service data packet includes M/H header, the M/H header may not reach N bytes.

In this case, stuffing bytes can be assigned to the remaining payload part of the corresponding M/H service data packet. For example, after program table information is assigned to one M/H service data packet, if the length of the M/H service data packet is N−20 bytes including the M/H header, the stuffing bytes can be assigned to the remaining 20 bytes. In this case, the value k becomes 20, and the M/H payload region within the corresponding M/H service data packet includes N−2−20 bytes.

The RS frame payload is generated by collecting signaling table information corresponding to one or more mobile services and/or IP datagram of the mobile service data. For example, signaling table information for two kinds of mobile services called news (for example, IP datagram for mobile service 1) and the stocks (for example, IP datagram for mobile service 2) and IP datagram of mobile service data can be included in one frame payload.

More specifically, in the transmitting system (e.g., mobile broadcast station), the mobile service data (e.g., A/V steaming) are packetized based upon a real time protocol (RTP) method. The RTP packet is then packetized once again based upon a user datagram protocol (UDP) method. Thereafter, the RTP/UDP packet is in turn packetized based upon an IP method, thereby being packetized into RTP/UDP/IP packet data. In the description of the present invention, the packetized RTP/UDP/IP packet data will be referred to as an IP datagram for simplicity.

Furthermore, service information for receiving mobile services may be provided in the form of a signaling table. And, a service signaling channel transmitting such signaling table is packetized based upon a UDP method. And, the packetized UDP data are then packetized based upon an IP method, thereby being packetized into UDP/IP data. In the description of the present invention, the packetized UDP/IP packet data will also be referred to as an IP datagram for simplicity. According to an embodiment of the present invention, the service signaling channel is encapsulated into an IP datagram having a well-known destination IP address and a well-known destination UDP port number.

More specifically, one RS frame payload includes an IP datagram of mobile service data for at least one or more mobile services and an IP datagram of a service signaling channel for receiving the mobile service data.

According to the embodiment of the present invention, among a service map table (SMT), a guide access table (GAT), a cell information table (CIT), a service labeling table (SLT), and a rating region table (RRT), the present invention transmits at least one signaling table through the service signaling channel. Herein, the signaling tables presented in the embodiment of the present invention are merely examples for facilitating the understanding of the present invention. Therefore, the present invention is not limited only to the exemplary signaling tables that can be transmitted through the service signaling channel.

The SMT provides signaling information on ensemble levels. Also, each SMT provides IP access information for each mobile service belonging to the corresponding ensemble including each SMT. Furthermore, the SMT provides IP stream component level information required for the corresponding mobile service.

The RRT transmits information on region and consultation organs for program ratings. More specifically, the RRT provides content advisory rating information.

The GAT provides information on SG providers, which transmit the service guides. Also, the GAT provides service guide bootstrapping information required for accessing the SG. The CIT provides channel information of each cell, which corresponds to the frequency domain of a broadcast signal. Herein, a cell refers to a scope affected (or influenced) by a transmitter based upon a physical frequency in a multi-frequency network (MFN) environment (or condition). More specifically, the CIT provides information on a carrier frequency of an adjacent cell in the current transmitter (or transmitting system). Therefore, based upon the CIT information, a receiver (or receiving system) can travel from one transmitter's (or exciter's) coverage area to another.

The SLT provides minimum required information for an exclusive usage of a channel scan process. More specifically, according to the embodiment of the present invention, other than the SMT, by using the SLT for the exclusive usage of the channel scan process, so as to configure a set of minimum information for the channel scan process, the channel scanning speed may be increased.

According to an embodiment of the present invention, each signaling table is divided into at least one section. Then, each section is encapsulated to a UDP/IP header, thereby being transmitted through the service signaling channel. In this case, the number of UDP/IP packets being transmitted through the service signaling channel may vary based upon the number of signaling tables being transmitted through the service signaling channel and the number of sections in each signaling table.

At this point, all UDP/IP packets transmitted through the service signaling channel have the same number of well-known target IP addresses and well-known target UDP port numbers. For example, when it is assumed that the SMT, RRT, and GAT are transmitted through the service signaling channel, the target IP address and target UDP port number of all UDP/IP packets transmitting the SMT, RRT, and GAT are identical to one another. Furthermore, the target IP address and the target UDP port number respectively correspond to well-known values, i.e., values pre-known by the receiving system based upon an agreement between the receiving system and the transmitting system.

Therefore, the identification of each signaling table included in the service signaling data is performed by a table identifier. The table identifier may correspond to a table_id field existing in the corresponding signaling table or in the header of the corresponding signaling table section. And, when required, identification may be performed by further referring to a table_id_extension field.

FIG. 16 is a diagram illustrating examples of fields allocated to the M/H header region within the M/H service data packet according to the present invention. Examples of the fields include type_indicator field, error_indicator field, stuff_indicator field, and pointer field.

The type_indicator field can allocate 3 bits, for example, and represents a type of data allocated to payload within the corresponding M/H service data packet. In other words, the type_indicator field indicates whether data of the payload is IP datagram or program table information. At this time, each data type constitutes one logical channel. In the logical channel which transmits the IP datagram, several mobile services are multiplexed and then transmitted. Each mobile service undergoes demultiplexing in the IP layer.

The error_indicator field can allocate 1 bit, for example, and represents whether the corresponding M/H service data packet has an error. For example, if the error_indicator field has a value of 0, it means that there is no error in the corresponding M/H service data packet. If the error_indicator field has a value of 1, it means that there may be an error in the corresponding M/H service data packet.

The stuff_indicator field can allocate 1 bit, for example, and represents whether stuffing byte exists in payload of the corresponding M/H service data packet. For example, if the stuff_indicator field has a value of 0, it means that there is no stuffing byte in the corresponding M/H service data packet. If the stuff_indicator field has a value of 1, it means that stuffing byte exists in the corresponding M/H service data packet.

The pointer field can allocate 11 bits, for example, and represents position information where new data (i.e., new signaling information or new IP datagram) starts in the corresponding M/H service data packet.

For example, if IP datagram for mobile service 1 and IP datagram for mobile service 2 are allocated to the first M/H service data packet within the RS frame payload as illustrated in FIG. 15, the pointer field value represents the start position of the IP datagram for mobile service 2 within the M/H service data packet.

Also, if there is no new data in the corresponding M/H service data packet, the corresponding field value is expressed as a maximum value exemplarily. According to the embodiment of the present invention, since 11 bits are allocated to the pointer field, if 2047 is expressed as the pointer field value, it means that there is no new data in the packet. The point where the pointer field value is 0 can be varied depending on the type_indicator field value and the stuff_indicator field value.

It is to be understood that the order, the position and the meaning of the fields allocated to the header within the M/H service data packet illustrated in FIG. 16 are exemplarily illustrated for understanding of the present invention. Since the order, the position and the meaning of the fields allocated to the header within the M/H service data packet and the number of additionally allocated fields can easily be modified by those skilled in the art, the present invention will not be limited to the above example.

FIG. 17(a) and FIG. 17(b) illustrate another examples of RS frame payload according to the present invention. FIG. 17(a) illustrates an example of primary RS frame payload to be allocated to regions A/B within the data group, and FIG. 17(b) illustrates an example of secondary RS frame payload to be allocated to regions C/D within the data group.

In FIG. 17(a) and FIG. 17(b), a column length (i.e., the number of rows) of the RS frame payload to be allocated to the regions A/B and a column length (i.e., the number of rows) of the RS frame payload to be allocated to the regions C/D are 187 equally. However, row lengths (i.e., the number of columns) may be different from each other.

According to the embodiment of the present invention, when the row length of the primary RS frame payload to be allocated to the regions A/B within the data group is N1 bytes and the row length of the secondary RS frame payload to be allocated to the regions C/D within the data group is N2 bytes, a condition of N1>N2 is satisfied. In this case, N1 and N2 can be varied depending on the transmission parameter or a region of the data group, to which the corresponding RS frame payload will be transmitted.

For convenience of the description, each row of the N1 and N2 bytes will be referred to as the M/H service data packet. The M/H service data packet within the RS frame payload to be allocated to the regions A/B within the data group can be comprised of M/H header of 2 bytes, a stuffing region of k bytes, and M/H payload of N1−2−k bytes. At this time, k has a value of 0 or a value greater than 0. Also, the M/H service data packet within the RS frame payload to be allocated to the regions C/D within the data group can be comprised of M/H header of 2 bytes, a stuffing region of k bytes, and M/H payload of N2−2−k bytes. At this time, k has a value of 0 or a value greater than 0.

In the present invention, the primary RS frame payload for the regions A/B within the data group and the secondary RS frame payload for the regions C/D within the data group can include at least one of IP datagrams of signaling table information and mobile service data. Also, one RS frame payload can include IP datagram corresponding to one or more mobile services.

Corresponding parts of FIG. 15 can be applied to the other parts, which are not described in FIG. 17(a) and FIG. 17(b).

Meanwhile, the value of N, which corresponds to the number of columns within an RS frame payload, can be decided according to Equation 2.

$$N = \left\lfloor \frac{5 \times NoG \times PL}{187 + P} \right\rfloor - 2 \qquad \text{Equation 2}$$

Herein, NoG indicates the number of data groups assigned to a sub-frame. PL represents the number of SCCC payload data bytes assigned to a data group. And, P signifies the number of RS parity data bytes added to each column of the RS frame payload. Finally, $\lfloor X \rfloor$ is the greatest integer that is equal to or smaller than X.

More specifically, in Equation 2, PL corresponds to the length of an RS frame portion. The value of PL is equivalent to the number of SCCC payload data bytes that are assigned to the corresponding data group. Herein, the value of PL may vary depending upon the RS frame mode, SCCC block mode, and SCCC outer code mode. Table 2 to Table 5 below respectively show examples of PL values, which vary in accordance with the RS frame mode, SCCC block mode, and SCCC outer code mode. The SCCC block mode and the SCCC outer code mode will be described in detail in a later process.

TABLE 2

| SCCC outer code mode | | | | |
|---|---|---|---|---|
| for Region A | for Region B | for Region C | for Region D | PL |
| 00 | 00 | 00 | 00 | 9624 |
| 00 | 00 | 00 | 01 | 9372 |
| 00 | 00 | 01 | 00 | 8886 |
| 00 | 00 | 01 | 01 | 8634 |
| 00 | 01 | 00 | 00 | 8403 |
| 00 | 01 | 00 | 01 | 8151 |
| 00 | 01 | 01 | 00 | 7665 |
| 00 | 01 | 01 | 01 | 7413 |
| 01 | 00 | 00 | 00 | 7023 |
| 01 | 00 | 00 | 01 | 6771 |
| 01 | 00 | 01 | 00 | 6285 |
| 01 | 00 | 01 | 01 | 6033 |
| 01 | 01 | 00 | 00 | 5802 |
| 01 | 01 | 00 | 01 | 5550 |
| 01 | 01 | 01 | 00 | 5064 |
| 01 | 01 | 01 | 01 | 4812 |
| Others | | | | Reserved |

Table 2 shows an example of the PL values for each data group within an RS frame, wherein each PL value varies depending upon the SCCC outer code mode, when the RS frame mode value is equal to '00', and when the SCCC block mode value is equal to '00'. For example, when it is assumed that each SCCC outer code mode value of regions A/B/C/D within the data group is equal to '00' (i.e., the block processor 302 of a later block performs encoding at a coding rate of 1/2), the PL value within each data group of the corresponding RS frame may be equal to 9624 bytes. More specifically, 9624 bytes of mobile service data within one RS frame may be assigned to regions A/B/C/D of the corresponding data group.

TABLE 3

| SCCC outer code mode | PL |
| --- | --- |
| 00 | 9624 |
| 01 | 4812 |
| Others | Reserved |

Table 3 shows an example of the PL values for each data group within an RS frame, wherein each PL value varies depending upon the SCCC outer code mode, when the RS frame mode value is equal to '00', and when the SCCC block mode value is equal to '01'.

TABLE 4

| SCCC outer code mode | | PL |
| --- | --- | --- |
| For Region A | for Region B | |
| 00 | 00 | 7644 |
| 00 | 01 | 6423 |
| 01 | 00 | 5043 |
| 01 | 01 | 3822 |
| Others | | Reserved |

Table 4 shows an example of the PL values for each data group within a primary RS frame, wherein each PL value varies depending upon the SCCC outer code mode, when the RS frame mode value is equal to '01', and when the SCCC block mode value is equal to '00'. For example, when each SCCC outer code mode value of regions A/B is equal to '00', 7644 bytes of mobile service data within a primary RS frame may be assigned to regions A/B of the corresponding data group.

TABLE 5

| SCCC outer code mode | | PL |
| --- | --- | --- |
| For Region C | for Region D | |
| 00 | 00 | 1980 |
| 00 | 01 | 1728 |
| 01 | 00 | 1242 |
| 01 | 01 | 990 |
| Others | | Reserved |

Table 5 shows an example of the PL values for each data group within a secondary RS frame, wherein each PL value varies depending upon the SCCC outer code mode, when the RS frame mode value is equal to '01', and when the SCCC block mode value is equal to '00'. For example, when each SCCC outer code mode value of regions C/D is equal to '00', 1980 bytes of mobile service data within a secondary RS frame may be assigned to regions C/D of the corresponding data group.

Service Multiplexer

Figure 18:
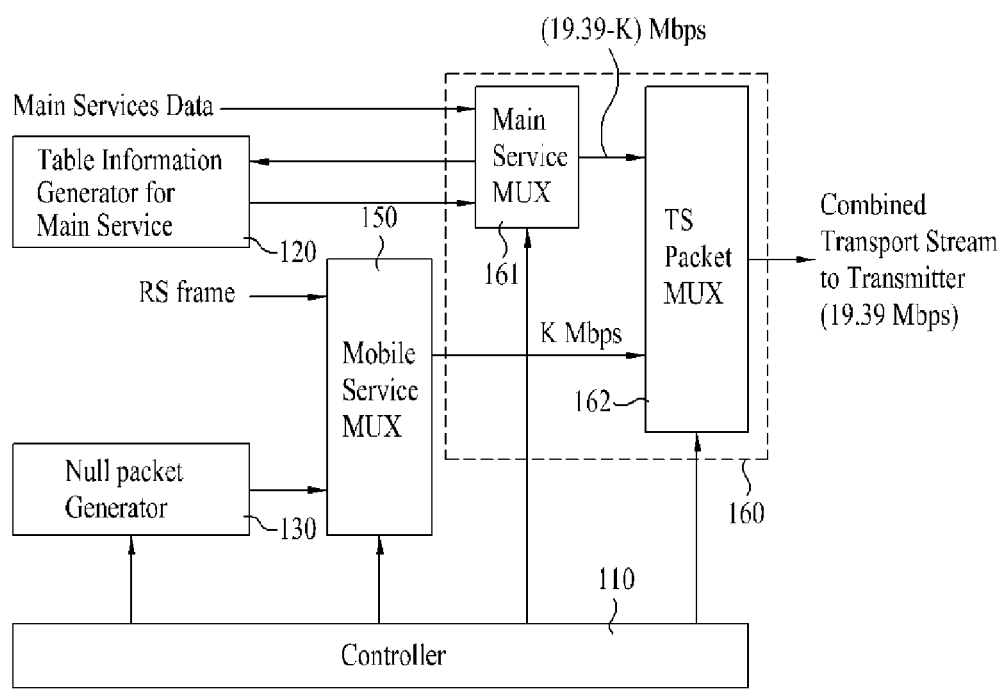
FIG. 18 illustrates a block diagram showing an example of a service multiplexer of FIG. 14.

FIG. 18 illustrates a block diagram showing an example of the service multiplexer. The service multiplexer includes a controller 110 for controlling the overall operations of the service multiplexer, a table information generator 120 for the main service, a null packet generator 130, an OM packet encapsulator 140, a mobile service multiplexer 150, and a transport multiplexer 160.

The transport multiplexer 160 may include a main service multiplexer 161 and a transport stream (TS) packet multiplexer 162.

Referring to FIG. 18, at least one type of compression-encoded main service data and table data generated from the table information generator 120 for the main services are inputted to the main service multiplexer 161 of the transport multiplexer 160. According to the embodiment of the present invention, the table information generator 120 generates PSI/PSIP table data, which is configured in the form of an MPEG-2 private section.

The main service multiplexer 161 respectively encapsulates each of the main service data and the PSI/PSIP table data, which are being inputted, to MPEG-2 TS packet formats, thereby multiplexing the encapsulated TS packets and outputting the multiplexed packets to the TS packet multiplexer 162. Herein, the data packet being outputted from the main service multiplexer 161 will hereinafter be referred to as a main service data packet for simplicity.

The mobile service multiplexer 150 receives and respectively encapsulates at least one type of compression-encoded mobile service data and the table information (e.g., PSI/PSIP table data) for mobile services to MPEG-2 TS packet formats. Then, the mobile service multiplexer 150 multiplexes the encapsulated TS packets, thereby outputting the multiplexed packets to the TS packet multiplexer 162. Hereinafter, the data packet being outputted from the mobile service multiplexer 150 will be referred to as a mobile service data packet for simplicity.

Alternatively, the mobile service multiplexer 150 receives and encapsulates an RS frame payload, which is generated by using at least one type of compression-encoded mobile service data and the signaling table information for mobile services, to MPEG-2 TS packet formats. Then, the mobile service multiplexer 150 multiplexes the encapsulated TS packets, thereby outputting the multiplexed packets to the TS packet multiplexer 162. Hereinafter, the data packet being outputted from the mobile service multiplexer 150 will be referred to as a mobile service data packet for simplicity.

According to an embodiment of the present invention, the mobile service multiplexer 150 encapsulates an RS frame payload, which is inputted in any one of the formats shown in FIG. 15, FIG. 17(a), or FIG. 17(b), to a TS packet format.

At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet.

As an example of the present invention, a different packet identifier (PID) may be assigned to identify each of the main service data packet and the mobile service data packet. More specifically, by assigning a PID, which does not use for the main service data packet, to the mobile service data packet, the transmitter 200 refers to a PID of data packet inputted, thereby can identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC 13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed.

As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification.

Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least 1/2, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps.

In order to set the final output data rate of the mobile service multiplexer 150 to K Mbps, the service multiplexer 100 of the present invention may perform various exemplary operations.

According to an embodiment of the present invention, the null packet generator 130 may generate a null data packet, which is then outputted to the mobile service multiplexer 150. Thereafter, the mobile service multiplexer 150 may multiplex the null data packet and the mobile service data packets, so as to set the output data rate to K Mbps.

At this point, the null data packet is transmitted to the transmitter 200, thereby being discarded. More specifically, the null data packet is not transmitted to the receiving system. In order to do so, identification information for identifying the null data is also required. Herein, the identification information for identifying the null data may also use a value pre-decided based upon an agreement between the transmitting system and the receiving system and may also be configured of a separate set of data. And, the identification information for identifying the null data may also change a predetermined position value within the null data packet and use the changed value. For example, the null packet generator 130 may modify (or change) a synchronization byte value within the header of the null data packet, thereby using the changed value as the identification information. Alternatively, the transport_error_indicator flag may be set to '1', thereby being used as the identification information. According to the embodiment of the present invention, the transport_error_indicator flag within the header of the null data packet is used as the identification information for identifying the null data packet. In this case, the transport_error_indicator flag of the null data packet is set to '1', and the transport_error_indicator flag for each of the other remaining data packets is reset to '0', so that the null data packet can be identified (or distinguished).

More specifically, when the null packet generator 130 generated a null data packet, and if, among the fields included in the header of the null data packet, the transport_error_indicator flag is set to '1' and then transmitted, the transmitter 200 may identify and discard the null data packet corresponding to the transport_error_indicator flag.

Herein, any value that can identify the null data packet may be used as the identification information for identifying the null data packet. Therefore, the present invention will not be limited only to the example proposed in the description of the present invention.

As another example of setting (or matching) the final output data rate of the mobile service multiplexer 150 to K Mbps, an operations and maintenance (OM) packet (also referred to as OMP) may be used. In this case, the mobile service multiplexer 150 may multiplex the mobile service data packet, the null data packet, and the OM packet, so as to set the output data rate to K Mbps.

Meanwhile, signaling data, such as transmission parameters, are required for enabling the transmitter 200 to process the mobile service data.

According to an embodiment of the present invention, the transmission parameter is inserted in the payload region of the OM packet, thereby being transmitted to the transmitter.

At this point, in order to enable the transmitter 200 to identify the insertion of the transmission parameter in the OM packet, identification information that can identify the insertion of the transmission parameter in the type field of the corresponding OM packet (i.e., OM_type field).

More specifically, an operations and maintenance packet (OMP) is defined for the purpose of operating and managing the transmitting system. For example, the OMP is configured in an MPEG-2 TS packet format, and the value of its respective PID is equal to '0x1FFA'. The OMP consists of a 4-byte header and a 184-byte payload. Among the 184 bytes, the first byte corresponds to the OM_type field indicating the type of the corresponding OM packet (OMP). And, the remaining 183 bytes correspond to an OM_payload field, wherein actual data are inserted.

According to the present invention, among the reserved field values of the OM_type field, a pre-arranged value is used, thereby being capable of indicating that a transmission parameter has been inserted in the corresponding OM packet. Thereafter, the transmitter 200 may locate (or identify) the corresponding OMP by referring to the respective PID. Subsequently, by parsing the OM_type field within the OMP, the transmitter 200 may be able to know (or recognize) whether or not a transmission parameter has been inserted in the corresponding OM packet.

The transmission parameters that can be transmitted to the OM packet include M/H frame information (e.g., M/H frame_index), FIC information (e.g., next_FIC_version_number), parade information (e.g., number_of_parades, parade_id, parade_repetition_cycle, and ensemble_id), group information (e.g., number_of_group and start_group_number), SCCC information (e.g., SCCC_block_mode and SCCC_outer_code_mode), RS frame information (e.g., RS_Frame_mode and RS_frame_continuity_counter), RS encoding information (e.g., RS_code_mode), and so on.

At this point, the OM packet in which the transmission parameter is inserted may be periodically generated by a constant cycle, so as to be multiplexed with the mobile service data packet.

The multiplexing rules and the generation of null data packets of the mobile service multiplexer 150, the main service multiplexer 161, and the TS packet multiplexer 160 are controlled by the controller 110.

The TS packet multiplexer 162 multiplexes a data packet being outputted from the main service multiplexer 161 at (19.39-K) Mbps with a data packet being outputted from the mobile service multiplexer 150 at K Mbps. Thereafter, the TS packet multiplexer 162 transmits the multiplexed data packet to the transmitter 200 at a data rate of 19.39 Mbps.

Transmitter

Figure 19:
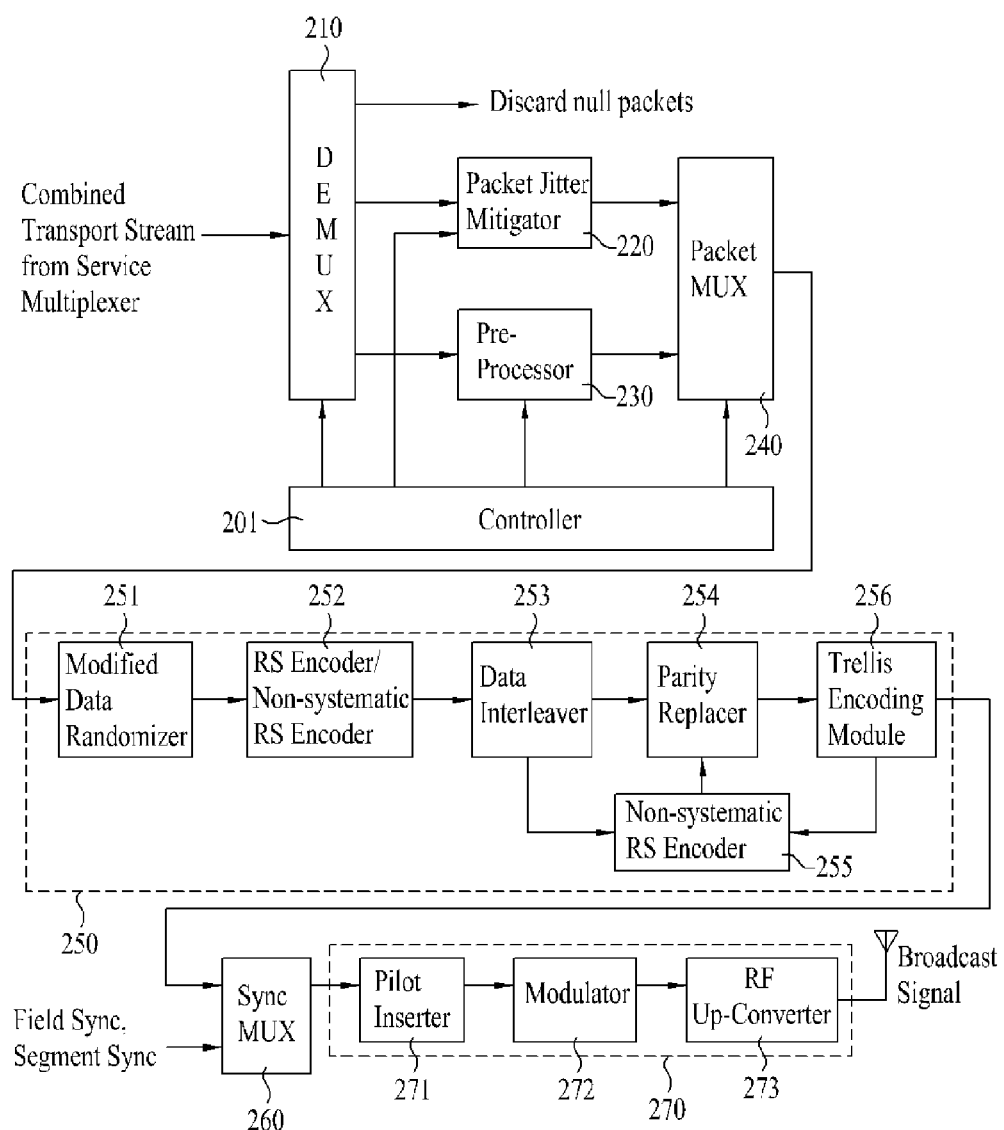
FIG. 19 illustrates a block diagram showing an embodiment of a transmitter of FIG. 14.

FIG. 19 illustrates a block diagram showing an example of the transmitter 200 according to an embodiment of the present invention. Herein, the transmitter 200 includes a controller 201, a demultiplexer 210, a packet jitter mitigator 220, a pre-processor 230, a packet multiplexer 240, a post-processor 250, a synchronization (sync) multiplexer 260, and a transmission unit 270.

Herein, when a data packet is received from the service multiplexer 100, the demultiplexer 210 should identify whether the received data packet corresponds to a main service data packet, a mobile service data packet, a null data packet, or an OM packet.

For example, the demultiplexer 210 uses the PID within the received data packet so as to identify the main service data packet, the mobile service data packet, and the null data packet. Then, the demultiplexer 210 uses a transport_error_indicator field to identify the null data packet.

If an OM packet is included in the received data packet, the OM packet may identify using the PID within the received data packet. And by using the OM_type field included in the identified OM packet, the demultiplexer 210 may be able to know whether or not a transmission parameter is included in the payload region of the corresponding OM packet and, then, received.

The main service data packet identified by the demultiplexer 210 is outputted to the packet jitter mitigator 220, the mobile service data packet is outputted to the pre-processor 230, and the null data packet is discarded. If the transmission parameter is included in the OM packet, the corresponding transmission parameter is extracted, so as to be outputted to the corresponding blocks. Thereafter, the OM packet is discarded. According to an embodiment of the present invention, the transmission parameter extracted from the OM packet is outputted to the corresponding blocks through the controller 201.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes.

Figure 17:
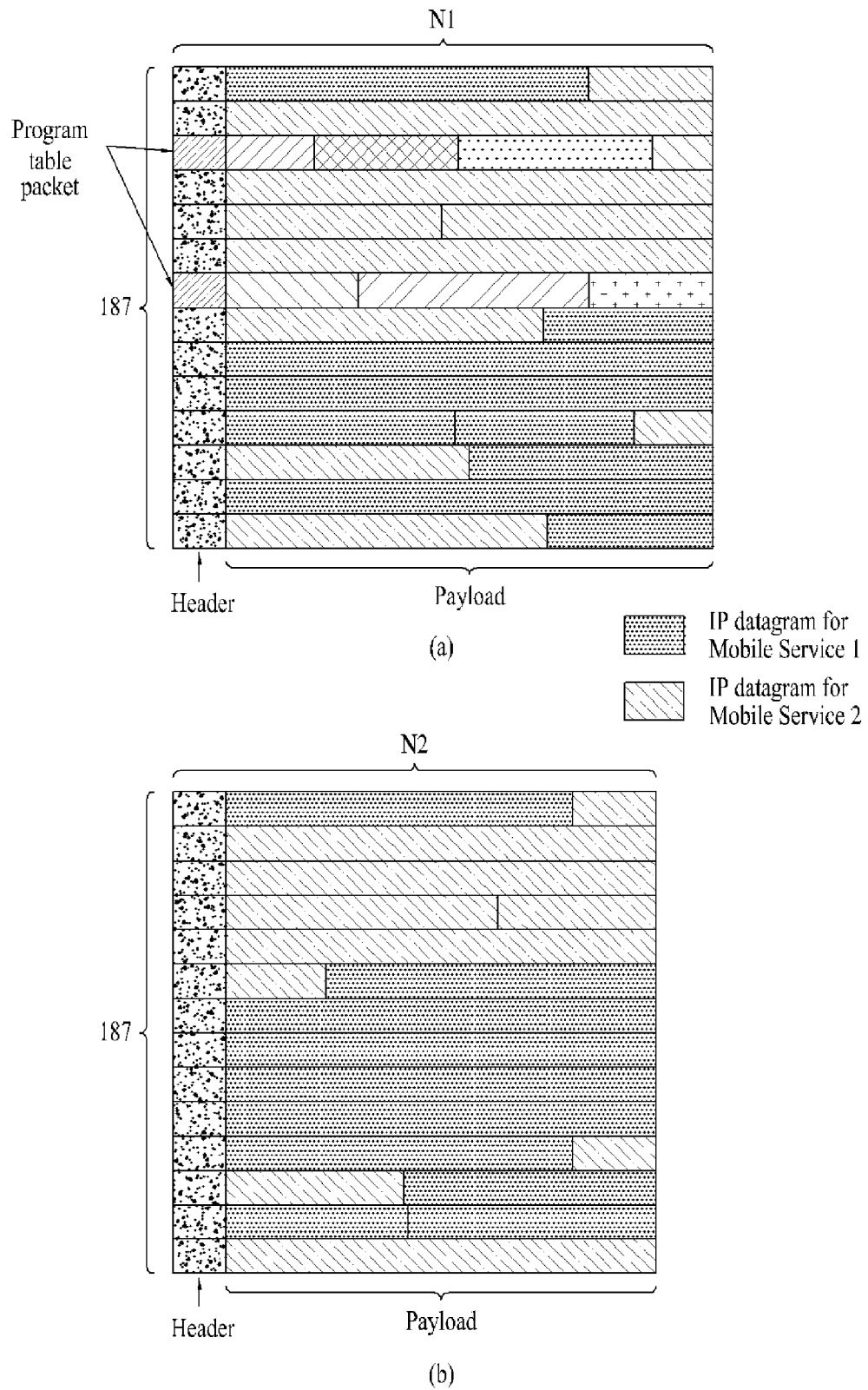
FIG. 17(a) and FIG. 17(b) are diagrams illustrating another example of RS frame payload according to the present invention.

According to one embodiment of the present invention, RS frame payload of FIG. 15 (or (a) and (b) of FIG. 17) is encapsulated into TS packet by the service multiplexer 100 and transmitted to the transmitter. In this case, mobile service data within the mobile service data packet become a part of data of the RS frame payload. In the present invention, for convenience of description, M/H header data of 2 bytes of each M/H service data packet, stuffing data of k bytes, and M/H payload data of N−2−k bytes will be referred to as mobile service data. According to one embodiment of the present invention, the M/H payload data are signaling table and/or IP datagram of mobile service data.

The pre-processor 230 may also refer to the transmission parameter extracted in the OM packet when performing the additional encoding process. Also, the pre-processor 230 groups a plurality of mobile service data packets to configure a data group. Thereafter, known data, mobile service data, RS parity data, and MPEG header are allocated to pre-determined regions within the data group.

Pre-processor within Transmitter

Figure 20:
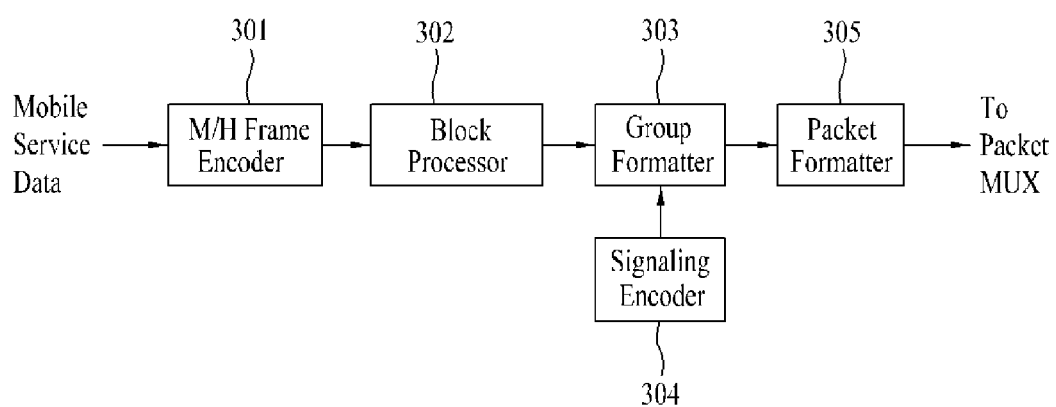
FIG. 20 illustrates a block diagram showing an example of a pre-processor of FIG. 19.

FIG. 20 illustrates a block diagram showing the structure of a pre-processor 230 according to the present invention. Herein, the pre-processor 230 includes an M/H frame encoder 301, a block processor 302, a group formatter 303, a signaling encoder 304, and a packet formatter 305.

The M/H frame encoder 301, which is included in the pre-processor 230 having the above-described structure, data-randomizes the mobile service data that are inputted to the demultiplexer 210, thereby forming at least one RS frame belonging to an ensemble.

The M/H frame encoder 301 may include at least one RS frame encoder. More specifically, RS frame encoders may be provided in parallel, wherein the number of RS frame encoders is equal to the number of parades within the M/H frame. As described above, the M/H frame is a basic time cycle period for transmitting at least one parade. Also, each parade consists of one or two RS frames.

Figure 21:
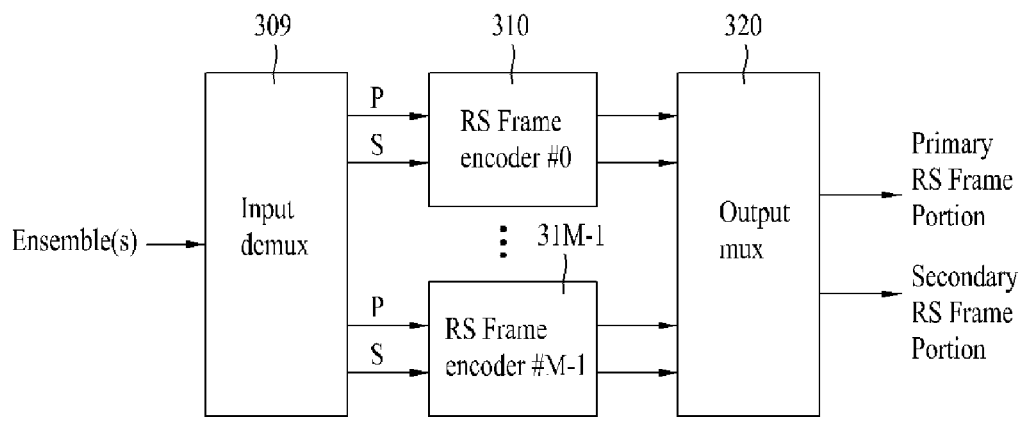
FIG. 21 illustrates a conceptual block diagram of the M/H frame encoder of FIG. 20.

FIG. 21 illustrates a conceptual block diagram of the M/H frame encoder 301 according to an embodiment of the present invention. The M/H frame encoder 301 includes an input demultiplexer (DEMUX) 309, M number of RS frame encoders 310 to 31M-1, and an output multiplexer (MUX) 320. Herein, M represent the number of parades included in one M/H frame.

The demultiplexer 309 output the inputted mobile service data packet to a corresponding RS frame encoder among M number of RS frame encoders in ensemble units.

According to an embodiment of the present invention, each RS frame encoder forms an RS frame payload using mobile service data inputted and performs an error correction encoding process in RS frame payload units, thereby forming an RS frame. Also, each RS frame encoder divides the error-correction-encoded RS frame into a plurality of portions, in order to assign the error-correction-encoded RS frame data to a plurality of data groups. Based upon the RS frame mode of Table 1, data within one RS frame may be assigned either to all of regions A/B/C/D within multiple data groups, or to at least one of regions A/B and regions C/D within multiple data groups.

When the RS frame mode value is equal to '01', i.e., when the data of the primary RS frame are assigned to regions A/B of the corresponding data group and data of the secondary RS frame are assigned to regions C/D of the corresponding data group, each RS frame encoder creates a primary RS frame and a secondary RS frame for each parade. Conversely, when the RS frame mode value is equal to '00', when the data of the primary RS frame are assigned to all of regions A/B/C/D, each RS frame encoder creates a RS frame (i.e., a primary RS frame) for each parade.

Also, each RS frame encoder divides each RS frame into several portions. Each portion of the RS frame is equivalent to a data amount that can be transmitted by a data group. The output multiplexer (MUX) 320 multiplexes portions within M number of RS frame encoders 310 to 310M-1 are multiplexed and then outputted to the block processor 302.

For example, if one parade transmits two RS frames, portions of primary RS frames within M number of RS frame encoders 310 to 310M-1 are multiplexed and outputted. Thereafter, portions of secondary RS frames within M number of RS frame encoders 310 to 310M-1 are multiplexed and transmitted.

The input demultiplexer (DEMUX) 309 and the output multiplexer (MUX) 320 operate based upon the control of the controller 201. The controller 201 may provide necessary (or required) FEC modes to each RS frame encoder. The FEC mode includes the RS code mode, which will be described in detail in a later process.

Figure 22:
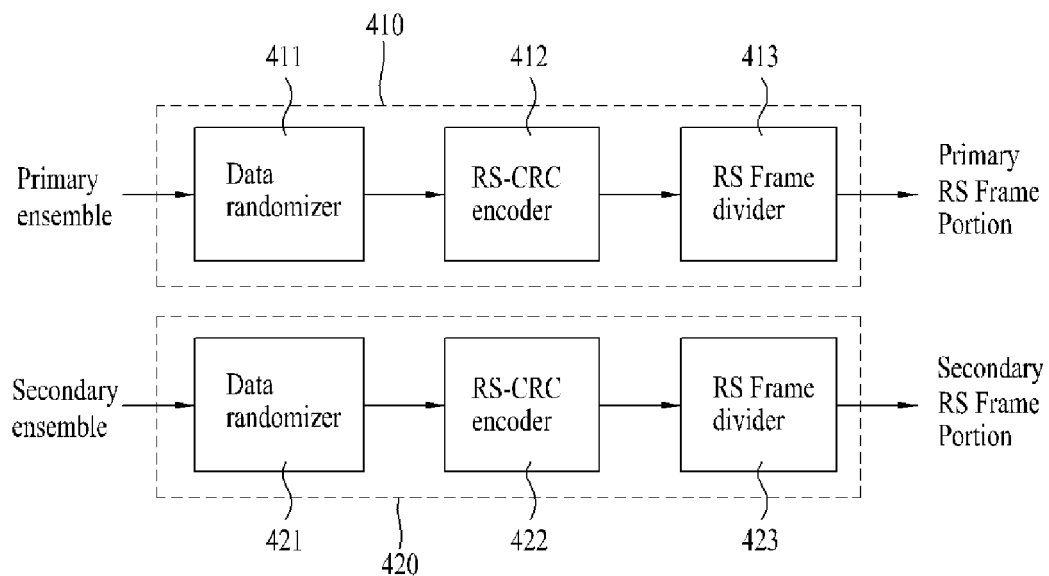
FIG. 22 illustrates a detailed block diagram of an RS frame encoder of FIG. 21.

FIG. 22 illustrates a detailed block diagram of an RS frame encoder among a plurality of RS frame encoders within an M/H frame encoder.

One RS frame encoder may include a primary encoder 410 and a secondary encoder 420. Herein, the secondary encoder 420 may or may not operate based upon the RS frame mode. For example, when the RS frame mode value is equal to '00', as shown in Table 1, the secondary encoder 420 does not operate.

The primary encoder 410 may include a data randomizer 411, a Reed-Solomon-cyclic redundancy check (RS-CRC) encoder (412), and a RS frame divider 413. And, the secondary encoder 420 may also include a data randomizer 421, a RS-CRC encoder (422), and a RS frame divider 423.

More specifically, the data randomizer 411 of the primary encoder 410 receives mobile service data of a primary RS frame payload belonging to a primary ensemble outputted from the output demultiplexer (DEMUX) 309. Then, after randomizing the received mobile service data, the data randomizer 411 outputs the randomized data to the RS-CRC encoder 412.

The RS-CRC encoder 412 forms an RS frame payload belonging to the randomized primary ensemble, and performs forward error collection (FEC)-encoding in the RS frame payload unit using at least one of a Reed-Solomon (RS) code and a cyclic redundancy check (CRC) code. The RS-CRC encoder 412 outputs the FEC-encoded RS frame to the RS frame divider 413.

The RS-CRC encoder 412 groups a plurality of mobile service data that is randomized and inputted, so as to form a RS frame payload. Then, the RS-CRC encoder 412 performs at least one of an error correction encoding process and an error detection encoding process in RS frame payload units, thereby forming an RS frame. Accordingly, robustness may be provided to the mobile service data, thereby scattering group error that may occur during changes in a frequency environment, thereby enabling the mobile service data to respond to the frequency environment, which is extremely vulnerable and liable to frequent changes. Also, the RS-CRC encoder 412 groups a plurality of RS frame so as to create a super frame, thereby performing a row permutation process in super frame units. The row permutation process may also be referred to as a "row interleaving process". Hereinafter, the process will be referred to as "row permutation" for simplicity. In the present invention, the row permutation process is optional.

More specifically, when the RS-CRC encoder 412 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process in the RS-CRC encoder 412. When performing the RS-encoding, parity data that are used for the error correction are generated. And, when performing the CRC encoding, CRC data that are used for the error detection are generated. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system.

Herein, the RS-CRC encoder 412 refers to a pre-determined transmission parameter provided by the controller 201 so as to perform operations including RS frame configuration, RS encoding, CRC encoding, super frame configuration, and row permutation in super frame units.

Figure 23:
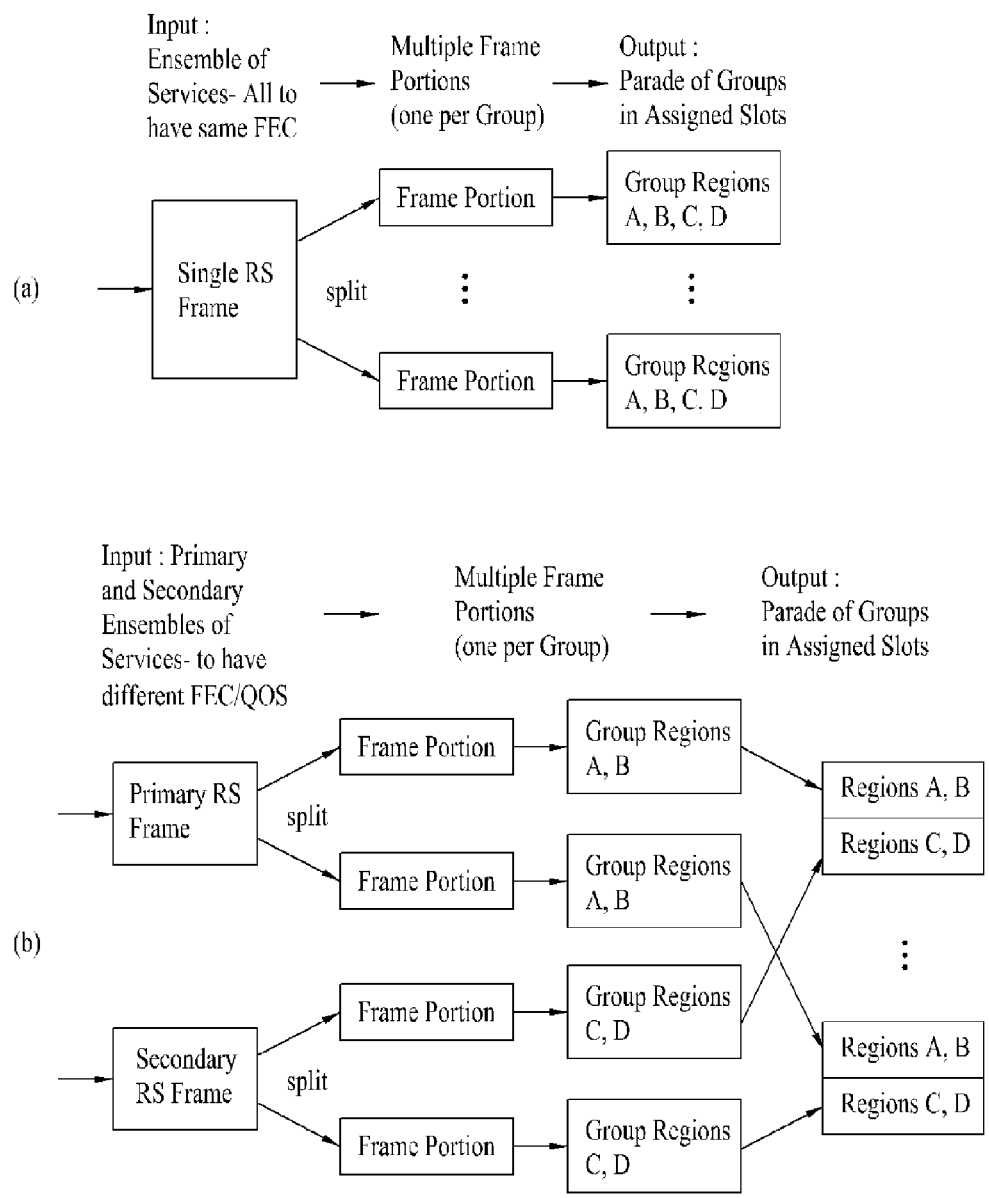
FIG. 23(a) and FIG. 23(b) illustrate a process of one or two RS frame being divided into several portions, based upon an RS frame mode value, and a process of each portion being assigned to a corresponding region within the respective data group.

FIG. 23(a) and FIG. 23(b) illustrate a process of one or two RS frame being divided into several portions, based upon an RS frame mode value, and a process of each portion being assigned to a corresponding region within the respective data group. According to an embodiment of the present invention, the data assignment within the data group is performed by the group formatter 303.

More specifically, FIG. 23(a) shows an example of the RS frame mode value being equal to '00'. Herein, only the primary encoder 410 of FIG. 22 operates, thereby forming one RS frame for one parade. Then, the RS frame is divided into several portions, and the data of each portion are assigned to regions A/B/C/D within the respective data group. FIG. 23(b) shows an example of the RS frame mode value being equal to '01'. Herein, both the primary encoder 410 and the secondary encoder 420 of FIG. 22 operate, thereby forming two RS frames for one parade, i.e., one primary RS frame and one secondary RS frame. Then, the primary RS frame is divided into several portions, and the secondary RS frame is divided into several portions. At this point, the data of each portion of the primary RS frame are assigned to regions A/B within the respective data group. And, the data of each portion of the secondary RS frame are assigned to regions C/D within the respective data group.

Detailed Description of the RS Frame

FIG. 24(a) illustrates an example of an RS frame being generated from the RS-CRC encoder 412 according to the present invention.

When the RS frame payload is formed, as shown in FIG. 24(a), the RS-CRC encoder 412 performs a (Nc,Kc)-RS encoding process on each column, so as to generate Nc−Kc (=P) number of parity bytes. Then, the RS-CRC encoder 412 adds the newly generated P number of parity bytes after the very last byte of the corresponding column, thereby creating a column of (187+P) bytes. Herein, as shown in FIG. 24(a), Kc is equal to 187 (i.e., Kc=187), and Nc is equal to 187+P (i.e., Nc=187+P). Herein, the value of P may vary depending upon the RS code mode. Table 6 below shows an example of an RS code mode, as one of the RS encoding information.

TABLE 6

| RS code mode | RS code | Number of Parity Bytes (P) |
|---|---|---|
| 00 | (211, 187) | 24 |
| 01 | (223, 187) | 36 |
| 10 | (235, 187) | 48 |
| 11 | Reserved | Reserved |

Table 6 shows an example of 2 bits being assigned in order to indicate the RS code mode. The RS code mode represents the number of parity bytes corresponding to the RS frame payload.

For example, when the RS code mode value is equal to '10', (235,187)-RS-encoding is performed on the RS frame payload of FIG. 24(a), so as to generate 48 parity data bytes. Thereafter, the 48 parity bytes are added after the last data byte of the corresponding column, thereby creating a column of 235 data bytes.

When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

When such RS encoding process is performed on all N number of columns, a size of N(row)×(187+P) (column) bytes may be generated, as shown in FIG. 24(b).

Each row of the RS frame payload is configured of N bytes.

However, depending upon channel conditions between the transmitting system and the receiving system, error may be included in the RS frame payload. When errors occur as described above, CRC data (or CRC code or CRC checksum) may be used on each row unit in order to verify whether error exists in each row unit.

The RS-CRC encoder 412 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system.

FIG. 24(c) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 3 below corresponds to an exemplary equation for generating a 2-byte CRC checksum for each row being configured of N number of bytes.

$$g(x)=x^{16}+x^{12}+x^5+1 \qquad \text{Equation 3}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame payload is converted into a (N+2)×(187+P)-byte RS frame. Based upon an error correction scenario of a RS frame formed as described above, the data bytes within the RS frame are transmitted through a channel in a row direction. At this point, when a large number of errors occur during a limited period of transmission time, errors also occur in a row direction within the RS frame being processed with a decoding process in the receiving system. However, in the perspective of RS encoding performed in a column direction, the errors are shown as being scattered. Therefore, error correction may be performed more effectively. At this point, a method of increasing the number of parity data bytes (P) may be used in order to perform a more intense error correction process. However, using this method may lead to a decrease in transmission efficiency. Therefore, a mutually advantageous method is required. Furthermore, when performing the decoding process, an erasure decoding process may be used to enhance the error correction performance.

Additionally, the RS-CRC encoder 412 according to the present invention also performs a row permutation (or interleaving) process in super frame units in order to further enhance the error correction performance when error correction the RS frame.

Figure 25:
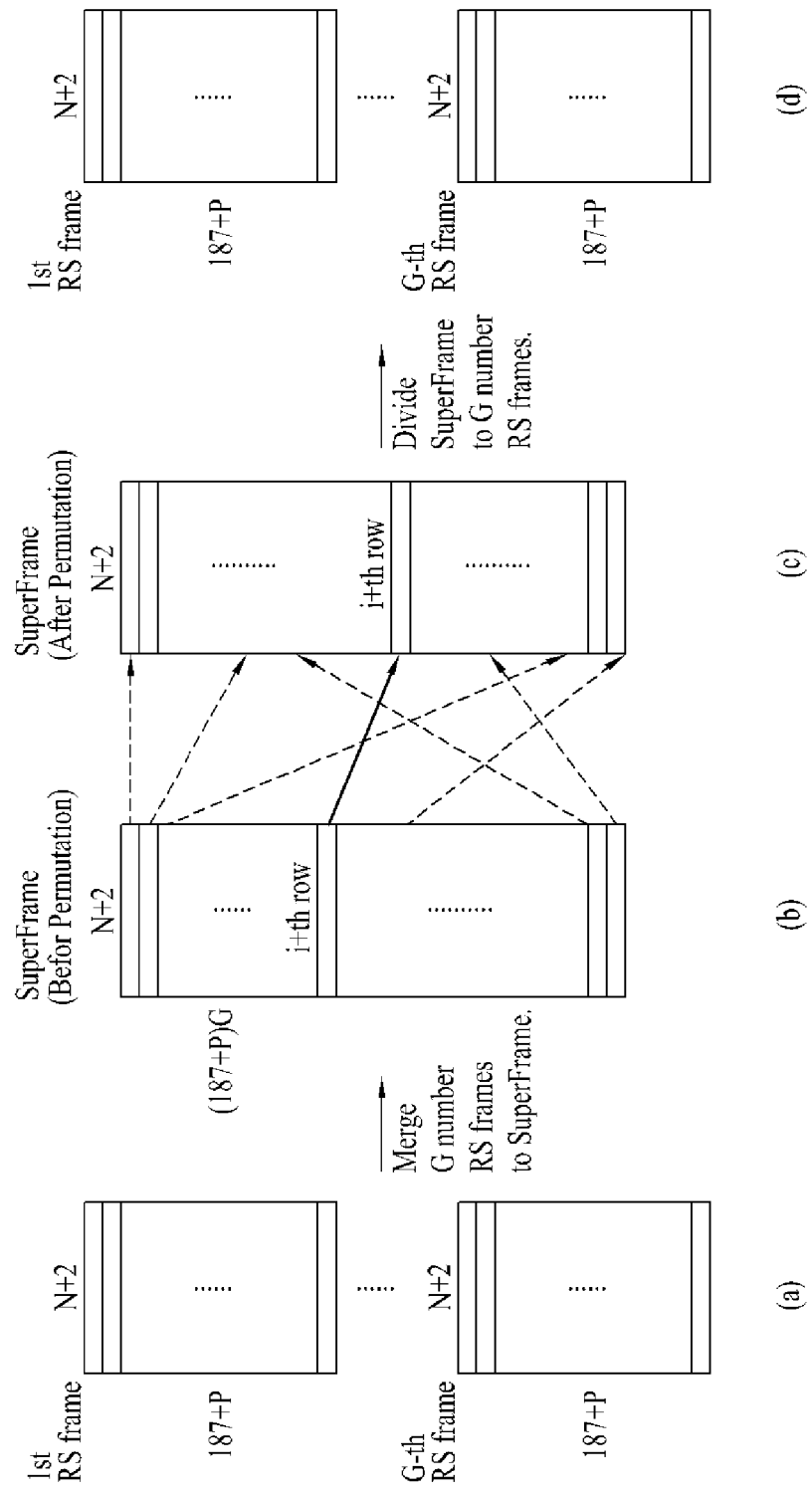
FIG. 25(a) to FIG. 25(d) illustrate an example of performing a row permutation (or interleaving) process in super frame units according to the present invention.

FIG. 25(a) to FIG. 25(d) illustrates an example of performing a row permutation process in super frame units according to the present invention. More specifically, G number of RS frames RS-CRC-encoded is grouped to form a super frame, as shown in FIG. 25(a). At this point, since each RS frame is formed of (N+2)×(187+P) number of bytes, one super frame is configured to have the size of (N+2)×(187+P)×G bytes.

When a row permutation process permuting each row of the super frame configured as described above is performed based upon a pre-determined permutation rule, the positions of the rows prior to and after being permuted (or interleaved) within the super frame may be altered. More specifically, the $i^{th}$ row of the super frame prior to the interleaving process, as shown in FIG. 25(b), is positioned in the $j^{th}$ row of the same super frame after the row permutation process, as shown in FIG. 25(c). The above-described relation between i and j can be easily understood with reference to a permutation rule as shown in Equation 4 below.

$$j=G(i \bmod (187+P))+\lfloor i/(187+P) \rfloor \qquad \text{Equation 4}$$

$$i=(187+P)(j \bmod G)+\lfloor j/G \rfloor$$

where $0 \le i, j \le (187+P)G-1$; or where $0 \le i, j < (187+P)G$

Herein, each row of the super frame is configured of (N+2) number of data bytes even after being row-permuted in super frame units.

When all row permutation processes in super frame units are completed, the super frame is once again divided into G number of row-permuted RS frames, as shown in FIG. 25(d), and then provided to the RS frame divider 413. Herein, the number of RS parity bytes and the number of columns should be equally provided in each of the RS frames, which configure a super frame. As described in the error correction scenario of a RS frame, in case of the super frame, a section having a large number of error occurring therein is so long that, even when one RS frame that is to be decoded includes an excessive number of errors (i.e., to an extent that the errors cannot be corrected), such errors are scattered throughout the entire super frame. Therefore, in comparison with a single RS frame, the decoding performance of the super frame is more enhanced.

The above description of the present invention corresponds to the processes of forming (or creating) and encoding an RS frame, when a data group is divided into regions A/B/C/D, and when data of an RS frame are assigned to all of regions A/B/C/D within the corresponding data group. More specifically, the above description corresponds to an embodiment of the present invention, wherein one RS frame is transmitted using one parade. In this embodiment, the secondary encoder 420 does not operate (or is not active).

Meanwhile, 2 RS frames are transmitting using one parade, the data of the primary RS frame may be assigned to regions A/B within the data group and be transmitted, and the data of the secondary RS frame may be assigned to regions C/D within the data group and be transmitted. At this point, the primary encoder 410 receives the mobile service data that are to be assigned to regions A/B within the data group, forms the primary RS frame payload, and then performs RS-encoding and CRC-encoding on the primary RS frame payload, thereby forming the primary RS frame. Similarly, the secondary encoder 420 receives the mobile service data that are to be assigned to regions C/D within the data group, forms the secondary RS frame payload, and then performs RS-encoding and CRC-encoding on the secondary RS frame payload thereby forming the secondary RS frame. More specifically, the primary RS frame and the secondary RS frame are generated independently.

FIG. 26 illustrates examples of receiving the mobile service data that are to be assigned to regions A/B within the data group, so as to form the primary RS frame payload, and receives the mobile service data that are to be assigned to regions C/D within the data group, so as to form the secondary RS frame payload, thereby performing error correction encoding and error detection encoding on each of the first and secondary RS frame payloads.

More specifically, FIG. 26(*a*) illustrates an example of the RS-CRC encoder 412 of the primary encoder 410 receiving mobile service data of the primary ensemble that are to be assigned to regions A/B within the corresponding data group, so as to create an RS frame payload having the size of N1(row)×187(column). Then, in this example, the primary encoder 410 performs RS-encoding on each column of the RS frame payload created as described above, thereby adding P1 number of parity data bytes in each column. Finally, the primary encoder 410 performs CRC-encoding on each row, thereby adding a 2-byte checksum in each row, thereby forming an primary RS frame.

FIG. 26(*b*) illustrates an example of the RS-CRC encoder 422 of the secondary encoder 420 receiving mobile service data of the secondary ensemble that are to be assigned to regions C/D within the corresponding data group, so as to create an RS frame payload having the size of N2(row)×187 (column). Then, in this example, the secondary encoder 420 performs RS-encoding on each column of the RS frame payload created as described above, thereby adding P2 number of parity data bytes in each column. Finally, the secondary encoder 420 performs CRC-encoding on each row, thereby adding a 2-byte checksum in each row, thereby forming an secondary RS frame.

At this point, each of the RS-CRC encoders 412 and 422 may refer to a pre-determined transmission parameter provided by the controller 201, the RS-CRC encoders 412 and 422 may be informed of M/H frame information, FIC information, RS frame information (including RS frame mode information), RS encoding information (including RS code mode), SCCC information (including SCCC block mode information and SCCC outer code mode information), data group information, and region information within a data group. The RS-CRC encoders 412 and 422 may refer to the transmission parameters for the purpose of RS frame configuration, error correction encoding, error detection encoding. Furthermore, the transmission parameters should also be transmitted to the receiving system so that the receiving system can perform a normal decoding process. At this point, as an example of the present invention, the transmission parameter is transmitted through transmission parameter channel (TPC) to a receiving system. The TPC will be described in detail in a later.

The data of the primary RS frame, which is encoded by RS frame units and row-permuted by super frame units from the RS-CRC encoder 412 of the primary encoder 410, are outputted to the RS frame divider 413. If the secondary encoder 420 also operates in the embodiment of the present invention, the data of the secondary RS frame, which is encoded by RS frame units and row-permuted by super frame units from the RS-CRC encoder 422 of the secondary encoder 420, are outputted to the RS frame divider 423. The RS frame divider 413 of the primary encoder 410 divides the primary RS frame into several portions, which are then outputted to the output multiplexer (MUX) 320. Each portion of the primary RS frame is equivalent to a data amount that can be transmitted by one data group. Similarly, the RS frame divider 423 of the secondary encoder 420 divides the secondary RS frame into several portions, which are then outputted to the output multiplexer (MUX) 320.

Figure 24:
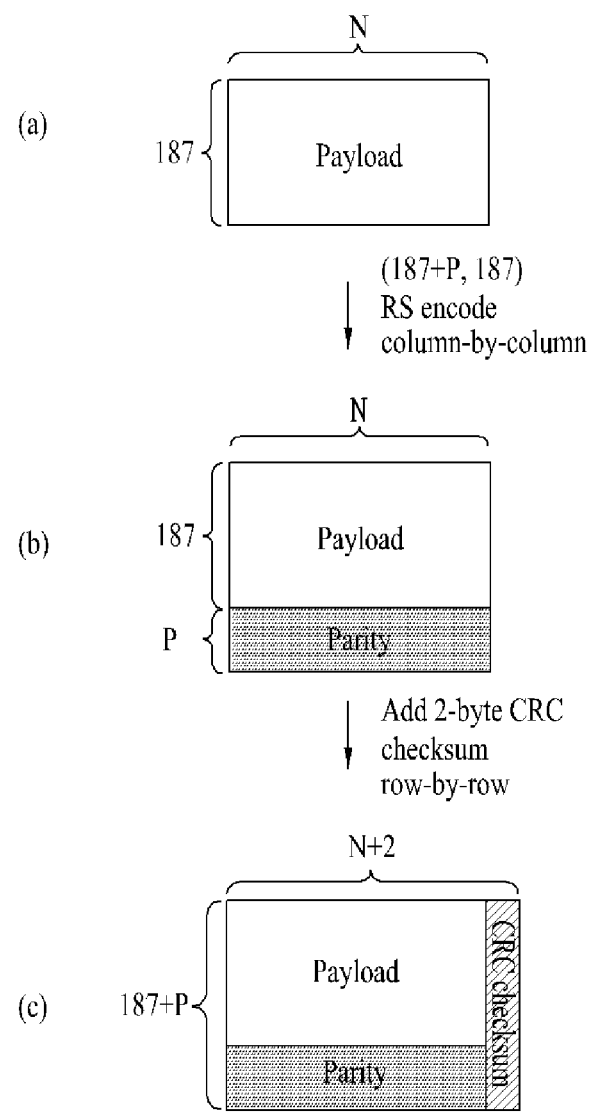
FIG. 24(a) to FIG. 24(c) illustrate error correction encoding and error detection encoding processes according to an embodiment of the present invention.

Hereinafter, the RS frame divider 413 of the primary RS encoder 410 will now be described in detail. Also, in order to simplify the description of the present invention, it is assumed that an RS frame payload having the size of N(row)×187 (column), as shown in FIG. 24(*a*) to FIG. 24(*c*), that P number of parity data bytes are added to each column by RS-encoding the RS frame payload, and that a 2-byte checksum is added to each row by CRC-encoding the RS frame payload. As a result, an RS frame having the size of (N+2) (row)×187+P (column) is formed. Accordingly, the RS frame divider 413 divides (or partitions) the RS frame having the size of (N+2) (row)×187+P (column) into several portions, each having the size of PL (wherein PL corresponds to the length of the RS frame portion).

At this point, as shown in Table 2 to Table 5, the value of PL may vary depending upon the RS frame mode, SCCC block mode, and SCCC outer coder mode. Also, the total number of data bytes of the RS-encoded and CRC-encoded RS frame is equal to or smaller than 5×NoG×PL. In this case, the RS frame is divided (or partitioned) into ((5×NoG)−1) number of portions each having the size of PL and one portion having a size equal to smaller than PL. More specifically, with the exception of the last portion of the RS frame, each of the remaining portions of the RS frame has an equal size of PL. If the size of the last portion is smaller than PL, a stuffing byte (or dummy byte) may be inserted in order to fill (or replace) the lacking number of data bytes, thereby enabling the last portion of the RS frame to also be equal to PL. Each portion of an RS frame corresponds to the amount of data that are to be SCCC-encoded and mapped into a single data group of a parade.

Figure 27:
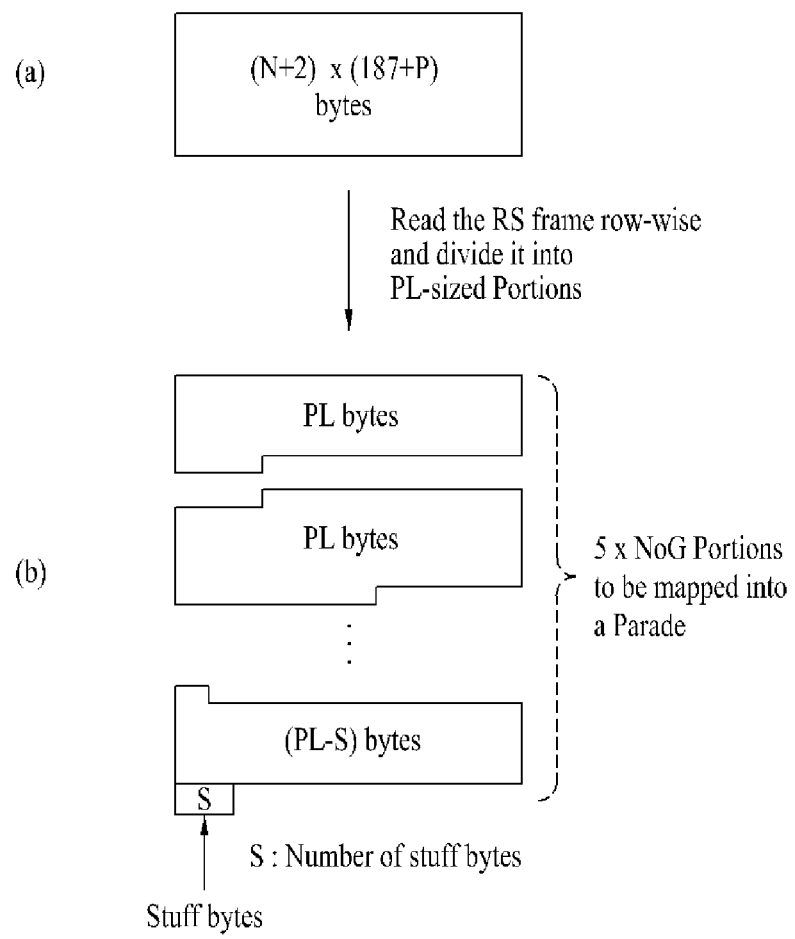
FIG. 27(a) and FIG. 27(b) illustrate an exemplary process of dividing an RS frame for configuring a data group according to the present invention.

FIG. 27(*a*) and FIG. 27(*b*) respectively illustrate examples of adding S number of stuffing bytes, when an RS frame having the size of (N+2) (row)×(187+P)(column) is divided into 5×NoG number of portions, each having the size of PL. More specifically, the RS-encoded and CRC-encoded RS frame, shown in FIG. 27(*a*), is divided into several portions, as shown in FIG. 27(b). The number of divided portions at the RS frame is equal to (5×NoG). Particularly, the first ((5× NoG)−1) number of portions each has the size of PL, and the last portion of the RS frame may be equal to or smaller than PL. If the size of the last portion is smaller than PL, a stuffing byte (or dummy byte) may be inserted in order to fill (or replace) the lacking number of data bytes, as shown in Equation 5 below, thereby enabling the last portion of the RS frame to also be equal to PL.

$$S=(5 \times NoG \times PL)-((N+2) \times (187+P)) \qquad \text{Equation 5}$$

Herein, each portion including data having the size of PL passes through the output multiplexer 320 of the M/H frame encoder 301, which is then outputted to the block processor 302.

At this point, the mapping order of the RS frame portions to a parade of data groups in not identical with the group assignment order defined in Equation 1. When given the group positions of a parade in an M/H frame, the SCCC-encoded RS frame portions will be mapped in a time order (i.e., in a left-to-right direction).

For example, as shown in FIG. 11, data groups of the $2^{nd}$ parade (Parade #1) are first assigned (or allocated) to the $13^{th}$ slot (Slot #12) and then assigned to the $3^{rd}$ slot (Slot #2). However, when the data are actually placed in the assigned slots, the data are placed in a time sequence (or time order, i.e., in a left-to-right direction). More specifically, the $1^{st}$ data group of Parade #1 is placed in Slot #2, and the $2^{nd}$ data group of Parade #1 is placed in Slot #12.

Block Processor

Meanwhile, the block processor 302 performs an SCCC outer encoding process on the output of the M/H frame encoder 301. More specifically, the block processor 302 receives the data of each error correction encoded portion. Then, the block processor 302 encodes the data once again at a coding rate of 1/H (wherein H is an integer equal to or greater than 2 (i.e., H≥2)), thereby outputting the 1/H-rate encoded data to the group formatter 303. According to the embodiment of the present invention, the input data are encoded either at a coding rate of 1/2 (also referred to as "1/2-rate encoding") or at a coding rate of 1/4 (also referred to as "1/4-rate encoding"). The data of each portion outputted from the M/H frame encoder 301 may include at least one of mobile service data, RS parity data, CRC data, and stuffing data. However, in a broader meaning, the data included in each portion may correspond to data for mobile services. Therefore, the data included in each portion will all be considered as mobile service data and described accordingly.

The group formatter 303 inserts the mobile service data SCCC-outer-encoded and outputted from the block processor 302 in the corresponding region within the data group, which is formed in accordance with a pre-defined rule. Also, in association with the data deinterleaving process, the group formatter 303 inserts various place holders (or known data place holders) in the corresponding region within the data group. Thereafter, the group formatter 303 deinterleaves the data within the data group and the place holders.

According to the present invention, with reference to data after being data-interleaved, as shown in FIG. 5, a data groups is configured of 10 M/H blocks (B1 to B10) and divided into 4 regions (A, B, C, and D). Also, as shown in FIG. 5, when it is assumed that the data group is divided into a plurality of hierarchical regions, as described above, the block processor 302 may encode the mobile service data, which are to be inserted to each region based upon the characteristic of each hierarchical region, at different coding rates. For example, the block processor 302 may encode the mobile service data, which are to be inserted in region A/B within the corresponding data group, at a coding rate of 1/2. Then, the group formatter 303 may insert the 1/2-rate encoded mobile service data to region A/B. Also, the block processor 302 may encode the mobile service data, which are to be inserted in region C/D within the corresponding data group, at a coding rate of 1/4 having higher (or stronger) error correction ability than the 1/2-coding rate. Thereafter, the group formatter 303 may insert the 1/2-rate encoded mobile service data to region C/D. In another example, the block processor 302 may encode the mobile service data, which are to be inserted in region C/D, at a coding rate having higher error correction ability than the 1/4-coding rate. Then, the group formatter 303 may either insert the encoded mobile service data to region C/D, as described above, or leave the data in a reserved region for future usage.

According to another embodiment of the present invention, the block processor 302 may perform a 1/H-rate encoding process in SCCC block units. Herein, the SCCC block includes at least one M/H block. At this point, when 1/H-rate encoding is performed in M/H block units, the M/H blocks (B1 to B10) and the SCCC block (SCB1 to SCB10) become identical to one another (i.e., SCB1=B1, SCB2=B2, SCB3=B3, SCB4=B4, SCB5=B5, SCB6=B6, SCB7=B7, SCB8=B8, SCB9=B9, and SCB10=B10). For example, the M/H block 1 (B1) may be encoded at the coding rate of 1/2, the M/H block 2 (B2) may be encoded at the coding rate of 1/4, and the M/H block 3 (B3) may be encoded at the coding rate of 1/2. The coding rates are applied respectively to the remaining M/H blocks.

Alternatively, a plurality of M/H blocks within regions A, B, C, and D may be grouped into one SCCC block, thereby being encoded at a coding rate of 1/H in SCCC block units. Accordingly, the receiving performance of region C/D may be enhanced. For example, M/H block 1 (B1) to M/H block 5 (B5) may be grouped into one SCCC block and then encoded at a coding rate of 1/2. Thereafter, the group formatter 303 may insert the 1/2-rate encoded mobile service data to a section starting from M/H block 1 (B1) to M/H block 5 (B5). Furthermore, M/H block 6 (B6) to M/H block 10 (B10) may be grouped into one SCCC block and then encoded at a coding rate of 1/4. Thereafter, the group formatter 303 may insert the 1/4-rate encoded mobile service data to another section starting from M/H block 6 (B6) to M/H block 10 (B10). In this case, one data group may consist of two SCCC blocks.

According to another embodiment of the present invention, one SCCC block may be formed by grouping two M/H blocks. For example, M/H block 1 (B1) and M/H block 6 (B6) may be grouped into one SCCC block (SCB1). Similarly, M/H block 2 (B2) and M/H block 7 (B7) may be grouped into another SCCC block (SCB2). Also, M/H block 3 (B3) and M/H block 8 (B8) may be grouped into another SCCC block (SCB3). And, M/H block 4 (B4) and M/H block 9 (B9) may be grouped into another SCCC block (SCB4). Furthermore, M/H block 5 (B5) and M/H block 10 (B10) may be grouped into another SCCC block (SCB5). In the above-described example, the data group may consist of 10 M/H blocks and 5 SCCC blocks. Accordingly, in a data (or signal) receiving environment undergoing frequent and severe channel changes, the receiving performance of regions C and D, which is relatively more deteriorated than the receiving performance of region A, may be reinforced. Furthermore, since the number of mobile service data symbols increases more and more from region A to region D, the error correction encoding performance becomes more and more deteriorated. Therefore, when grouping a plurality of M/H block to form one SCCC block, such deterioration in the error correction encoding performance may be reduced.

As described-above, when the block processor 302 performs encoding at a 1/H-coding rate, information associated with SCCC should be transmitted to the receiving system in order to accurately recover the mobile service data. Table 7 below shows an example of a SCCC block mode, which indicating the relation between an M/H block and an SCCC block, among diverse SCCC block information.

TABLE 7

| | SCCC Block Mode | | | |
|---|---|---|---|---|
| | 00 | 01 | 10 | 11 |
| | Description | | | |
| SCB | One M/H Block per SCCC Block SCB input, M/H Block | Two M/H Blocks per SCCC Block SCB input, M/H Blocks | Reserved | Reserved |
| SCB1 | B1 | B1 + B6 | | |
| SCB2 | B2 | B2 + B7 | | |
| SCB3 | B3 | B3 + B8 | | |
| SCB4 | B4 | B4 + B9 | | |
| SCB5 | B5 | B5 + B10 | | |
| SCB6 | B6 | — | | |
| SCB7 | B7 | — | | |
| SCB8 | B8 | — | | |
| SCB9 | B9 | — | | |
| SCB10 | B10 | — | | |

More specifically, Table 4 shows an example of 2 bits being allocated in order to indicate the SCCC block mode. For example, when the SCCC block mode value is equal to '00', this indicates that the SCCC block and the M/H block are identical to one another. Also, when the SCCC block mode value is equal to '01', this indicates that each SCCC block is configured of 2 M/H blocks.

As described above, if one data group is configured of 2 SCCC blocks, although it is not indicated in Table 7, this information may also be indicated as the SCCC block mode. For example, when the SCCC block mode value is equal to '10', this indicates that each SCCC block is configured of 5 M/H blocks and that one data group is configured of 2 SCCC blocks. Herein, the number of M/H blocks included in an SCCC block and the position of each M/H block may vary depending upon the settings made by the system designer. Therefore, the present invention will not be limited to the examples given herein. Accordingly, the SCCC mode information may also be expanded.

An example of a coding rate information of the SCCC block, i.e., SCCC outer code mode, is shown in Table 8 below.

TABLE 8

| SCCC outer code mode (2 bits) | Description |
|---|---|
| 00 | Outer code rate of SCCC block is ½ rate |
| 01 | Outer code rate of SCCC block is ¼ rate |
| 10 | Reserved |
| 11 | Reserved |

More specifically, Table 8 shows an example of 2 bits being allocated in order to indicate the coding rate information of the SCCC block. For example, when the SCCC outer code mode value is equal to '00', this indicates that the coding rate of the corresponding SCCC block is 1/2. And, when the SCCC outer code mode value is equal to '01', this indicates that the coding rate of the corresponding SCCC block is 1/4.

If the SCCC block mode value of Table 7 indicates '00', the SCCC outer code mode may indicate the coding rate of each M/H block with respect to each M/H block. In this case, since it is assumed that one data group includes 10 M/H blocks and that 2 bits are allocated for each SCCC block mode, a total of 20 bits are required for indicating the SCCC block modes of the 10 M/H modes. In another example, when the SCCC block mode value of Table 7 indicates '00', the SCCC outer code mode may indicate the coding rate of each region with respect to each region within the data group. In this case, since it is assumed that one data group includes 4 regions (i.e., regions A, B, C, and D) and that 2 bits are allocated for each SCCC block mode, a total of 8 bits are required for indicating the SCCC block modes of the 4 regions. In another example, when the SCCC block mode value of Table 7 is equal to '01', each of the regions A, B, C, and D within the data group has the same SCCC outer code mode.

Meanwhile, an example of an SCCC output block length (SOBL) for each SCCC block, when the SCCC block mode value is equal to '00', is shown in Table 9 below.

TABLE 9

| | | SIBL | |
|---|---|---|---|
| SCCC Block | SOBL | ½ rate | ¼ rate |
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

More specifically, when given the SCCC output block length (SOBL) for each SCCC block, an SCCC input block length (SIBL) for each corresponding SCCC block may be decided based upon the outer coding rate of each SCCC block. The SOBL is equivalent to the number of SCCC output (or outer-encoded) bytes for each SCCC block. And, the SIBL is equivalent to the number of SCCC input (or payload) bytes for each SCCC block. Table 10 below shows an example of the SOBL and SIBL for each SCCC block, when the SCCC block mode value is equal to '01'.

TABLE 10

| | | SIBL | |
|---|---|---|---|
| SCCC Block | SOBL | ½ rate | ¼ rate |
| SCB1 (B1 + B6) | 528 | 264 | 132 |
| SCB2 (B2 + B7) | 1536 | 768 | 384 |
| SCB3 (B3 + B8) | 2376 | 1188 | 594 |
| SCB4 (B4 + B9) | 2388 | 1194 | 597 |
| SCB5 (B5 + B10) | 2772 | 1386 | 693 |

Figure 28:
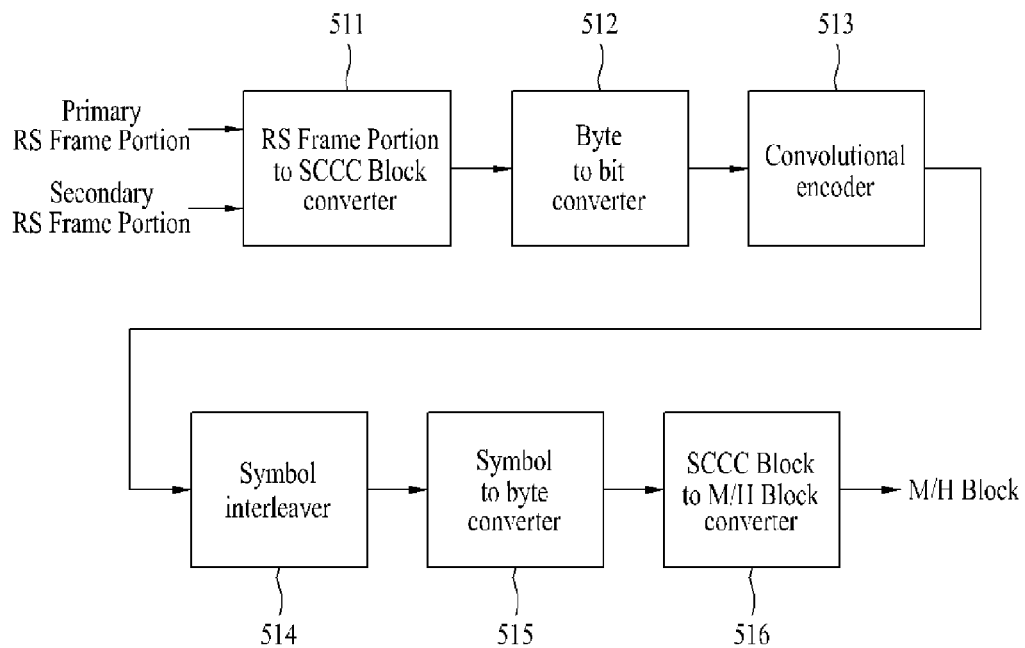
FIG. 28 illustrates a block diagram of a block processor according to an embodiment of the present invention.

In order to do so, as shown in FIG. 28, the block processor 302 includes a RS frame portion-SCCC block converter 511, a byte-bit converter 512, a convolution encoder 513, a symbol interleaver 514, a symbol-byte converter 515, and an SCCC block-M/H block converter 516. The convolutional encoder 513 and the symbol interleaver 514 are virtually concatenated with the trellis encoding module in the post-processor in order to configure an SCCC block. More specifically, the RS frame portion-SCCC block converter 511 divides the RS frame portions, which are being inputted, into multiple SCCC blocks using the SIBL of Table 9 and Table 10 based upon the RS code mode, SCCC block mode, and SCCC outer code mode. Herein, the M/H frame encoder 301 may output only primary RS frame portions or both primary RS frame portions and secondary RS frame portions in accordance with the RS frame mode.

When the RS Frame mode is set to '00', a portion of the primary RS Frame equal to the amount of data, which are to be SCCC outer encoded and mapped to 10 M/H blocks (B1 to B10) of a data group, will be provided to the block processor 302. When the SCCC block mode value is equal to '00', then the primary RS frame portion will be split into 10 SCCC Blocks according to Table 9. Alternatively, when the SCCC block mode value is equal to '01', then the primary RS frame will be split into 5 SCCC blocks according to Table 10.

When the RS frame mode value is equal to '01', then the block processor 302 may receive two RS frame portions. The RS frame mode value of '01' will not be used with the SCCC block mode value of '01'. The first portion from the primary RS frame will be SCCC-outer-encoded as SCCC Blocks SCB3, SCB4, SCB5, SCB6, SCB7, and SCB8 by the block processor 302. The SCCC Blocks SCB3 and SCB8 will be mapped to region B and the SCCC blocks SCB4, SCB5, SCB6, and SCB7 shall be mapped to region A by the group formatter 303. The second portion from the secondary RS frame will also be SCCC-outer-encoded, as SCB1, SCB2, SCB9, and SCB10, by the block processor 302. The group formatter 303 will map the SCCC blocks SCB1 and SCB10 to region D as the M/H blocks B1 and B10, respectively. Similarly, the SCCC blocks SCB2 and SCB9 will be mapped to region C as the M/H blocks B2 and B9.

The byte-bit converter 512 identifies the mobile service data bytes of each SCCC block outputted from the RS frame portion-SCCC block converter 511 as data bits, which are then outputted to the convolution encoder 513. The convolution encoder 513 performs one of 1/2-rate encoding and 1/4-rate encoding on the inputted mobile service data bits.

Figure 29:
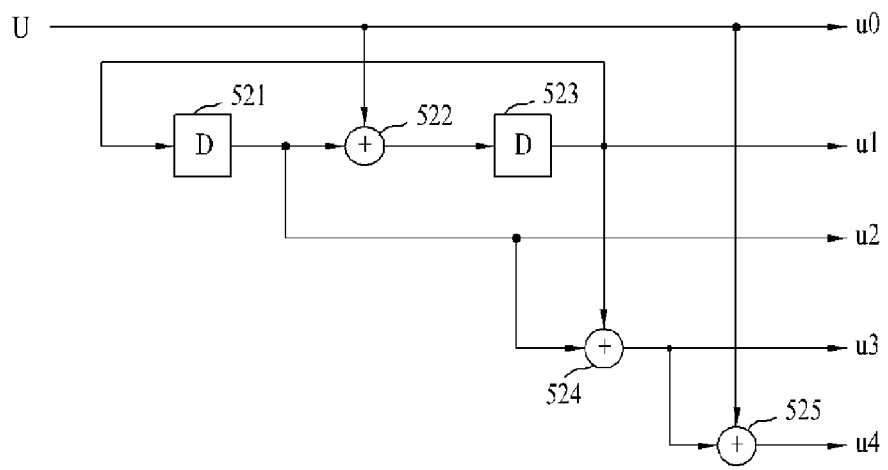
FIG. 29 illustrates a detailed block diagram of a convolution encoder of the block processor.

FIG. 29 illustrates a detailed block diagram of the convolution encoder 513. The convolution encoder 513 includes two delay units 521 and 523 and three adders 522, 524, and 525. Herein, the convolution encoder 513 encodes an input data bit U and outputs the coded bit U to 5 bits (u0 to u4). At this point, the input data bit U is directly outputted as uppermost bit u0 and simultaneously encoded as lower bit u1u2u3u4 and then outputted. More specifically, the input data bit U is directly outputted as the uppermost bit u0 and simultaneously outputted to the first and third adders 522 and 525.

The first adder 522 adds the input data bit U and the output bit of the first delay unit 521 and, then, outputs the added bit to the second delay unit 523. Then, the data bit delayed by a pre-determined time (e.g., by 1 clock) in the second delay unit 523 is outputted as a lower bit u1 and simultaneously fed-back to the first delay unit 521. The first delay unit 521 delays the data bit fed-back from the second delay unit 523 by a pre-determined time (e.g., by 1 clock). Then, the first delay unit 521 outputs the delayed data bit as a lower bit u2 and, at the same time, outputs the fed-back data to the first adder 522 and the second adder 524. The second adder 524 adds the data bits outputted from the first and second delay units 521 and 523 and outputs the added data bits as a lower bit u3. The third adder 525 adds the input data bit U and the output of the second delay unit 523 and outputs the added data bit as a lower bit u4.

At this point, the first and second delay units 521 and 523 are reset to '0', at the starting point of each SCCC block. The convolution encoder 513 of FIG. 29 may be used as a 1/2-rate encoder or a 1/4-rate encoder. More specifically, when a portion of the output bit of the convolution encoder 513, shown in FIG. 29, is selected and outputted, the convolution encoder 513 may be used as one of a 1/2-rate encoder and a 1/4-rate encoder. Table 11 below shown an example of output symbols of the convolution encoder 513.

TABLE 11

| Region | 1/2 rate | 1/4 rate SCCC block mode = '00' | 1/4 rate SCCC block mode = '01' |
|---|---|---|---|
| A, B | (u0, u1) | (u0, u2), (u1, u3) | (u0, u2), (u1, u4) |
| C, D |  | (u0, u1), (u3, u4) |  |

For example, at the 1/2-coding rate, 1 output symbol (i.e., u0 and u1 bits) may be selected and outputted. And, at the 1/4-coding rate, depending upon the SCCC block mode, 2 output symbols (i.e., 4 bits) may be selected and outputted. For example, when the SCCC block mode value is equal to '01', and when an output symbol configured of u0 and u2 and another output symbol configured of u1 and u4 are selected and outputted, a 1/4-rate coding result may be obtained.

The mobile service data encoded at the coding rate of 1/2 or 1/4 by the convolution encoder 513 are outputted to the symbol interleaver 514. The symbol interleaver 514 performs block interleaving, in symbol units, on the output data symbol of the convolution encoder 513. More specifically, the symbol interleaver 514 is a type of block interleaver. Any interleaver performing structural rearrangement (or realignment) may be applied as the symbol interleaver 514 of the block processor. However, in the present invention, a variable length symbol interleaver that can be applied even when a plurality of lengths is provided for the symbol, so that its order may be rearranged, may also be used.

FIG. 30 illustrates a symbol interleaver according to an embodiment of the present invention. Particularly, FIG. 30 illustrates an example of the symbol interleaver when B=2112 and L=4096. Herein, B indicates a block length in symbols that are outputted for symbol interleaving from the convolution encoder 513. And, L represents a block length in symbols that are actually interleaved by the symbol interleaver 514. At this point, the block length in symbols B inputted to the symbol interleaver 514 is equivalent to 4×SOBL. More specifically, since one symbol is configured of 2 bits, the value of B may be set to be equal to 4×SOBL.

In the present invention, when performing the symbol-intereleaving process, the conditions of $L=2^m$ (wherein m is an integer) and of $L \geq B$ should be satisfied. If there is a difference in value between B and L, (L−B) number of null (or dummy) symbols is added, thereby creating an interleaving pattern, as shown in P' (i) of FIG. 30. Therefore, B becomes a block size of the actual symbols that are inputted to the symbol interleaver 514 in order to be interleaved. L becomes an interleaving unit when the interleaving process is performed by an interleaving pattern created from the symbol interleaver 514.

Equation 6 shown below describes the process of sequentially receiving B number of symbols, the order of which is to be rearranged, and obtaining an L value satisfying the conditions of $L=2^m$ (wherein m is an integer) and of $L \geq B$, thereby creating the interleaving so as to realign (or rearrange) the symbol order.

Equation 6

In relation to all places, wherein $0 \leq i \leq B-1$, $$P'(i)=\{89 \times i \times (i+1)/2\} \bmod L$$

Herein, $L \geq B$, $L=2^m$, wherein m is an integer.

As shown in P'(i) of FIG. 30, the order of B number of input symbols and (L−B) number of null symbols is rearranged by using the above-mentioned Equation 6. Then, as shown in P(i) of FIG. 30, the null byte places are removed, so as to rearrange the order. Starting with the lowest value of i, the P(i) are shifted to the left in order to fill the empty entry locations. Thereafter, the symbols of the aligned interleaving pattern P(i) are outputted to the symbol-byte converter 515 in order. Herein, the symbol-byte converter 515 converts to bytes the mobile service data symbols, having the rearranging of the symbol order completed and then outputted in accordance with the rearranged order, and thereafter outputs the converted bytes to the SCCC block-M/H block converter 516. The SCCC block-M/H block converter 516 converts the symbol-interleaved SCCC blocks to M/H blocks, which are then outputted to the group formatter 303.

If the SCCC block mode value is equal to '00', the SCCC block is mapped at a one-to-one (1:1) correspondence with each M/H block within the data group. In another example, if the SCCC block mode value is equal to '01', each SCCC block is mapped with two M/H blocks within the data group. For example, the SCCC block SCB1 is mapped with (B1, B6), the SCCC block SCB2 is mapped with (B2, B7), the SCCC block SCB3 is mapped with (B3, B8), the SCCC block SCB4 is mapped with (B4, B9), and the SCCC block SCB5 is mapped with (B5, B10). The M/H block that is outputted from the SCCC block-M/H block converter 516 is configured of mobile service data and FEC redundancy. In the present invention, the mobile service data as well as the FEC redundancy of the M/H block will be collectively considered as mobile service data.

Group Formatter

The group formatter 303 inserts data of M/H blocks outputted from the block processor 302 to the corresponding M/H blocks within the data group, which is formed in accordance with a pre-defined rule. Also, in association with the data-deinterleaving process, the group formatter 303 inserts various place holders (or known data place holders) in the corresponding region within the data group. More specifically, apart from the encoded mobile service data outputted from the block processor 302, the group formatter 303 also inserts MPEG header place holders, non-systematic RS parity place holders, main service data place holders, which are associated with the data deinterleaving in a later process, as shown in FIG. 5.

Herein, the main service data place holders are inserted because the mobile service data bytes and the main service data bytes are alternately mixed with one another in regions B to D based upon the input of the data deinterleaver, as shown in FIG. 5. For example, based upon the data outputted after data deinterleaving, the place holder for the MPEG header may be allocated at the very beginning of each packet. Also, in order to configure an intended group format, dummy bytes may also be inserted. Furthermore, the group formatter 303 inserts initialization data (i.e., trellis initialization byte) of the trellis encoding module 256 in the corresponding regions. For example, the initialization data may be inserted in the beginning of the known data sequence. The initialization data is used for initializing memories within the trellis encoding module 256, and is not transmitted to the receiving system.

Additionally, the group formatter 303 may also insert signaling information, which are encoded and outputted from the signaling encoder 304, in corresponding regions within the data group. At this point, reference may be made to the signaling information when the group formatter 303 inserts each data type and respective place holders in the data group. The process of encoding the signaling information and inserting the encoded signaling information to the data group will be described in detail in a later process.

Figure 31:
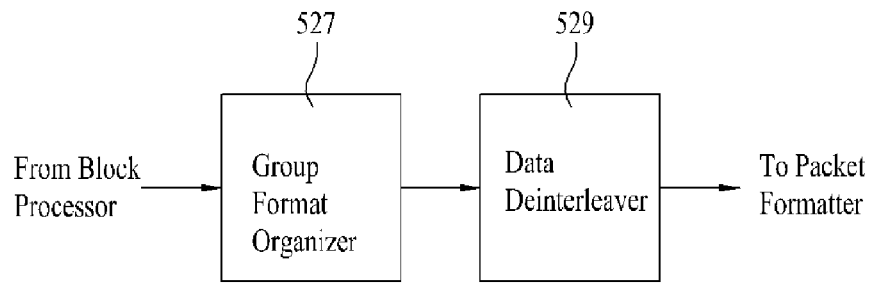
FIG. 31 illustrates a block diagram of a group formatter according to an embodiment of the present invention.

After inserting each data type and respective place holders in the data group, the group formatter 303 may deinterleave the data and respective place holders, which have been inserted in the data group, as an inverse process of the data interleaver, thereby outputting the deinterleaved data and respective place holders to the packet formatter 305. The group formatter 303 may include a group format organizer 527, and a data deinterleaver 529, as shown in FIG. 31. The group format organizer 527 inserts data and respective place holders in the corresponding regions within the data group, as described above. And, the data deinterleaver 529 deinterleaves the inserted data and respective place holders as an inverse process of the data interleaver.

The packet formatter 305 removes the main service data place holders and the RS parity place holders that were allocated for the deinterleaving process from the deinterleaved data being inputted. Then, the packet formatter 305 groups the remaining portion and inserts the 3-byte MPEG header place holder in an MPEG header having a null packet PID (or an unused PID from the main service data packet). Furthermore, the packet formatter 305 adds a synchronization data byte at the beginning of each 187-byte data packet. Also, when the group formatter 303 inserts known data place holders, the packet formatter 303 may insert actual known data in the known data place holders, or may directly output the known data place holders without any modification in order to make replacement insertion in a later process. Thereafter, the packet formatter 305 identifies the data within the packet-formatted data group, as described above, as a 188-byte unit mobile service data packet (i.e., MPEG TS packet), which is then provided to the packet multiplexer 240.

Based upon the control of the controller 201, the packet multiplexer 240 multiplexes the data group packet-formatted and outputted from the packet formatter 306 and the main service data packet outputted from the packet jitter mitigator 220. Then, the packet multiplexer 240 outputs the multiplexed data packets to the data randomizer 251 of the post-processor 250. More specifically, the controller 201 controls the time-multiplexing of the packet multiplexer 240. If the packet multiplexer 240 receives 118 mobile service data packets from the packet formatter 305, 37 mobile service data packets are placed before a place for inserting VSB field synchronization. Then, the remaining 81 mobile service data packets are placed after the place for inserting VSB field synchronization. The multiplexing method may be adjusted by diverse variables of the system design. The multiplexing method and multiplexing rule of the packet multiplexer 240 will be described in more detail in a later process.

Also, since a data group including mobile service data in-between the data bytes of the main service data is multiplexed (or allocated) during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet.

Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data in the object decoder is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. Additionally, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 into a burst structure in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252. On the other hand, if the inputted data correspond to the mobile service data packet, the data randomizer 251 may not perform a randomizing process on the mobile service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is inputted to the parity replacer 254 and to the non-systematic RS encoder 255.

Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded.

At this point, the beginning portion of the known data sequence that is received corresponds to the initialization data and not to the actual known data. Herein, the initialization data has been included in the data by the group formatter within the pre-processor 230 in an earlier process. Therefore, the process of replacing the initialization data with memory values within the trellis encoding module 256 are required to be performed immediately before the inputted known data sequence is trellis-encoded.

More specifically, the initialization data are replaced with the memory value within the trellis encoding module 256, thereby being inputted to the trellis encoding module 256. At this point, the memory value replacing the initialization data are process with (or calculated by) an exclusive OR (XOR) operation with the respective memory value within the trellis encoding module 256, so as to be inputted to the corresponding memory. Therefore, the corresponding memory is initialized to '0'. Additionally, a process of using the memory value replacing the initialization data to re-calculate the RS parity, so that the re-calculated RS parity value can replace the RS parity being outputted from the data interleaver 253, is also required.

Therefore, the non-systematic RS encoder 255 receives the mobile service data packet including the initialization data from the data interleaver 253 and also receives the memory value from the trellis encoding module 256.

Among the inputted mobile service data packet, the initialization data are replaced with the memory value, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data that are to be replaced, is inputted, the parity replacer 254 selects the data and RS parity that are outputted from the data interleaver 253. Then, the parity replacer 254 directly outputs the selected data to the trellis encoding module 256 without any modification. The trellis encoding module 256 converts the byte-unit data to symbol units and performs a 12-way interleaving process so as to trellis-encode the received data. Thereafter, the processed data are outputted to the synchronization multiplexer 260.

Figure 32:
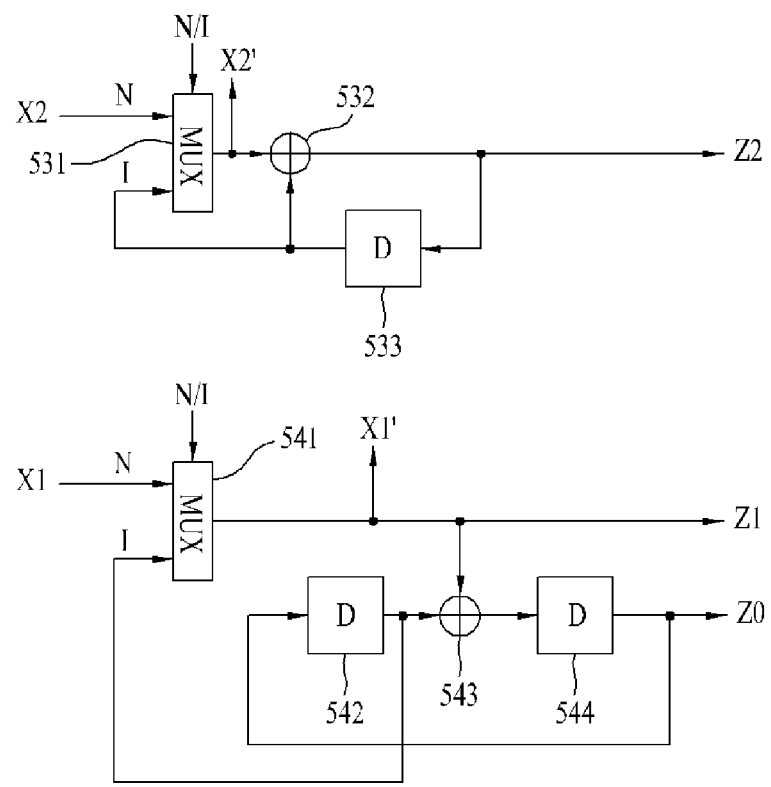
FIG. 32 illustrates a block diagram of a trellis encoder according to an embodiment of the present invention.

FIG. 32 illustrates a detailed diagram of one of 12 trellis encoders included in the trellis encoding module 256. Herein, the trellis encoder includes first and second multiplexers 531 and 541, first and second exclusive OR (XOR) gates 532 and 542, and first to third memories 533, 542, and 544.

More specifically, the first to third memories 533, 542, and 544 are initialized by the memory value instead of the initialization data from the parity replacer 254. More specifically, when the first symbol (i.e., two bits), which are converted from initialization data (i.e., each trellis initialization data byte), are inputted, the input bits of the trellis encoder will be replaced by the memory values of the trellis encoder, as shown in FIG. 32.

Since 2 symbols (i.e., 4 bits) are required for trellis initialization, the last 2 symbols (i.e., 4 bits) from the trellis initialization bytes are not used for trellis initialization and are considered as a symbol from a known data byte and processed accordingly.

When the trellis encoder is in the initialization mode, the input comes from an internal trellis status (or state) and not from the parity replacer 254. When the trellis encoder is in the normal mode, the input symbol (X2X1) provided from the parity replacer 254 will be processed. The trellis encoder provides the converted (or modified) input data for trellis initialization to the non-systematic RS encoder 255.

More specifically, when a selection signal designates a normal mode, the first multiplexer 531 selects an upper bit X2 of the input symbol. And, when a selection signal designates an initialization mode, the first multiplexer 531 selects the output of the first memory 533 and outputs the selected output data to the first XOR gate 532. The first XOR gate 532 performs XOR operation on the output of the first multiplexer 531 and the output of the first memory 533, thereby outputting the added result to the first memory 533 and, at the same time, as a most significant (or uppermost) bit Z2. The first memory 533 delays the output data of the first XOR gate 532 by 1 clock, thereby outputting the delayed data to the first multiplexer 531 and the first XOR gate 532.

Meanwhile, when a selection signal designates a normal mode, the second multiplexer 541 selects a lower bit X1 of the input symbol. And, when a selection signal designates an initialization mode, the second multiplexer 541 selects the output of the second memory 542, thereby outputting the selected result to the second XOR gate 543 and, at the same time, as a lower bit Z1. The second XOR gate 543 performs XOR operation on the output of the second multiplexer 541 and the output of the second memory 542, thereby outputting the added result to the third memory 544. The third memory 544 delays the output data of the second XOR gate 543 by 1 clock, thereby outputting the delayed data to the second memory 542 and, at the same time, as a least significant (or lowermost) bit Z0. The second memory 542 delays the output data of the third memory 544 by 1 clock, thereby outputting the delayed data to the second XOR gate 543 and the second multiplexer 541.

The select signal designates an initialization mode during the first two symbols that are converted from the initialization data.

For example, when the select signal designates an initialization mode, the first XOR gate 532 performs an XOR operation on the value of the first memory 533, which is provided through the first multiplexer 531, and on a memory value that is directly provided from the first memory 533. That is, the first XOR gate 532 performs an XOR operation on 2 bits having the same value. Generally, when only one of the two bits belonging to the operand is '1', the result of the XOR gate is equal to '1'. Otherwise, the result of the XOR gate becomes equal to '0'. Therefore, when the value of the first memory 533 is processed with an XOR operation, the result is always equal to '0'. Furthermore, since the output of the first XOR gate 532, i.e., '0', is inputted to the first memory 533, the first memory 533 is initialized to '0'.

Similarly, when the select signal designates an initialization mode, the second XOR gate 543 performs an XOR operation on the value of the second memory 542, which is provided through the second multiplexer 541, and on a memory value that is directly provided from the second memory 542. Therefore, the output of the second XOR gate 543 is also always equal to '0'. Since the output of the second XOR gate 543, i.e., '0', is inputted to the third memory 544, the third memory 544 is also initialized to '0'. The output of the third memory 544 is inputted to the second memory 542 in the next clock, thereby initializing the second memory 542 to '0'. In this case also, the select signal designates the initialization mode.

More specifically, when the first symbol being converted from the initialization data byte replaces the values of the first memory 533 and the second memory 542, thereby being inputted to the trellis encoder, each of the first and third memories 533 and 544 within the trellis encoder is initialized to '00'. Following the process, when the second symbol being converted from the initialization data byte replaces the values of the first memory 533 and the second memory 542, thereby being inputted to the trellis encoder, each of the first, second, and third memories 533, 542, and 544 within the trellis encoder is initialized to '000'.

As described above, 2 symbols are required to initialize the memory of the trellis encoder. At this point, while the select signal designates an initialization mode, the output bits (X2'X1') of the first and second memories 533 and 542 are inputted to the non-systematic RS encoder 255, so as to perform a new RS parity calculation process.

The synchronization multiplexer 260 inserts a field synchronization signal and a segment synchronization signal to the data outputted from the trellis encoding module 256 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Multiplexing Method of Packet Multiplexer

Data of the error correction encoded and 1/H-rate encoded primary RS frame (i.e., when the RS frame mode value is equal to '00') or primary/secondary RS frame (i.e., when the RS frame mode value is equal to '01'), are divided into a plurality of data groups by the group formatter 303. Then, the divided data portions are assigned to at least one of regions A to D of each data group or to an M/H block among the M/H blocks B1 to B10, thereby being deinterleaved. Then, the deinterleaved data group passes through the packet formatter 305, thereby being multiplexed with the main service data by the packet multiplexer 240 based upon a de-decided multiplexing rule. The packet multiplexer 240 multiplexes a plurality of consecutive data groups, so that the data groups are assigned to be spaced as far apart from one another as possible within the sub-frame. For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively.

As described-above, in the assignment of the plurality of consecutive data groups, a plurality of parades are multiplexed and outputted so as to be spaced as far apart from one another as possible within a sub-frame. For example, the method of assigning data groups and the method of assigning parades may be identically applied to all sub-frames for each M/H frame or differently applied to each M/H frame.

FIG. 10 illustrates an example of a plurality of data groups included in a single parade, wherein the number of data groups included in a sub-frame is equal to '3', and wherein the data groups are assigned to an M/H frame by the packet multiplexer 240. Referring to FIG. 10, 3 data groups are sequentially assigned to a sub-frame at a cycle period of 4 slots. Accordingly, when this process is equally performed in the 5 sub-frames included in the corresponding M/H frame, 15 data groups are assigned to a single M/H frame. Herein, the 15 data groups correspond to data groups included in a parade.

When data groups of a parade are assigned as shown in FIG. 10, the packet multiplexer 240 may either assign main service data to each data group, or assign data groups corresponding to different parades between each data group. More specifically, the packet multiplexer 240 may assign data groups corresponding to multiple parades to one M/H frame. Basically, the method of assigning data groups corresponding to multiple parades is very similar to the method of assigning data groups corresponding to a single parade. In other words, the packet multiplexer 240 may assign data groups included in other parades to an M/H frame according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 10, data groups corresponding to the next parade may be assigned to a sub-frame starting either from the $12^{th}$ slot of a sub-frame.

FIG. 11 illustrates an example of assigning and transmitting 3 parades (Parade #0, Parade #1, and Parade #2) to an M/H frame. For example, when the $1^{st}$ parade (Parade #0) includes 3 data groups for each sub-frame, the packet multiplexer 240 may obtain the positions of each data groups within the sub-frames by substituting values '0' to '2' for i in Equation 1. More specifically, the data groups of the $1^{st}$, $5^{th}$, parade (Parade #0) are sequentially assigned to the $1^{st}$, and $9^{th}$ slots (Slot #0, Slot #4, and Slot #8) within the sub-frame. Also, when the $2^{nd}$ parade includes 2 data groups for each sub-frame, the packet multiplexer 240 may obtain the positions of each data groups within the sub-frames by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame. Finally, when the $3^{rd}$ parade includes 2 data groups for each sub-frame, the packet multiplexer 240 may obtain the positions of each data groups within the sub-frames by substituting values '5' and '6' for i in Equation 1. More specifically, the data groups of the $3^{rd}$ parade (Parade #2) are sequentially assigned and outputted to the $7^{th}$ and $11^{th}$ slots (Slot #6 and Slot #10) within the sub-frame.

As described above, the packet multiplexer 240 may multiplex and output data groups of multiple parades to a single M/H frame, and, in each sub-frame, the multiplexing process of the data groups may be performed serially with a group space of 4 slots from left to right. Therefore, a number of groups of one parade per sub-frame (NOG) may correspond to any one integer from '1' to '8'. Herein, since one M/H frame includes 5 sub-frames, the total number of data groups within a parade that can be allocated to an M/H frame may correspond to any one multiple of '5' ranging from '5' to '40'.

Signaling Information Encoding

Figure 33:
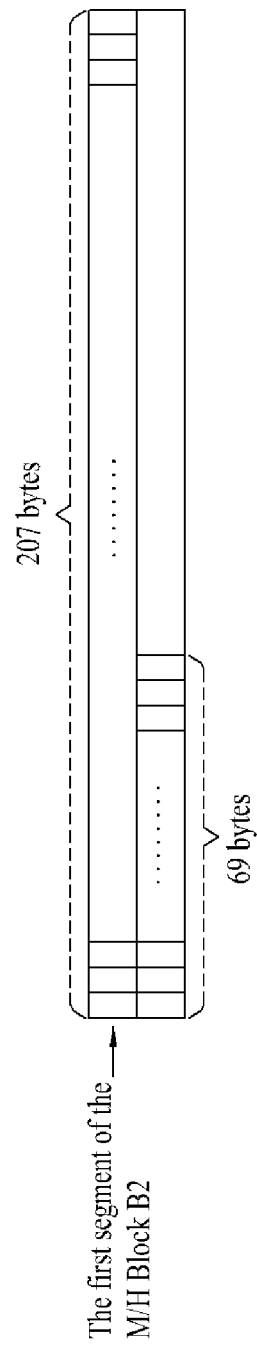
FIG. 33 illustrates an example of assigning signaling information area according to an embodiment of the present invention.

The present invention assigns signaling information areas for inserting signaling information to some areas within each data group. FIG. 33 illustrates an example of assigning signaling information areas for inserting signaling information starting from the $1^{st}$ segment of the $4^{th}$ M/H block (B4) to a portion of the $2^{nd}$ segment. More specifically, 276 (=207+69) bytes of the $4^{th}$ M/H block (B4) in each data group are assigned as the signaling information area. In other words, the signaling information area consists of 207 bytes of the $1^{st}$ segment and the first 69 bytes of the $2^{nd}$ segment of the $4^{th}$ M/H block (B4). For example, the $1^{st}$ segment of the $4^{th}$ M/H block (B4) corresponds to the $17^{th}$ or $173^{rd}$ segment of a VSB field.

Figure 41:
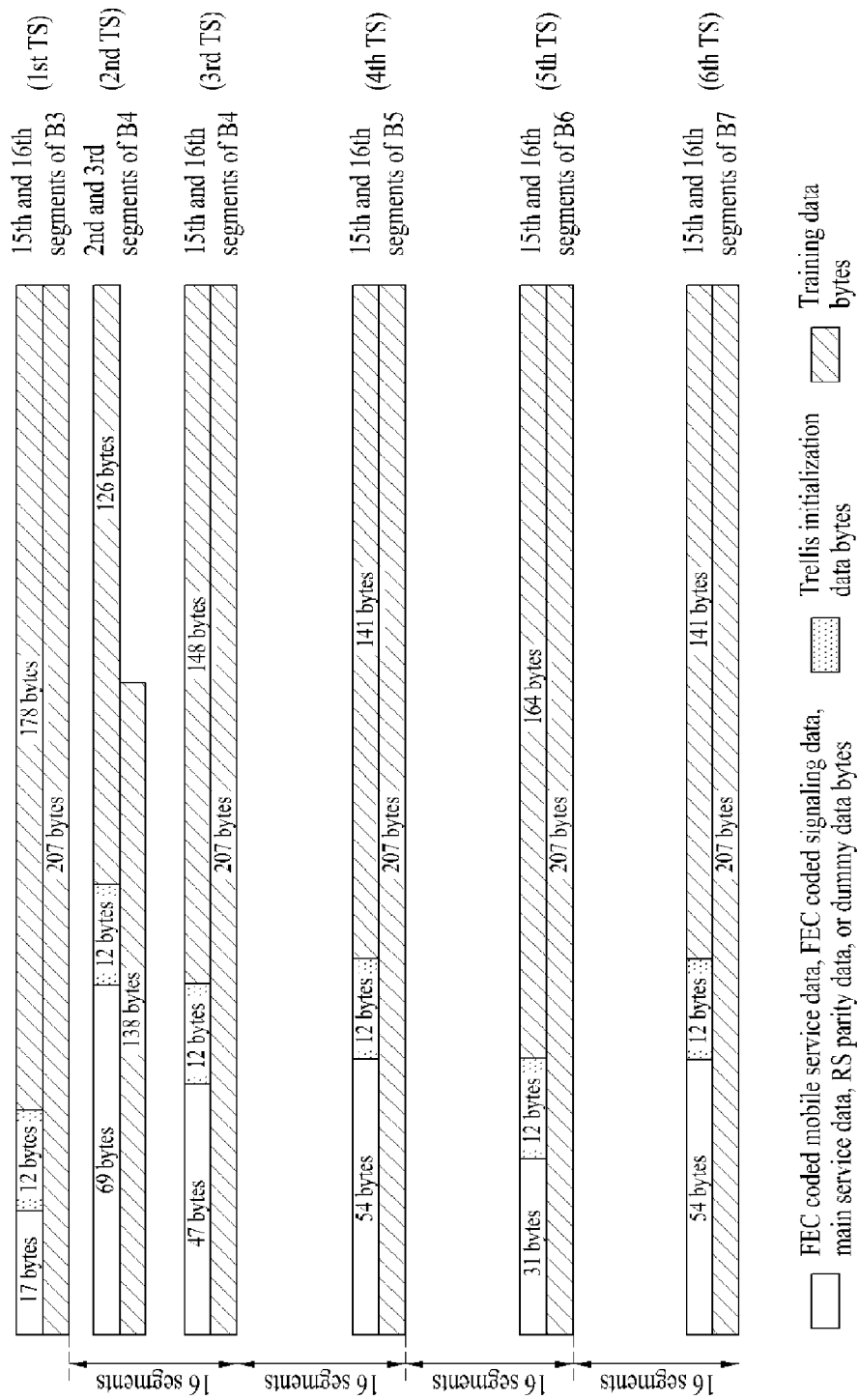
FIG. 41 illustrates an example of a training sequence at the byte level before trellis encoding according to the present invention.
Figure 42:
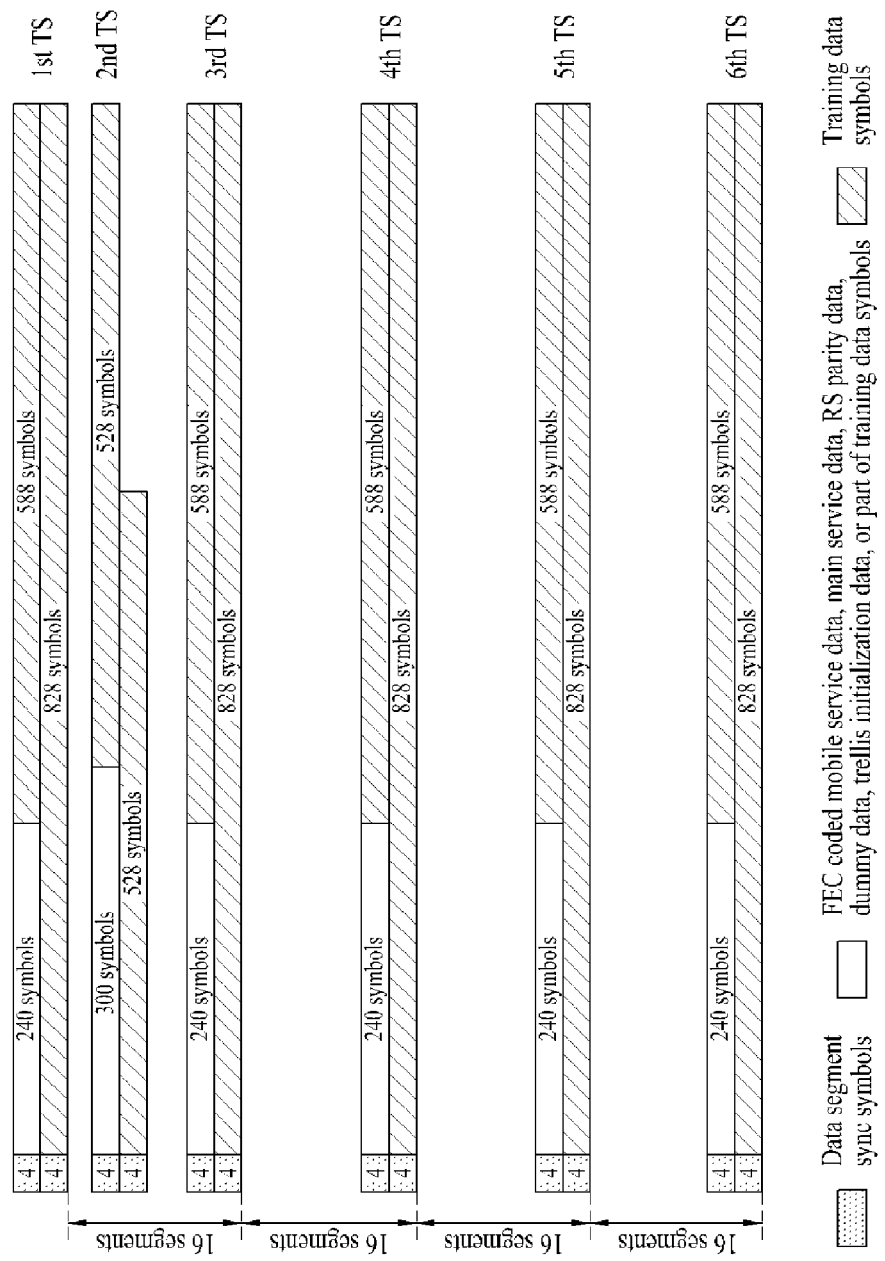
FIG. 42 illustrates an example of a training sequence at the symbol level after trellis encoding according to the present invention.

For example, when the data group includes 6 known data sequences, as shown in FIG. 41 and FIG. 42, the signaling information area is located between the first known data sequence and the second known data sequence. More specifically, the first known data sequence is inserted in the last 2 segments of the $3^{rd}$ M/H block (B3), and the second known data sequence in inserted in the $2^{nd}$ and $3^{rd}$ segments of the $4^{th}$ M/H block (B4). Furthermore, the $3^{rd}$ to $6^{th}$ known data sequences are respectively inserted in the last 2 segments of each of the $4^{th}$, $5^{th}$, $6^{th}$, and $7^{th}$ M/H blocks (B4, B5, B6, and B7). The $1^{st}$ and $3^{rd}$ to $6^{th}$ known data sequences are spaced apart by 16 segments.

The signaling information that is to be inserted in the signaling information area is FEC-encoded by the signaling encoder 304, thereby inputted to the group formatter 303. The signaling information may include a transmission parameter which is included in the payload region of an OM packet, and then received to the demultiplexer 210.

The group formatter 303 inserts the signaling information, which is FEC-encoded and outputted by the signaling encoder 304, in the signaling information area within the data group. Herein, the signaling information may be identified by two different types of signaling channels: a transmission parameter channel (TPC) and a fast information channel (FIC).

Herein, the TPC data corresponds to signaling information including transmission parameters, such as RS frame information, RS encoding information, FIC information, data group information, SCCC information, and M/H frame information and so on. However, the TPC data presented herein is merely exemplary. And, since the adding or deleting of signaling information included in the TPC may be easily adjusted and modified by one skilled in the art, the present invention will, therefore, not be limited to the examples set forth herein.

Furthermore, the FIC data is provided to enable a fast service acquisition of data receivers, and the FIC data includes cross layer information between the physical layer and the upper layer(s).

Figure 34:
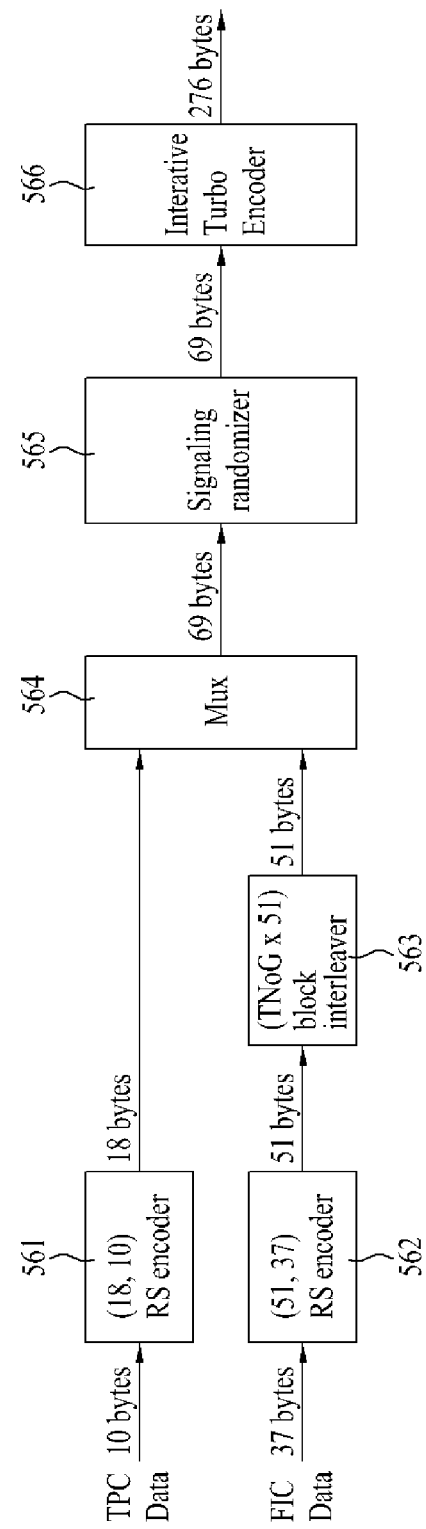
FIG. 34 illustrates a detailed block diagram of a signaling encoder according to the present invention.

FIG. 34 illustrates a detailed block diagram of the signaling encoder 304 according to the present invention. Referring to FIG. 34, the signaling encoder 304 includes a TPC encoder 561, an FIC encoder 562, a block interleaver 563, a multiplexer 564, a signaling randomizer 565, and an iterative turbo encoder 566.

The TPC encoder 561 receives 10-bytes of TPC data and performs (18,10)-RS encoding on the 10-bytes of TPC data, thereby adding 8 bytes of RS parity data to the 10 bytes of TPC data. The 18 bytes of RS-encoded TPC data are outputted to the multiplexer 564.

The FIC encoder 562 receives 37-bytes of FIC data and performs (51,37)-RS encoding on the 37-bytes of FIC data, thereby adding 14 bytes of RS parity data to the 37 bytes of FIC data. Thereafter, the 51 bytes of RS-encoded FIC data are inputted to the block interleaver 563, thereby being interleaved in predetermined block units. Herein, the block interleaver 563 corresponds to a variable length block interleaver. The block interleaver 563 interleaves the FIC data within each sub-frame in TNoG(column)×51(row) block units and then outputs the interleaved data to the multiplexer 564. Herein, the TNoG corresponds to the total number of data groups being assigned to a sub-frame. The block interleaver 563 is synchronized with the first set of FIC data in each sub-frame.

The block interleaver 563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565. The signaling randomizer 565 randomizes the multiplexed data and outputs the randomized data to the iterative turbo encoder 566. The signaling randomizer 565 may use the same generator polynomial of the randomizer used for mobile service data. Also, initialization occurs in each data group.

The iterative turbo encoder 566 corresponds to an inner encoder performing iterative turbo encoding in a PCCC method on the randomized data (i.e., signaling information data).

For example, if the iterative turbo encoder 566 performs encoding of data at a coding rate of 1/4, 69 bytes applied to the iterative turbo encoder 566 are extended to 276 bytes by the iterative turbo-encoding process, such that the iterative turbo encoder 566 outputs the resultant 276 bytes. The 276 bytes generated from the iterative turbo encoder 566 are transferred to the group formatter 303, such that they are inserted into a signaling information area of a corresponding data group.

Figure 35:
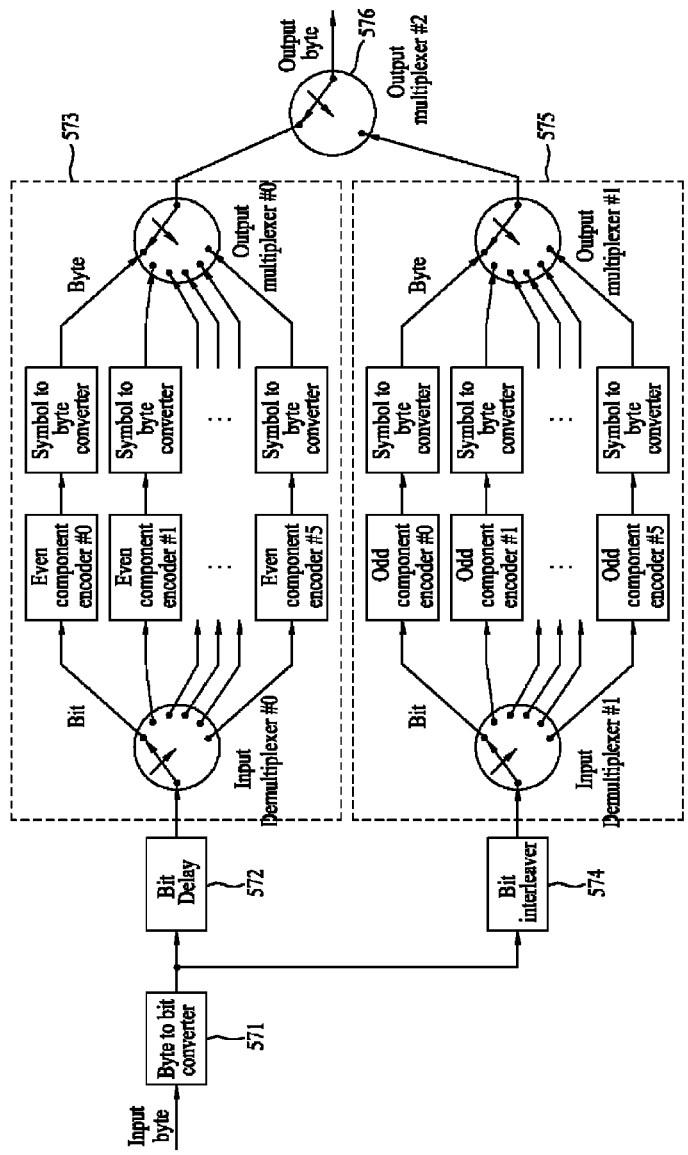
FIG. 35 illustrates a detail block diagram of an iterative turbo encoder according to an embodiment of the present invention.

FIG. 35 is a detailed block diagram illustrating the iterative turbo encoder 566 according to one embodiment of the present invention. The iterative turbo encoder 566 shown in FIG. 35 is used as a PCCC encoder having a coding rate of 1/4 (i.e., a 1/4-coding-rate PCCC encoder), which performs iterative turbo encoding on input data of one bit (i.e., 1-bit input data) using the PCCC scheme so as to convert the 1-bit input data into 4-bit output data.

The iterative turbo encoder 566 includes 6 identical even component encoders and 6 identical odd component encoders. In other words, the iterative turbo encoder 566 includes 6-way even component encoders and 6-way odd component encoders.

Referring to FIG. 35, the iterative turbo encoder 566 includes a byte-to-bit converter 571, a bit delay 572, an even encoder 573, a bit interleaver 574, an odd encoder 575, and a multiplexer 576.

The even encoder 573 includes a demultiplexer, 6 even component encoders, 6 odd symbol-to-byte converters, and a multiplexer. In this case, the demultiplexer performs switching of input bits such that it outputs the switched input bits to any one of 6 branches (or 6 paths). The 6 even component encoders are connected to 6 branches (or 6 paths) of the demultiplexer, respectively. The 6 symbol-to-byte converters are connected to the 6 even component encoders, respectively. The multiplexer temporally multiplexes output data of the 6 symbol-to-byte converters.

The odd encoder 575 includes a demultiplexer, 6 odd component encoders, 6 symbol-to-byte converters, and a multiplexer. In this case, the demultiplexer performs switching of input bits such that it outputs the switched input bits to any one of 6 branches (or 6 paths). The 6 odd component encoders are connected to 6 branches (or 6 paths) of the demultiplexer, respectively. The 6 symbol-to-byte converters are connected to the 6 odd component encoders, respectively. The multiplexer temporally multiplexes output data of the 6 symbol-to-byte converters. In this case, the coding rate of each component encoder contained in each of the even encoder 573 and the odd encoder 575 is set to 1/H1 (where H1≥1). For convenience of description and better understanding of the present invention, H1 is set to 2 in this embodiment of the present invention.

In other words, output data bits generated from the byte-to-bit converter 571 are simultaneously input to the even encoder 573 and the odd encoder 575, and each component encoder contained in each of the even encoder 573 and the odd encoder 575 has a coding rate of 1/2, so that an overall coding rate of the PCCC encoder shown in FIG. 35 is set to 1/4.

The byte-to-bit converter 571 classifies an input data byte into data bits, and outputs the data bits to the bit delay 572 and the bit interleaver 574. For example, 8 bits contained in one byte are sequentially output from a most significant bit (MSB). The bit delay 572 delays input data bits, and outputs the delayed data bits to the even encoder 573. The bit interleaver 574 performs interleaving of input data bits in units of a predetermined PCCC block, and outputs the interleaved input data bits to the odd encoder 575. In accordance with one embodiment of the present invention, a length of the PCCC block of the bit interleaver 574 is equal to the length of 552 bits (=69×8), and an interleaving rule of the bit interleaver 574 conforms to the interleaving rule of the symbol interleaver of a block processor.

The bit delay 572 delays input data bits by 552 bits so that the delayed input data bits can be matched with the delay of 552 bits in the bit interleaver 574. As a result, the bit delay 572 delays input data bits by 552 bits, and outputs the delayed result to the even encoder 573.

The same data bits are bit-interleaved and then encoded by the odd encoder 575, whereas the data bits generated from the byte-to-bit converter 571 are directly encoded by the even encoder 573. Thus, the 6-way even component encoders are parallel-concatenated with the 6-way odd component encoders as a result of the action of the bit interleaver 574.

The demultiplexer of the even encoder 573 outputs the delayed data bits by the bit delay 572 to any one of the 6 even component encoders. The even component encoder being received data bit through the demultiplexer encodes the received data bit at a coding rate of 1/2, such that they(i.e., 2 output data bits) output the encoded result to a corresponding symbol-to-byte converter. That is, the even component encoder encodes one bit (1 bit) into 2 bits and outputs the 2 bits, such that an output unit of the even component encoder is considered to be a symbol. In other words, one symbol is configured of 2 bits. The symbol-to-byte converter collects input symbols, constructs a byte composed of the collected input symbols, and outputs the constructed byte to the multiplexer. That is, the symbol-to-byte converter collects four symbols generated from the even component encoder, such that it constructs the byte composed of the collected four symbols. The multiplexer outputs the data byte generated from the symbol-to-byte converter to the multiplexer 576.

That is, the multiplexer contained in the even encoder 573 is used as a (6×1) multiplexer, such that it selects one of output signals of the 6 even component encoders and outputs the selected output signal to the multiplexer 576.

The demultiplexer of the odd encoder 575 receives the interleaved data bits from the bit interleaver 574, and outputs the received data bits to any one of the 6 odd component encoders. The odd component encoder being received data bits through the demultiplexer encodes the received data bit at a coding rate of 1/2, and outputs the encoded result to a corresponding symbol-to-byte converter. In other words, the odd component encoder encodes a single bit into 2 bits and outputs the 2 bits, such that an output unit of the odd component encoder is considered to be a symbol. That is, a single symbol is composed of 2 bits. The symbol-to-byte converter collects input symbols, constructs a byte composed of the collected input symbols, and outputs the constructed byte to the multiplexer. The multiplexer outputs the byte generated from the symbol-to-byte converter to the multiplexer 576. That is, the multiplexer contained in the odd encoder 575 is used as a (6×1) multiplexer, such that it selects one of the output signals of the 6 odd component encoders and outputs the selected output signal to the multiplexer 576.

The multiplexer 576 is used as a (2×1) multiplexer, selects either of the output data of the even encoder 573 and the other output data of the odd encoder 575, and outputs the selected output data to the group formatter 303. In other words, the multiplexer 576 alternately selects the output data of the even encoder 573 and the other output data of the odd encoder 575, and outputs the selected result to the group formatter 303.

In this case, the PCCC encoder shown in FIG. 35 is virtually parallel-concatenated with a trellis encoder of the trellis encoding module 256 according to a parallel turbo-code scheme, such that it forms a parallel turbo code. Indeed, although the transmission system includes a plurality of blocks between the signaling encoder 304 and the trellis encoding module 256, the receiving system considers two blocks to be concatenated with each other, and decodes the plurality of blocks in consideration of the above two blocks concatenated with each other.

Therefore, output bytes of each component encoder contained in the iterative turbo encoder 566 are transmitted to each of 12 trellis encoders contained in the trellis encoding module. For example, output bytes of the sixth even component encoder of the even encoder 573 may be arranged to be input to the sixth trellis encoder of the trellis encoding module. That is, each component encoder is paired with a specific trellis encoder from among 12 trellis encoders contained in the trellis encoding module. In addition, the demultiplexer and the multiplexer contained in the even encoder 573 and the odd encoder 575, and the multiplexer 576 are each used to map an output byte of each component encoder to a corresponding trellis encoder of the trellis encoding module 256.

Detailed structures of the even component encoder may be equal to or different from those of the odd component encoder. For convenience of description and better understanding of the present invention, it is assumed that detailed structures of the even component encoder may be different from those of the odd component encoder.

FIG. 36(a) is a detailed block diagram illustrating the even component encoder according to an embodiment of the present invention. FIG. 36(b) is a detailed block diagram illustrating the odd component encoder according to an embodiment of the present invention.

The even component encoder shown in FIG. 36(a) includes two adders 581 and 582 and two memories 583 and 584, such that it encodes an input bit 'x' and outputs the encoded result as 2 bits 'X2' and 'X1'.

In other words, the adder 581 adds the input bit 'x' and output data of the memory 583, and outputs the added result as a high-order bit 'X2'.

In addition, the adder 582 adds the input bit 'x' and output data of the memory 584, and outputs the added result to the memory 583. The memory 583 delays output data of the adder 582 by a predetermined time (e.g., one clock), and outputs the delayed result to the adder 581 and the memory 584. The memory 584 delays output data of the memory 583 by a predetermined time (e.g., one clock), and outputs the delayed result to the adder 581 and at the same time outputs the same delayed result as a low-order bit 'X1'.

The odd component encoder shown in FIG. 36(b) includes three adders 581, 582, and 585 and two memories 583 and 584, such that it encodes an input bit 'x' and outputs the encoded result as 2 bits X2 and X1.

In other words, the adder 581 adds the input bit 'x' and output data of the memory 583, and outputs the added result as a high-order bit 'X2'.

In addition, the adder 582 adds the input bit 'x' and output data of the memory 584, and outputs the added result to the memory 583. The memory 583 delays output data of the adder 582 by a predetermined time (e.g., one clock), and outputs the delayed result to the adder 581 and the memory 584. The memory 584 delays output data of the memory 583 by a predetermined time (e.g., one clock), and outputs the delayed result to the adder 581 and the other adder 585. The adder 585 adds the output data of the memory 583 and the output data of the memory 584, and outputs the added result as a low-order bit 'X1'.

FIG. 37(a) illustrates an exemplary case in which a trellis encoder is serially concatenated with the even component encoder shown in FIG. 36(a).

In fact, although a plurality of blocks are located between the even component encoder and the trellis encoder, the receiving system considers two blocks to be concatenated with each other, so that it decodes data. In other words, the trellis encoder performs pre-coding on the high-order bit 'X2' generated from the even component encoder of FIG. 36(a), and outputs the pre-coded result as a most significant bit 'Z2'. In addition, the trellis encoder performs trellis-encoding on the low-order bit 'X1', so that it outputs the trellis-encoded result as two output bits Z1 and Z0.

FIG. 37(b) illustrates an exemplary case in which a trellis encoder is serially concatenated with the odd component encoder shown in FIG. 36(b).

In fact, although a plurality of blocks are located between the even component encoder and the trellis encoder, the receiving system considers two blocks to be concatenated with each other, so that it decodes data. The trellis encoder performs pre-coding on the high-order bit 'X2' generated from the odd component encoder of FIG. 36(b), and outputs the pre-coded result as a most significant bit 'Z2'. In addition, the trellis encoder performs trellis-encoding on the low-order bit 'X1', so that it outputs the trellis-encoded result as two output bits Z1 and Z0.

FIG. 38 illustrates an example of a syntax structure of TPC data being inputted to the TPC encoder 561. The TPC data are inserted in the signaling information area of each data group and then transmitted. The TPC data may include a sub-frame_number field, a slot_number field, a parade_id field, a starting_group_number (SGN) field, a number_of_groups (NoG) field, a parade_repetition_cycle (PRC) field, an RS_frame_mode field, an RS_code_mode_primary field, an RS_code_mode_secondary field, an SCCC_block_mode field, an SCCC_outer_code_mode_A field, an SCCC_outer_code_mode_B field, an SCCC_outer_code_mode_C field, an SCCC_outer_code_mode_D field, an FIC_version_field, a parade_continuity_counter field, and a TNoG field.

The Sub-Frame_number field corresponds to the current Sub-Frame number within the M/H frame, which is transmitted for M/H frame synchronization. The value of the Sub-Frame_number field may range from 0 to 4. The Slot_number field indicates the current slot number within the sub-frame, which is transmitted for M/H frame synchronization. Also, the value of the Sub-Frame_number field may range from 0 to 15. The Parade_id field identifies the parade to which this group belongs. The value of this field may be any 7-bit value. Each parade in a M/H transmission shall have a unique Parade_id field.

Communication of the Parade_id between the physical layer and the management layer may be performed by means of an Ensemble_id field formed by adding one bit to the left of the Parade_id field. If the Ensemble_id field is used for the primary Ensemble delivered through this parade, the added MSB shall be equal to '0'. Otherwise, if the Ensemble_id field is used for the secondary ensemble, the added MSB shall be equal to '1'. Assignment of the Parade_id field values may occur at a convenient level of the system, usually in the management layer. The starting_group_number (SGN) field shall be the first Slot_number for a parade to which this group belongs, as determined by Equation 1 (i.e., after the Slot numbers for all preceding parades have been calculated). The SGN and NoG shall be used according to Equation 1 to obtain the slot numbers to be allocated to a parade within the sub-frame.

The number_of_Groups (NoG) field shall be the number of groups in a sub-frame assigned to the parade to which this group belongs, minus 1, e.g., NoG=0 implies that one group is allocated (or assigned) to this parade in a sub-frame. The value of NoG may range from 0 to 7. This limits the amount of data that a parade may take from the main (legacy) service data, and consequently the maximum data that can be carried by one parade. The slot numbers assigned to the corresponding Parade can be calculated from SGN and NoG, using Equation 1. By taking each parade in sequence, the specific slots for each parade will be determined, and consequently the SGN for each succeeding parade. For example, if for a specific parade SGN=3 and NoG=3 (010b for 3-bit field of NoG), substituting i=3, 4, and 5 in Equation 1 provides slot numbers 12, 2, and 6.

The Parade_repetition_cycle (PRC) field corresponds to the cycle time over which the parade is transmitted, minus 1, specified in units of M/H frames, as described in Table 12.

TABLE 12

| PRC | Description |
| --- | --- |
| 000 | This parade shall be transmitted once every M/H frame. |
| 001 | This parade shall be transmitted once every 2 M/H frames. |
| 010 | This parade shall be transmitted once every 3 M/H frames. |
| 011 | This parade shall be transmitted once every 4 M/H frames. |
| 100 | This parade shall be transmitted once every 5 M/H frames. |
| 101 | This parade shall be transmitted once every 6 M/H frames. |

TABLE 12-continued

| PRC | Description |
| --- | --- |
| 110 | This parade shall be transmitted once every 7 M/H frames. |
| 111 | Reserved |

For example, if PRC field value is equal to '001', this indicates that the parade shall be transmitted once every 2 M/H frame.

The RS_Frame_mode field shall be as defined in Table 1. The RS_Frame_mode field represents that one parade transmits one RS frame or two RS frames.

The RS_code_mode_primary field shall be the RS code mode for the primary RS frame. Herein, the RS_code_mode_primary field is defined in Table 6.

The RS_code_mode_secondary field shall be the RS code mode for the secondary RS frame. Herein, the RS_code_mode_secondary field is defined in Table 6.

The SCCC_Block_mode field represents how M/H blocks within a data group are assigned to SCCC block. The SCCC_Block_mode field shall be as defined in Table 7.

The SCCC_outer_code_mode_A field corresponds to the SCCC outer code mode for Region A within a data group. The SCCC outer code mode is defined in Table 8.

The SCCC_outer_code_mode_B field corresponds to the SCCC outer code mode for Region B within the data group. The SCCC_outer_code_mode_C field corresponds be the SCCC outer code mode for Region C within the data group. And, the SCCC_outer_code_mode_D field corresponds to the SCCC outer code mode for Region D within the data group.

The FIC_version field represents a version of FIC data.

The Parade_continuity_counter field counter may increase from 0 to 15 and then repeat its cycle. This counter shall increment by 1 every (PRC+1) M/H frames. For example, as shown in Table 12, PRC=011 (decimal 3) implies that Parade_continuity_counter increases every fourth M/H frame.

The TNoG field may be identical for all sub-frames in an M/H Frame.

However, the information included in the TPC data presented herein is merely exemplary. And, since the adding or deleting of information included in the TPC may be easily adjusted and modified by one skilled in the art, the present invention will, therefore, not be limited to the examples set forth herein.

Since the TPC data (excluding the Sub-Frame_number field and the Slot_number field) for each parade do not change their values during an M/H frame, the same information is repeatedly transmitted through all M/H groups belonging to the corresponding parade during an M/H frame. This allows very robust and reliable reception of the TPC data. Because the Sub-Frame_number and the Slot_number are increasing counter values, they also are robust due to the transmission of regularly expected values.

Furthermore, the FIC data is provided to enable a fast service acquisition of data receivers, and the FIC information includes cross layer information between the physical layer and the upper layer(s).

Figure 39:
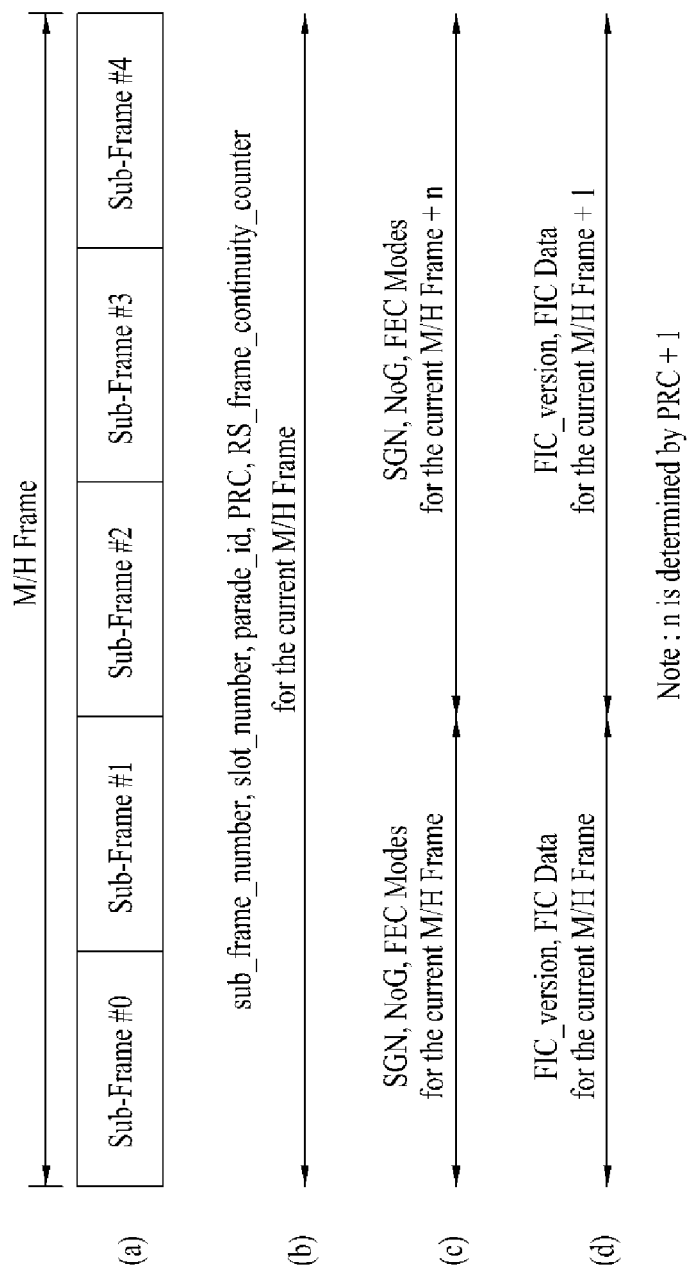
FIG. 39 illustrates an example of a transmission scenario of the TPC data and the FIC data level according to the present invention.

FIG. 39 illustrates an example of a transmission scenario of the TPC data and the FIC data. The values of the Sub-Frame_number field, Slot_number field, Parade_id field, Parade_repetition_cycle field, and Parade_continuity_counter field may corresponds to the current M/H frame throughout the 5 sub-frames within a specific M/H frame. Some of TPC parameters and FIC data are signaled in advance.

The SGN, NoG and all FEC modes may have values corresponding to the current M/H frame in the first two sub-frames. The SGN, NoG and all FEC modes may have values corresponding to the frame in which the parade next appears throughout the $3^{rd}$, $4^{th}$ and $5^{th}$ sub-frames of the current M/H frame. This enables the M/H receivers to receive (or acquire) the transmission parameters in advance very reliably.

For example, when Parade_repetition_cycle='000', the values of the $3^{rd}$, $4^{th}$, and $5^{th}$ sub-frames of the current M/H frame correspond to the next M/H frame. Also, when Parade_repetition_cycle='011', the values of the $3^{rd}$, $4^{th}$, and $5^{th}$ sub-frames of the current M/H frame correspond to the $4^{th}$ M/H frame and beyond.

The FIC_version field and the FIC_data field may have values that apply to the current M/H Frame during the $1^{st}$ sub-frame and the $2^{nd}$ sub-frame, and they shall have values corresponding to the M/H frame immediately following the current M/H frame during the $3^{rd}$, $4^{th}$, and $5^{th}$ sub-frames of the current M/H frame.

Figure 40:
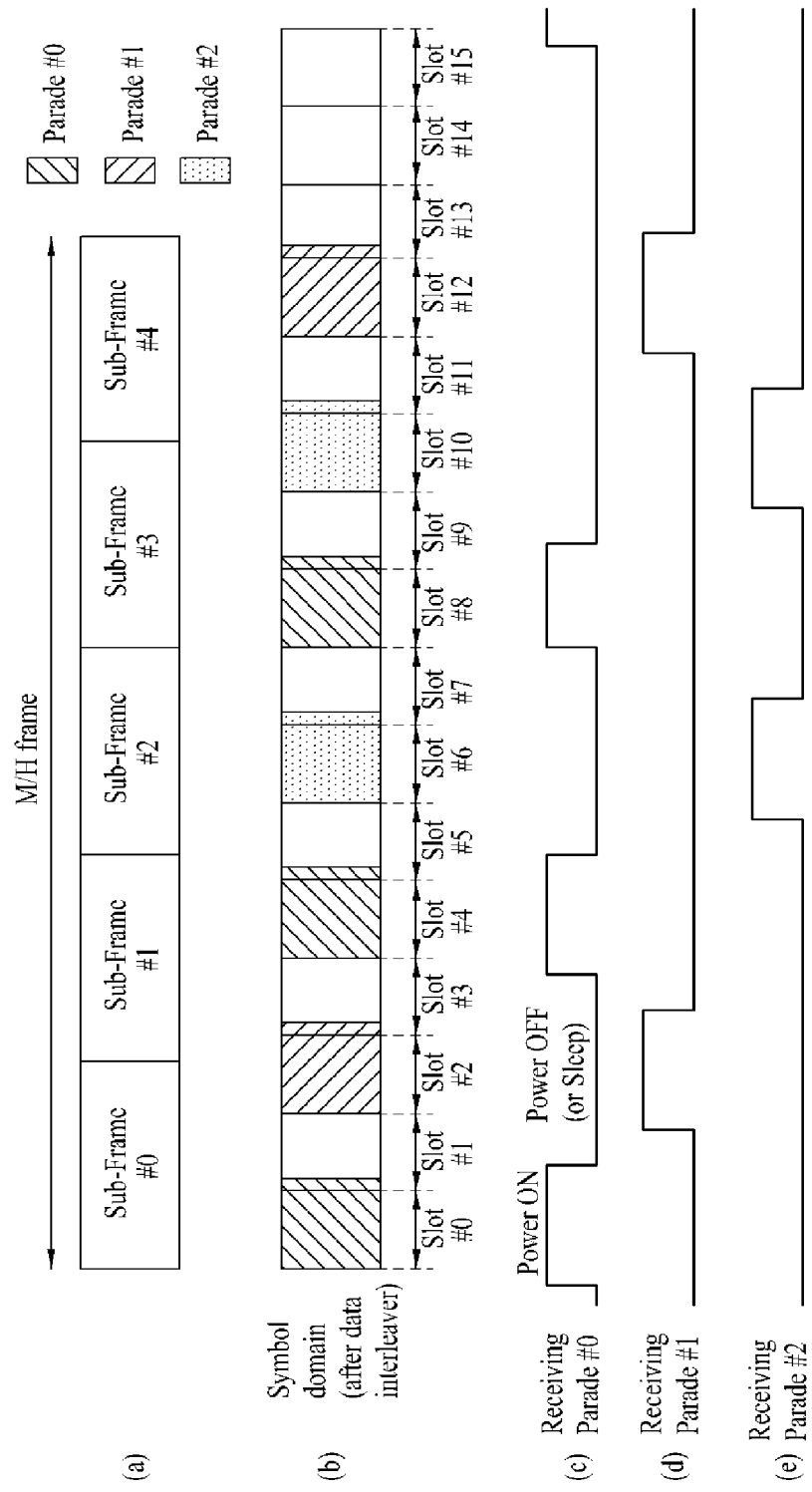
FIG. 40 illustrates an example of power saving of in a receiver when transmitting 3 parades to an M/H frame level according to the present invention.

Meanwhile, the receiving system may turn the power on only during a slot to which the data group of the designated (or desired) parade is assigned, and the receiving system may turn the power off during the remaining slots, thereby reducing power consumption of the receiving system. Such characteristic is particularly useful in portable or mobile receivers, which require low power consumption. For example, it is assumed that data groups of a $1^{st}$ parade with NOG=3, a $2^{nd}$ parade with NOG=2, and a $3^{rd}$ parade with NOG=3 are assigned to one M/H frame, as shown in FIG. 40. It is also assumed that the user has selected a mobile service included in the $1^{st}$ parade using the keypad provided on the remote controller or terminal. In this case, the receiving system turns the power on only during a slot that data groups of the $1^{st}$ parade is assigned, as shown in FIG. 40, and turns the power off during the remaining slots, thereby reducing power consumption, as described above. At this point, the power is required to be turned on briefly earlier than the slot to which the actual designated data group is assigned (or allocated). This is to enable the tuner or demodulator to converge in advance.

Assignment of Known Data (or Training Signal)

In addition to the payload data, the M/H transmission system inserts long and regularly spaced training sequences into each group. The regularity is an especially useful feature since it provides the greatest possible benefit for a given number of training symbols in high-Doppler rate conditions. The length of the training sequences is also chosen to allow fast acquisition of the channel during bursted power-saving operation of the demodulator. Each group contains 6 training sequences. The training sequences are specified before trellis-encoding. The training sequences are then trellis-encoded and these trellis-encoded sequences also are known sequences. This is because the trellis encoder memories are initialized to pre-determined values at the beginning of each sequence. The form of the 6 training sequences at the byte level (before trellis-encoding) is shown in FIG. 41. This is the arrangement of the training sequence at the group formatter 303.

The $1^{st}$ training sequence is located at the last 2 segments of the $3^{rd}$ M/H block (B3). The $2^{nd}$ training sequence may be inserted at the $2^{nd}$ and $3^{rd}$ segments of the $4^{th}$ M/H block (B4). The $2^{nd}$ training sequence is next to the signaling area, as shown in FIG. 5. Then, the $3^{rd}$ training sequence, the $4^{th}$ training sequence, the $5^{th}$ training sequence, and the $6^{th}$ training sequence may be placed at the last 2 segments of the $4^{th}$, $5^{th}$, $6^{th}$ and $7^{th}$ M/H blocks (B4, B5, B6, and B7), respectively. As shown in FIG. 41, the $1^{st}$ training sequence, the $3^{rd}$ training sequence, the $4^{th}$ training sequence, the $5^{th}$ training sequence, and the $6^{th}$ training sequence are spaced 16 segments apart from one another. Referring to FIG. 41, the dotted area indicates trellis initialization data bytes, the lined area indicates training data bytes, and the white area includes other bytes such as the FEC-coded M/H service data bytes, FEC-coded signaling data, main service data bytes, RS parity data bytes (for backwards compatibility with legacy ATSC receivers) and/or dummy data bytes.

FIG. 42 illustrates the training sequences (at the symbol level) after trellis-encoding by the trellis encoder. Referring to FIG. 42, the dotted area indicates data segment sync symbols, the lined area indicates training data symbols, and the white area includes other symbols, such as FEC-coded mobile service data symbols, FEC-coded signaling data, main service data symbols, RS parity data symbols (for backwards compatibility with legacy ATSC receivers), dummy data symbols, trellis initialization data symbols, and/or the first part of the training sequence data symbols. Due to the intra-segment interleaving of the trellis encoder, various types of data symbols will be mixed in the white area.

After the trellis-encoding process, the last 1416 (=588+ 828) symbols of the $1^{st}$ training sequence, the $3^{rd}$ training sequence, the $4^{th}$ training sequence, the $5^{th}$ training sequence, and the $6^{th}$ training sequence commonly share the same data pattern. Including the data segment synchronization symbols in the middle of and after each sequence, the total length of each common training pattern is 1424 symbols. The $2^{nd}$ training sequence has a first 528-symbol sequence and a second 528-symbol sequence that have the same data pattern. More specifically, the 528-symbol sequence is repeated after the 4-symbol data segment synchronization signal. At the end of each training sequence, the memory contents of the twelve modified trellis encoders shall be set to zero (0).

Receiving System

Figure 43:
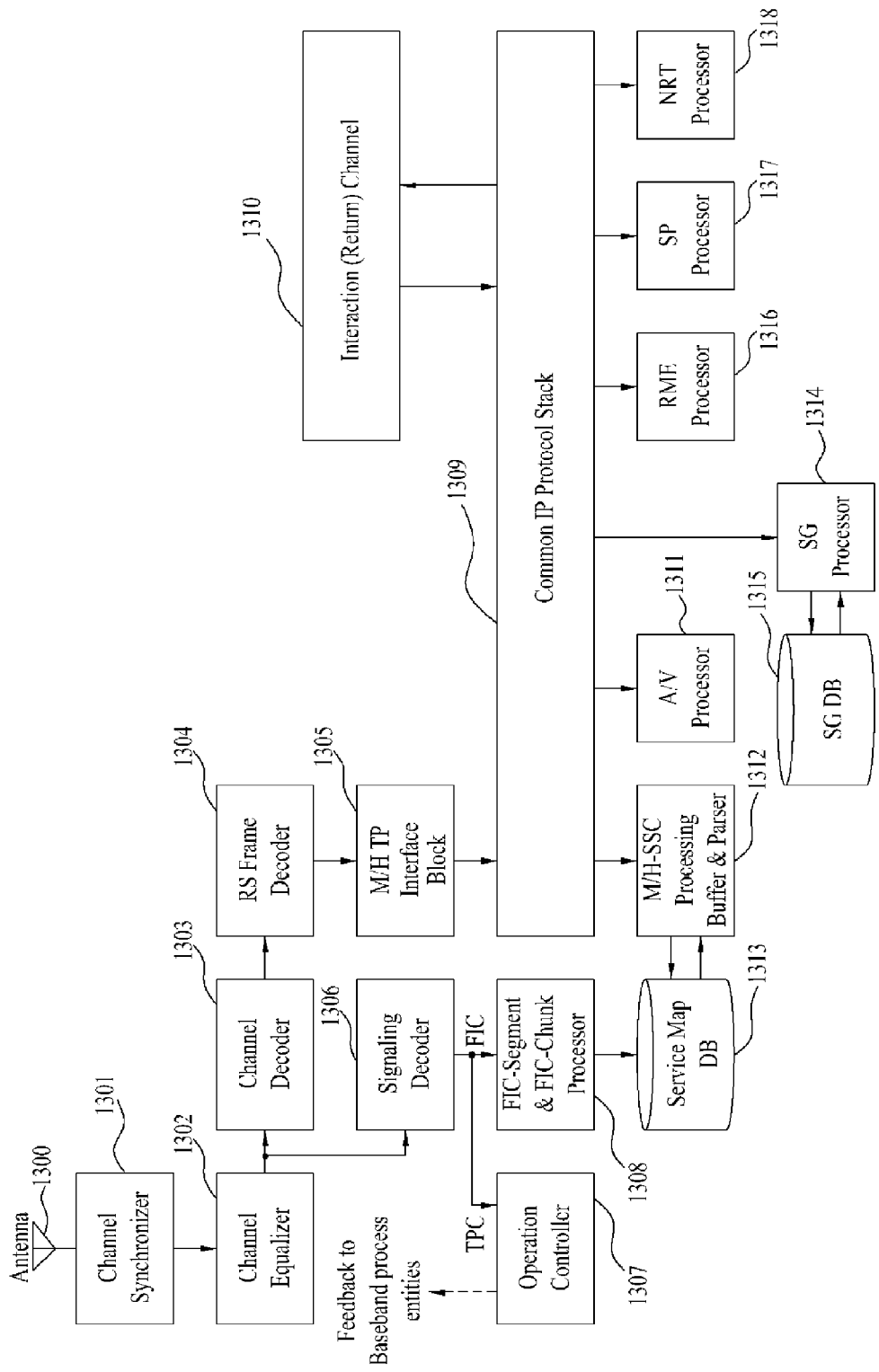
FIG. 43 illustrates a block diagram showing the structure of a receiving system according to an embodiment of the present invention.

FIG. 43 illustrates a block diagram showing the structure of a receiving system according to an embodiment of the present invention. The receiving system of FIG. 43 includes an antenna 1300, a channel synchronizer 1301, a channel equalizer 1302, a channel decoder 1303, an RS frame decoder 1304, an M/H TP interface block 1305, a signaling decoder 1306, an operation controller 1307, an FIC processor 1308, a common IP protocol stack 1309, an interaction channel unit 1310, an A/V processor 1311, a service signaling channel (SSC) processor 1312, a first storage unit 1313, a service guide (SG) processor 1314, and a second storage unit 1315. The receiving system may further include a rich media environment (RME) processor 1316, a service protection (SP) processor 1317, and a non-real time (NRT) processor 1318. Also, the receiving system may further include a main service data processing unit. Herein, the main service data processing unit may include a data deinterleaver, an RS decoder, and a data derandomizer.

According to an embodiment of the present invention, the first storage unit 1313 corresponds to a service map database (DB), and the second storage unit 1315 corresponds to a service guide database (DB).

The channel synchronizer 1301 includes a tuner and a demodulator. The tuner tunes a frequency of a specific channel through the antenna 1300, so as to down-convert the tuned frequency to an intermediate frequency (IF) signal, thereby outputting the converted IF signal to the demodulator. Herein, the signal being outputted from the tuner corresponds to a passband digital IF signal.

The demodulator included in the channel synchronizer 1301 uses known data sequences included in a data group and transmitted from the transmitting system, so as to perform carrier recovery and timing recovery, thereby converting the inputted pass band digital signal to a baseband digital signal.

For example, among the known data sequences, the channel equalizer 1302 uses a $1^{st}$ known data sequence, and $3^{rd}$ to $6^{th}$ known data sequences to compensate the distortion in a received signal caused by multi path or a Doppler effect. At this point, the channel equalizer 1302 may enhance the equalizing performance by being fed-back with the output of the channel decoder 1303.

The signaling decoder 1306 extracts signaling data (e.g., TPC data and FIC data) from the received signal and decodes the extracted signal data. The decoded TPC data are outputted to the operation controller 1307, and the decoded FIC data are outputted to the FIC processor 1308. According to an embodiment of the present invention, the signaling decoder 1306 performs signaling decoding as an inverse process of the signaling encoder, so as to extract the TPC data and the FIC data from the received signal. For example, the signaling decoder 1306 performs a parallel concatenated convolution code (PCCC) type regressive turbo decoding process on the data corresponding to the signaling information region within the inputted data. Then, the signaling decoder 1306 derandomizes the turbo-decoded signaling data, thereby separating the TPC data and the FIC data from the derandomized signaling data. Additionally, the signaling decoder 1306 performs RS-decoding on the separated TPC data as an inverse process of the transmitting system, thereby outputting the RS-decoded TPC data to the operation controller 1307.

Herein, the TPC data may include RS frame information, SCCC information, M/H frame information, and so on. The RS frame information may include RS frame mode information and RS code mode information. The SCCC information may include SCCC block mode information and SCCC outer code mode information. The M/H frame information may include index information. And, the TPC data may include subframe count information, slot count information, parade_id information, SGN information, NOG information, and so on.

Thereafter, the signaling decoder 1306 performs deinterleaving on the separated FIC data in subframe units and performs RS decoding on the deinterleaved data as an inverse process of the transmitting system, thereby outputting the RS-decoded data to the FIC processor 1308. The transmission unit of the FIC data being deinterleaved and RS-decoded by the signaling decoder 1306 and outputted to the FIC processor 1308 corresponds to FIC segments.

The channel decoder 1303, which is also referred to as a block decoder, performs forward error correction in order to recover meaningful data (e.g., mobile service data) from the received signal. According to an embodiment of the present invention, in order to do so, the channel decoder 1303 uses SCCC-related information (e.g., SCCC block information, SCCC outer code mode information, and so on) included in the signaling data. According to the embodiment of the present invention, if the data being channel-equalized and inputted from the channel equalizer 1302 correspond to data processed with both serial concatenated convolution code (SCCC) type block-encoding and trellis-encoding (i.e., data within the RS frame, signaling data) by the transmitting system, the channel decoder 1303 performs trellis-decoding and block-decoding on the corresponding data as an inverse process of the transmitting system. Alternatively, if the data being channel-equalized and inputted from the channel equalizer 1302 correspond to data processed only with trellis-encoding and not with block-encoding (i.e., main service data), the channel decoder 1303 performs only trellis-decoding on the corresponding data.

By performing RS-CRC decoding on the received data, the RS frame decoder 1304 recovers the RS frame. More specifically, the RS frame decoder 1304 performs forward error correction in order to recover the RS frame. In order to do so, according to an embodiment of the present invention, the RS frame decoder 1304 uses RS-associated information (e.g., RS code mode) among the signaling data.

The M/H TP interface block 1305 extracts M/H TP packets from the RS frame, so as to recover the IP datagram, thereby outputting the recovered IP datagram to the common IP protocol stack 1309. Herein, the M/H TP packets encapsulate the IP datagram. More specifically, the header of each M/H TP packet is analyzed so as to recover the IP datagram from the payload of the corresponding M/H TP packet.

The operation controller 1307 uses the decoded TPC data structure so as to control the operations of various baseband processes. More specifically, the operation controller 1307 receives the TPC data and delivers information, such as M/H frame timing information, information on whether or not a data group exists in a selected parade, position information of known data within the data group, and power control information, to block requiring the respective information.

The FIC processor 1308 collects (or gathers) FIC segments to recover an FIC chunk and stores the recovered FIC chunk in the first storage unit 1313. The FIC chunk includes signaling information required in an ensemble selection process and a mobile (or M/H) service scanning process.

The service signaling channel processor 1312 extracts service signaling channel table sections from the designated IP multicast streams and stores the extracted service signaling channel table sections in the first storage unit 1313. The service signaling channel includes IP level signaling information, which is required for M/H service selection and scanning processes. Herein, the service signaling channel according to the present invention transmits at least one of an SMT, a GAT, an RRT, a CIT, and an SLT. At this point, according to embodiment of the present invention, the access information of the IP datagram transmitting the service signaling channel corresponds to a well-known destination IP address and a well-known destination UDP port number. Therefore, the service signaling channel processor 1312 has a well-known destination IP address and a well-known destination UDP port number, thereby being capable of extracting the IP stream transmitting the service signaling channel, i.e., service signaling data. Then, at least one of the SMT, the GAT, the RRT, the CIT, and the SLT extracted from the service signaling data is recovered and stored in the first storage unit 1313. For example, the first storage unit 1313 stores a service map configured from signaling information collected the FIC processor 1308 and the service signaling channel processor 1312.

The A/V processor 1311 receives the IP datagram from the common IP protocol stack 1309. Then, the A/V processor 1311 separates the audio data and the video data from the received IP datagram and decoded each of the audio data and the video data with a respective decoding algorithm, thereby displaying the decoded data to the screen. For example, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm may be applied be used as the audio decoding algorithm, and at least one of an MPEG 2 video decoding algorithm, an MPEG 4 video decoding algorithm, an H.264 decoding algorithm, an SVC decoding algorithm, and a VC-1 decoding algorithm may be applied as the video decoding algorithm.

The SG processor 1314 recovers announcement data and stores the recovered announcement data to the second storage unit 1315, thereby providing a service guide to the viewer.

The interaction (or return) channel unit 1310 provides an uplink from the receiving system through the common IP protocol stack 1309. At this point, the interaction channel should be IP-compatible.

The RME processor 1316 receives an M/H broadcast program or RME data through the common IP protocol stack 1309, the RME data being delivered through the interaction channel. Then, the received M/H broadcast program or RME data are recovered and then processed.

The SP processor 1317 recovers and processes data associated with service protection, which are received through the common IP protocol stack 1309. Then, the SP processor 1317 provides protection to the M/H service depending upon the subscription state of the viewer (or user).

The NRT processor 1318 recovers and processes non-real time data, such as file application.

Channel Synchronizer

Figure 44:
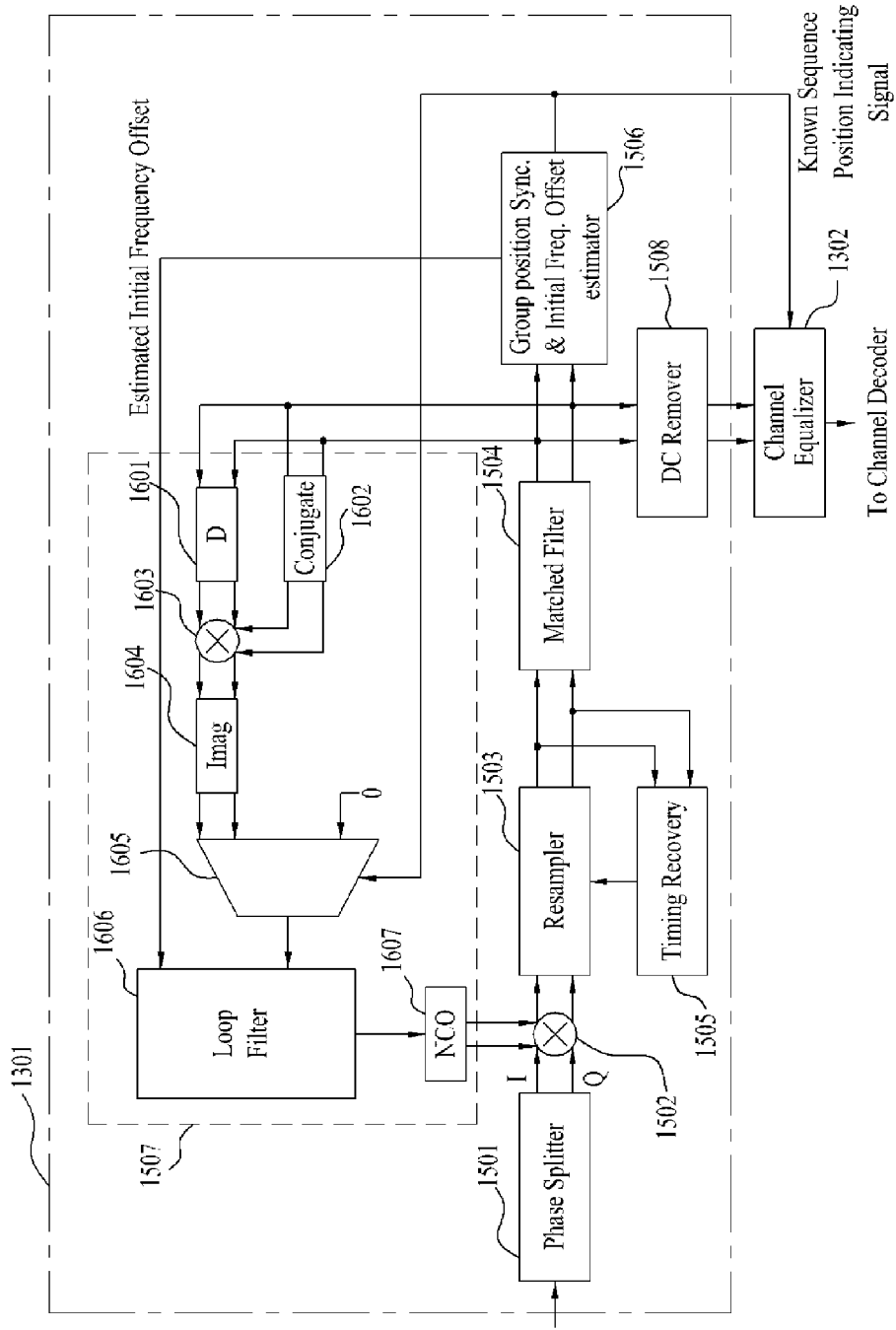
FIG. 44 illustrates a detailed block diagram of a channel equalizing unit according to an embodiment of the present invention.

FIG. 44 illustrates a detailed block diagram of a demodulator included in the channel synchronizer 1301 according to an embodiment of the present invention.

The channel synchronizer 1301 of FIG. 44 may include a phase splitter 1501, a first multiplier 1502, a resampler 1503, a Matched Filter 1504, a Timing Recovery block 1505, a Group Position Synchronization & Initial Frequency offset estimator (or known sequence detector) 1506, a Carrier Recovery block 1507, and a DC remover 1508. According to an embodiment of the present invention, an analog-to-digital converter (not shown) converting a passband analog signal to a passband digital signal may be provided at the front end of the phase splitter 1501. Also, according to an embodiment of the present invention, an automatic gain control (AGC) is performed before carrier recovery and timing recovery.

The carrier recovery block 1507 includes a delay unit 1601, a second multiplier 1603, a carrier frequency offset detector 1604, a multiplexer 1605, a loop filter 1606, and Numerically Controlled Oscillator (NCO) 1607.

Also referring to FIG. 44, the phase splitter 1501 receives a pass band digital signal and splits the received signal into a pass band digital signal of a real number element and a pass band digital signal of an imaginary number element both having a phase of 90 degrees between one another. In other words, the pass band digital signal is split into complex signals. The split portions of the pass band digital signal are then outputted to the first multiplier 1502. Herein, the real number signal outputted from the phase splitter 1501 will be referred to as an 'I' signal, and the imaginary number signal outputted from the phase splitter 1501 will be referred to as a 'Q' signal, for simplicity of the description of the present invention.

It is assumed that the signal being outputted from the tuner of the present invention is an intermediate frequency (IF) of 44 MHz. According to another embodiment of the present invention, the signal being outputted from the tuner may also be a zero IF signal (i.e., complex baseband signal). In this case, the zero IF signal is inputted to the first multiplier 1502 bypassing the phase splitter 1501.

The first multiplier 1502 multiplies the I and Q pass band digital signals, which are outputted from the phase splitter 1501, by a digital complex signal outputted from the NCO 1607 of the carrier recovery block 1507, thereby down-converting the I and Q passband digital signals to baseband digital complex signals. At this point, by multiplying the carrier frequency offset being outputted from the carrier recovery block 1507 by the output of the phase splitter 1501, the carrier frequency offset included in the output signal of the phase splitter 1501 is compensated. Thereafter, the baseband digital signals of the first multiplier 1502 are inputted to the resampler 1503.

The resampler 1503 multiplies the signals outputted from the first multiplier 1502 by a sampling clock provided by the timing recovery block 1505, so as to compensate symbol timing errors, thereby outputting the compensated signals to the matched filter 1504 and the timing recovery block 1505.

The matched filter 1504 performs matched filtering on the output signals of the resampler 1503, thereby outputting the signals processed with matched filtering to the Group Position Synchronization & Initial Frequency offset estimator 1506, the Carrier Recovery block 1507, and the DC remover 1508.

The Group Position Synchronization & Initial Frequency offset estimator 1506 detects the place (or position) of the known data sequences that are included in the data group and received. Simultaneously, the Group Position Synchronization & Initial Frequency offset estimator 1506 estimates an initial frequency offset during the known data detection process. In this case, the carrier recovery block 1507 may use the known data sequence position information and initial frequency offset value to estimate the carrier frequency offset with more accuracy, thereby performing compensation. Also, the Group Position Synchronization & Initial Frequency offset estimator 1506 performs group position synchronization. More specifically, the Group Position Synchronization Initial Frequency offset estimator 1506 extracts the starting position of each data group.

For example, the Group Position Synchronization & Initial Frequency offset estimator 1506 detects the position (or place) of the known data sequence included in the data group. Then, the Group Position Synchronization & Initial Frequency offset estimator 1506 outputs the detected known sequence position indicating signal to the multiplexer 1604 and the channel equalizer 1302 of the carrier recovery block 1507. Furthermore, the Group Position Synchronization & Initial Frequency offset estimator 1506 estimates the initial frequency offset by using the second known data sequence within the data group, which is then outputted to the loop filter 1606 of the carrier recovery block 1507.

The timing recovery block 1505 receives the output of the resampler 1503 so as to detect the timing error. Then, the timing recovery block 1505 outputs a sampling clock being in proportion with the detected timing error to the resampler 1503, thereby controlling the sampling of the resampler 1503.

The DC remover 1508 removes a pilot tone signal (i.e., DC signal), which has been inserted by the transmitting system, from the matched-filtered signal outputted from the matched filter 1504. Thereafter, the DC remover 1508 outputs the processed signal to the channel equalizer 1302.

Known Data Sequence Position Detection and Initial Frequency Offset Estimation

According to an embodiment of the present invention, among the known data sequences included in the data group, a correlation of repeated known data patterns of a second known data sequence is used to detect the position of a known data sequence within the data group and to estimate an initial frequency offset. Particularly, according to an embodiment of the present invention, a partial correlation is used to detect the position of a known data sequence and to estimate an initial frequency offset.

The initial frequency offset includes a rough frequency offset and a finer frequency offset. More specifically, when acquiring carrier frequency acquisition, at first a rough frequency offset is used to reduce a frequency pull-in range, and, then, a finer frequency offset is used to reduce the frequency pull-in range once again.

In the present invention, the second known data sequence within the data group is configured of a first 528 symbol sequence and a second 528 symbol sequence each having the same pattern. More specifically, the 528 pattern is repeated after a data segment synchronization signal of 4 symbols.

In the description of the present invention, the second known data sequence will be referred to as an acquisition training sequence.

The Group Position Synchronization & Initial Frequency offset estimator (or known sequence detector) 1506 uses the repeated known data pattern of the second known data sequence, so as to perform group position synchronization and initial frequency offset estimation. For example, a correlation between the received signal and a second known data sequence, which is pre-known based upon an agreement between the transmitting system and the receiving system, and by finding a maximum correlation value, the group position synchronization may be performed. However, if a frequency offset exists in the received signal, the reliability of a general correlation method, wherein an entire second known data sequence is used to obtain one correlation value, may be degraded. More specifically, as the length of a known data pattern for correlation becomes longer, the possibility of the reliability of a correlation peak value being degraded may increase.

Therefore, according to an embodiment of the present invention, a partial correlation method is used to detect a highly reliable correlation peak value, even when a large frequency offset exists. More specifically, by using the partial correlation method, noise may be reduced.

AS described above, in the present invention, by obtaining a partial correlation by dividing (or segmenting) the second known data sequence into two or more parts, a peak value among the correlation value for each part may be obtained. Then, all of the peak correlation values for each part are added so as to calculate the average (or mean) value. Accordingly, the noise included in the received signal is cancelled, thereby reducing the noise.

In order to do so, the second known data sequence is segmented (or divided) into multiple parts, and a correlation between the known data sequence of each part (i.e., reference known data sequence of a corresponding part generated from the receiving system) and the receiving signal is calculated (or obtained) for each part. Thereafter, the partial correlation values obtained for each part are all added. At this point, each of the correlation values obtained for each part corresponds to a squared value (i.e., a magnitude square) having no phase information.

(a) of FIG. 45 shows an example of each part being configured of N number of symbols, when the second known data symbol sequence is divided (or segmented) into L number of parts. More specifically, in (a) of FIG. 45, L represents a number of parts being segmented from the second known data symbol sequence, and N represents the length of each part. Also, * signifies a complex conjugate. In other words, a second known data sequence is divided into L number of parts each having the length of N symbols. Thereafter, the correlation with the received signal is obtained for each part.

(b) of FIG. 45 illustrates a conceptual diagram of a partial correlator according to an embodiment of the present invention. Herein, the partial correlator consists of a multiplier 1701 shifting known data sequences of each corresponding part to the received signal so as to perform complex conjugate multiplication, a first accumulator 1702 accumulating the output of the multiplier 1701 for a period of N symbols, a squarer 1703 calculating a squared value of the output of the first accumulator 1702, and a second accumulator 1704 accumulating the output of the squarer 1703 for a predetermined period of time, thereby calculating an average (or mean) correlation value.

More specifically, the multiplier 1701 shifts the known data sequence of a corresponding part in accordance with the received signal so as to perform complex conjugate multiplication, thereby outputting the multiplied values to the first accumulator 1702. The first accumulator 1702 accumulates the output of the multiplier 1701 for a period of N symbols, thereby outputting the accumulated value to the squarer 1703. The output of the first accumulator 1702 corresponds to correlation values each having a phase and size. The squarer 1703 calculates the squared value of the output of the first accumulator 1702, thereby obtaining the size of the correlation value. The second accumulator 1704 accumulates the outputs of the squarer 1703 during L sections. Then, the second accumulator 1704 divides the accumulated value by L, so as to output the average correlation value of the corresponding part. Equation 7 shown below corresponds to (b) of FIG. 45 recapitulated in the form of an equation.

$$y[k] = 1/L \sum_{i=0}^{L} |z[k+Ni]|^2 \qquad \text{Equation 7}$$

More specifically, by finding a maximum correlation value during a data group period, the Group Position Synchronization & Initial Frequency offset estimator 1506 decides a group synchronization position and a known data sequence position. Also, by suing the partial correlation method, the known sequence detector estimates the initial frequency offset.

FIG. 46 illustrates an example of estimating a rough initial frequency offset by obtaining partial correlation by dividing (or segmenting) a second known data sequence into 8 parts. When applying this example to FIG. 45, L is equal to 8, and N is equal to 132 symbols. In case of FIG. 46, 8 partial correlators are required to be provided, and 8 peak correlation values may be obtained accordingly.

In this case, at a maximum correlation position, the Group Position Synchronization & Initial Frequency offset estimator 1506 calculates a phase difference between the correlation values of each of the successive parts. Then, the Group Position Synchronization & Initial Frequency offset estimator 1506 uses an adder 1801 to add all of the phase differences for each part, thereby outputting an average phase difference $\Delta\theta$. Subsequently, by using the average phase difference $\Delta\theta$ and the length (N) of each part, the known sequence detector may calculate $\omega_0$ as shown in Equation 8 below.

$$\omega_0 = \frac{\Delta\theta}{N} \qquad \text{Equation 8}$$

Herein, $\omega_0 = 2\pi f0$
f0: Normalized frequency offset
$\Delta\theta$: Average phase difference)
N: Length of each part According to an embodiment of the present invention, in Equation 8, N is equal to 132.

At this point, the rough (or coarse) frequency offset f0 obtained from ω0 by applying Equation 8 provides a frequency pull-in range of ±80 kHz. A trade-off exists between the frequency pull-in range and a variance of an estimated error associated to a length of the part. More specifically, if the length of a known data pattern for the correlation is short, the frequency pull-in range increases, and the jitter also increases accordingly. On the other hand, if the length of a known data pattern for the correlation is long, the frequency pull-in range decreases, and the jitter also decreases accordingly.

Meanwhile, according to an embodiment of the present invention, a finer frequency offset is estimated by using repeated patterns of the second known data sequence. The second known data sequence is configured of two parts. More specifically, the second known data sequence is configured of a part including a first 528 symbol sequence and another part including a second 528 symbol sequence. Herein, a data segment synchronization signal of 4 symbols exists between the first 528 symbol sequence and the second 528 symbol sequence. This structure allows the finer frequency offset to be estimated by using a Maximum-likelihood algorithm.

FIG. 47 illustrates an example of estimating a finer frequency offset by using the Maximum-likelihood algorithm according to the present invention.

At this point, the received signal r[k] may be indicated as shown in Equation 9 below.

$$r[k] = x[k]e^{-j2\pi f_0 T_s k} + n[k] \qquad \text{Equation 9}$$

Herein,
x[k]: transmitted signal
f0: frequency offset
Ts: symbol duration
n[k]: noise In Equation 9, f0 corresponds to the finer frequency offset.

Also, the correlation between the received signals separated by 532 (=528+4) symbols may be obtained (or calculated) by using Equation 10 below.

$$E\{r[k]r^*[k+532]\} = E\{(x[k]e^{-j2\pi f_0 T_s k} + n[k]) \qquad \text{Equation 10}$$
$$(x^*[k+532]e^{j2\pi f_0 T_s(k+532)} +$$
$$n^*[k+532])\}$$
$$= \sigma_s^2 e^{j2\pi f_0 T_s \cdot 532}$$

Where, $\sigma_s^2$: $E\{|x[k]|^2\}$

More specifically, the partial correlation of the two parts spaced apart by 532 symbols (i.e., each part having the length of 532 symbols) is calculated and then the average value is calculated. Thereafter, after applying an argument, the finer frequency offset can be obtained. The finer frequency offset obtained by applying the Equation 10 provides a frequency pull-in range of ±10 kHz.

In the description of the present invention, the rough frequency offset and the finer frequency offset will be collectively referred to as an initial frequency offset. The initial frequency offset is outputted to the loop filter 1606 of the carrier recovery block 1507.

Meanwhile, according to an embodiment of the present invention, the carrier recovery block 1507 uses a carrier frequency tracking loop, as shown in FIG. 44.

The carrier recovery block 1507 loads an initial frequency offset estimated from the Group Position Synchronization & Initial Frequency offset estimator 1506. Then, the carrier recovery block 1507 tracks the remaining carrier frequency offset.

More specifically, the carrier recovery block 1507 uses a Maximum-likelihood to calculate the correlation of the received successive known data sequences, thereby estimating a carrier frequency offset (or error) using the same method that is used for the initial frequency offset estimation.

In order to do so, the delay unit 1601 of the carrier recovery block 1507 receives the data outputted from the matched filter 1504 in symbol units so as to perform a K symbol delay. Thereafter, the delay unit 1601 outputs the delayed data to the second multiplier 1603.

Also, the output data of the matched filter 1504 is conjugated by the conjugator 1602. Then, the conjugated data are inputted to the second multiplier 1603.

The second multiplier 1603 calculates the correlation value between the known data sequence delayed by K symbols by the delay unit 1601 and the known data sequence conjugated by the conjugator 1602. Thereafter, the second multiplier 1603 outputs the calculated correlation value to the carrier frequency offset detector 1604.

Herein, according to an embodiment of the present invention, K symbols is equal to 13312 symbols (=832*16 symbols). This is because the first known data sequence, and the third to sixth known data sequences are inserted and received at intervals of 16 segments, and also because one segment is configured of 832 symbols.

According to the embodiment of the present invention, the correlation value between the known data sequences spaced apart at an interval of 13312 symbols may be calculated by applying Equation 11 shown below.

$$E\{r[k]r^*[k+13312]\} = E\{(x[k]e^{-j2\pi f_0 T_s k} + n[k]) \qquad \text{Equation 11}$$
$$(x^*[k +$$
$$13312]e^{j2\pi f_0 T_s(k+13312)} +$$
$$n^*[k+13312]\}$$
$$= \sigma_s^2 e^{j2\pi f_0 T_s \cdot 13312}$$

Where, $\sigma_s^s$: $E\{|x[k]|^2\}$
Herein,
x[k]: transmitted signal
f0: carrier frequency offset
Ts: symbol duration
n[k]: noise In Equation 11, fo corresponds to a carrier frequency offset for tracking.

The carrier frequency offset detector 1604 extracts a carrier frequency offset from the correlation value outputted from the second multiplier 1603, as shown in Equation 11. Then, the extracted carrier frequency offset is outputted to the multiplexer 1605.

In accordance with the Known Sequence Position Indicating Signal from the Group Position Synchronization & Initial Frequency offset estimator 1506, the multiplexer 1605 selects an output of the carrier frequency offset detector 1604 or '0', which is then outputted as the final carrier frequency offset value.

More specifically, by using Known Sequence Position Indicating Signal, the validity of the carrier frequency offset value being outputted from the carrier frequency offset detector 1604 can be known. If the carrier frequency offset value is valid, the multiplexer 1605 selects the output of the carrier frequency offset detector 1604. And, if the carrier frequency offset value is not valid, the multiplexer 1605 selects '0'. Then, the multiplexer 1605 outputs the selection to the loop filter 1606.

The loop filter 1606 adds the output of the multiplexer 1605 to the estimated initial frequency offset, so as to perform baseband pass-filtering. Thereafter, the filtered data are outputted to the NCO 1607.

The NCO 1607 generates a complex signal corresponding to a baseband pass-filtered carrier frequency offset, thereby outputting the generated complex signal to the first multiplier 1502.

Meanwhile, according to an embodiment of the present invention, by turning the power on only in particular slots, i.e., slots having the data groups of a parade allocated thereto, wherein the parade includes a mobile service requested to be received, the channel synchronizer 1301 may reduce power consumption in the receiving system. For this, the receiving system may further include a power controller (not shown), which controls the power supply of the demodulator.

Channel Equalizer

The data demodulated by the channel synchronizer 1301 using the known data are inputted to the channel equalizer 1302. Also, the demodulated data may be inputted to the known sequence detector 1506.

At this point, a data group that is inputted for the equalization process may be divided into region A to region D, as shown in FIG. 5. More specifically, according to the embodiment of the present invention, region A includes M/H block B4 to M/H block B7, region B includes M/H block B3 and M/H block B8, region C includes M/H block B2 and M/H block B9, and region D includes M/H block B1 and M/H block B10. In other words, one data group is divided into M/H blocks from B1 to B10, each M/H block having the length of 16 segments. Also, a long training sequence (i.e., known data sequence) is inserted at the starting portion of the M/H blocks B4 to B8. Furthermore, two data groups may be allocated (or assigned) to one VSB field. In this case, field synchronization data are positioned in the $37^{th}$ segment of one of the two data groups.

The present invention may use known data, which have position and content information based upon an agreement between the transmitting system and the receiving system, and/or field synchronization data for the channel equalization process.

The channel equalizer 1302 may perform channel equalization using a plurality of methods. According to the present invention, the channel equalizer 1302 uses known data and/or field synchronization data, so as to estimate a channel impulse response (CIR), thereby performing channel equalization.

Most particularly, an example of estimating the CIR in accordance with each region within the data group, which is hierarchically divided and transmitted from the transmitting system, and applying each CIR differently will also be described herein.

At this point, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data.

For example, the data of the M/H block B3 including the field synchronization data performs channel-equalization using the CIR calculated from the field synchronization data area and the CIR calculated from the first known data area. Also, the data of the M/H blocks B1 and B2 performs channel-equalization using the CIR calculated from the field synchronization data area and the CIR calculated from the first known data area. Meanwhile, the data of the M/H blocks B1 to B3 not including the field synchronization data performs channel-equalization using CIRs calculated from the first known data area and the third known data area.

As described above, the present invention uses the CIR estimated from the known data region in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations.

FIG. 48 illustrates an example of linear interpolation. More specifically, in a random function F(x), when given the values F(Q) and F(S) each from points x=Q and x=S, respectively, the approximate value $\hat{F}(P)$ of the F(x) function at point x=P may be estimated by using Equation 12 below. In other words, since the values of F(Q) and F(S) respective to each point x=Q and x=S are known (or given), a straight line passing through the two points may be calculated so as to obtain the approximate value $\hat{F}(P)$ of the corresponding function value at point P. At this point, the straight line passing through points (Q,F(Q)) and (S,F(S)) may be obtained by using Equation 12 below.

$$\hat{F}(x) = \frac{F(S) - F(Q)}{S - Q}(x - Q) + F(Q) \qquad \text{Equation 12}$$

Accordingly, Equation 13 below shows the process of substituting p for x in Equation 12, so as to calculate the approximate value $\hat{F}(P)$ of the function value at point P.

$$\hat{F}(P) = \frac{F(S) - F(Q)}{S - Q}(P - Q) + F(Q) \qquad \text{Equation 13}$$

$$\hat{F}(P) = \frac{S - P}{S - Q}F(Q) + \frac{P - Q}{S - Q}F(S)$$

The linear interpolation method of Equation 13 is merely the simplest example of many other linear interpolation methods. Therefore, since any other linear interpolation method may be used, the present invention will not be limited only to the examples given herein.

Alternatively, when a value F(Q) of a function F(x) at a particular point Q and a value F(S) of the function F(x) at another particular point S are known (or given), extrapolation refers to estimating a function value of a point outside of the section between points Q and S. Herein, the simplest form of extrapolation corresponds to linear extrapolation.

FIG. 49 illustrates an example of linear extrapolation. As described above, for linear extrapolation as well as linear interpolation, in a random function F(x), when given the values F(Q) and F(S) each from points x=Q and x=S, respectively, the approximate value F̂(P) of the corresponding function value at point P may be obtained by calculating a straight line passing through the two points. Herein, linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

FIG. 50 illustrates a block diagram of a channel equalizer according to an embodiment of the present invention. Referring to FIG. 50, the channel equalizer includes a first frequency domain converter 4100, a channel estimator 4110, a second frequency domain converter 4121, a coefficient calculator 4122, a distortion compensator 4130, and a time domain converter 4140. Herein, the channel equalizer may further include a remaining carrier phase error remover, a noise canceller (NC), and a decision unit.

The first frequency domain converter 4100 includes an overlap unit 4101 overlapping inputted data, and a fast fourier transform (FFT) unit 4102 converting the data outputted from the overlap unit 4101 to frequency domain data.

The channel estimator 4110 includes a CIR estimator 4111, a first cleaner 4112, a multiplexer 4113, a CIR calculator 4114, a second cleaner, and a zero-padding unit. herein, the channel estimator 4110 may further include a phase compensator compensating a phase of the CIR which estimated in the CIR estimator 4111.

The second frequency domain converter 4121 includes a fast fourier transform (FFT) unit converting the CIR being outputted from the channel estimator 4110 to frequency domain CIR.

The time domain converter 4140 includes an IFFT unit 4141 converting the data having the distortion compensated by the distortion compensator 4130 to time domain data, and a save unit 4142 extracting only valid data from the data outputted from the IFFT unit 4141. The output data from the save unit 4142 corresponds to the channel-equalized data.

If the remaining carrier phase error remover is connected to an output terminal of the time domain converter 4140, the remaining carrier phase error remover estimates the remaining carrier phase error included in the channel-equalized data, thereby removing the estimated error. If the noise remover is connected to an output terminal of the time domain converter 4140, the noise remover estimates noise included in the channel-equalized data, thereby removing the estimated noise.

More specifically, the receiving data demodulated in FIG. 50 are overlapped by the overlap unit 4101 of the first frequency domain converter 4100 at a pre-determined overlapping ratio, which are then outputted to the FFT unit 4102. The FFT unit 4102 converts the overlapped time domain data to overlapped frequency domain data through by processing the data with FFT. Then, the converted data are outputted to the distortion compensator 4130.

The distortion compensator 4130 performs a complex number multiplication on the overlapped frequency domain data outputted from the FFT unit 4102 included in the first frequency domain converter 4100 and the equalization coefficient calculated from the coefficient calculator 4122, thereby compensating the channel distortion of the overlapped data outputted from the FFT unit 4102. Thereafter, the compensated data are outputted to the IFFT unit 4141 of the time domain converter 4140. The IFFT unit 4141 performs IFFT on the overlapped data having the channel distortion compensated, thereby converting the overlapped data to time domain data, which are then outputted to the save unit 4142. The save unit 4142 extracts valid data from the data of the channel-equalized and overlapped in the time domain, and outputs the extracted valid data.

Meanwhile, the received data are inputted to the overlap unit 4101 of the first frequency domain converter 4100 included in the channel equalizer and, at the same time, inputted to the CIR estimator 4111 of the channel estimator 4110.

The CIR estimator 4111 uses a training sequence, for example, data being inputted during the known data section and the known data in order to estimate the CIR. If the data to be channel-equalizing is the data within the data group including field synchronization data, the training sequence using in the CIR estimator 4111 may become the field synchronization data and known data. Meanwhile, if the data to be channel-equalizing is the data within the data group not including field synchronization data, the training sequence using in the CIR estimator 4111 may become only the known data.

For example, the CIR estimator 4111 uses the data received during a known data section and reference known data generated from the receiving system based upon an agreement between the receiving system and the transmitting system, so as to estimate a channel impulse response (CIR). In order to do so, the CIR estimator 4111 is provided with a Known Sequence Position Indicating Signal from the known sequence detector 1506.

Also, in case of the data group including field synchronization, the CIR estimator 4111 may use the data being received during one field synchronization section and the reference field synchronization data, which generated from the receiving system in accordance with an agreement between the transmitting system and the receiving system, so as to estimate a channel impulse response (CIR_FS). In order to do so, the CIR estimator 4111 may be provided with Field Sync Position Information from the Group Position Synchronization & Initial Frequency offset estimator 1506. The CIR estimator 4111 may estimate a channel impulse response (CIR) by using a well-known least square (LS) method.

In the LS method, a cross correlation value p between known data that have passed through a channel during a known data section and known data already known by a receiving end (or receiver) is calculated, and an auto-correlation matrix R of the known data is also calculated. Thereafter, a matrix operation (or calculation) of $R^{-1} \cdot p$ is performed so that the auto-correlation portion existing in the cross correlation value p between the received data and the initial (or original) known data can be removed, thereby estimating the CIR of the transmission channel.

Also, according to another embodiment of the present invention, the CIR estimator may also perform CIR estimation by using a least mean square (LMS) method. For example, in regions A and B within the data group, the Channel Impulse Response (CIR) is estimated by using the Least Square (LS) method, and, then, channel equalization may be performed. Thereafter, in regions C and D within the data group, the CIR is estimated by using the Least Mean Square (LMS) method, and, then, channel equalization may be performed.

The CIR estimated as described above is outputted to the first cleaner 4112 and the multiplexer 4113. The multiplexer 4113 may either select the output of the first cleaner 4112 or select the output of the CIR estimator 4111 depending upon whether the CIR operator 4114 performs interpolation on the estimated CIR, or whether the CIR operator 4114 performs extrapolation on the estimated CIR. For example, when the CIR operator 4114 performs interpolation on the estimated CIR, the multiplexer 4113 selects the output of the CIR estimator 4111. And, when the CIR operator 4114 performs extrapolation on the estimated CIR, the multiplexer 4113 selects the output of the first cleaner 4112.

The CIR operator 4114 performs interpolation or extrapolation on the estimated CIR and then outputs the interpolated or extrapolated CIR to the second cleaner 4115.

More specifically, the CIR estimated from the known data includes a channel element that is to be obtained as well as a jitter element caused by noise. Since such jitter element deteriorates the performance of the equalizer, it preferable that a coefficient calculator 4122 removes the jitter element before using the estimated CIR. Therefore, according to the embodiment of the present invention, each of the first and second cleaners 4112 and 4115 removes a portion of the estimated CIR having a power level lower than the predetermined threshold value (i.e., so that the estimated CIR becomes equal to '0'). Herein, this removal process will be referred to as a "CIR cleaning" process.

The CIR calculator 4114 performs CIR interpolation by multiplying CIRs estimated from the CIR estimator 4111 by each of coefficients, thereby adding the multiplied values. At this point, some of the noise elements of the CIR may be added to one another, thereby being cancelled. Therefore, when the CIR calculator 4114 performs CIR interpolation, the original (or initial) CIR having noise elements remaining therein. In other words, when the CIR calculator 4114 performs CIR interpolation, the estimated CIR bypasses the first cleaner 4112 and is inputted to the CIR calculator 4114. Subsequently, the second cleaner 4115 cleans the CIR interpolated by the CIR interpolator-extrapolator 4114.

Conversely, the CIR calculator 4114 performs CIR extrapolation by using a difference value between two CIRs estimated by the CIR estimator 4111, so as to estimate a CIR positioned outside of the two CIRs. Therefore, in this case, the noise element is rather amplified. Accordingly, when the CIR calculator 4114 performs CIR extrapolation, the CIR cleaned by the first cleaner 4112 is used. More specifically, when the CIR calculator 4114 performs CIR extrapolation, the extrapolated CIR passes through the second cleaner 4115, thereby being inputted to the zero-padding unit 4116.

Meanwhile, when a second frequency domain converter (or fast fourier transform (FFT2)) 4121 converts the CIR, which has been cleaned and outputted from the second cleaner 4115, to a frequency domain, the length and of the inputted CIR and the FFT size may not match (or be identical to one another). In other words, the CIR length may be smaller than the FFT size. In this case, the zero-padding unit 4116 adds a number of zeros '0's corresponding to the difference between the FFT size and the CIR length to the inputted CIR, thereby outputting the processed CIR to the second frequency domain converter (FFT2) 4121. Herein, the zero-padded CIR may correspond to one of the interpolated CIR, extrapolated CIR, and the CIR estimated in the known data section.

The second frequency domain converter 4121 performs FFT on the CIR being outputted from the zero padding unit 4116, thereby converting the CIR to a frequency domain CIR. Then, the second frequency domain converter 4121 outputs the converted CIR to the coefficient calculator 4122.

The coefficient calculator 4122 uses the frequency domain CIR being outputted from the second frequency domain converter 4121 to calculate the equalization coefficient. Then, the coefficient calculator 4122 outputs the calculated coefficient to the distortion compensator 4130. Herein, for example, the coefficient calculator 4122 calculates a channel equalization coefficient of the frequency domain that can provide minimum mean square error (MMSE) from the CIR of the frequency domain, which is outputted to the distortion compensator 4130.

The distortion compensator 4130 performs a complex number multiplication on the overlapped data of the frequency domain being outputted from the FFT unit 4102 of the first frequency domain converter 4100 and the equalization coefficient calculated by the coefficient calculator 4122, thereby compensating the channel distortion of the overlapped data being outputted from the FFT unit 4102. That is, the channel distortion such as a tilt and a ghost included in the received signal is compensated.

Block Decoder

Meanwhile, if the data being inputted to the block decoder (or channel decoder) 1303, after being channel-equalized by the equalizer 1302, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder 1303 correspond to the data having only trellis encoding performed thereon (i.e., the main service data), and not the block encoding, only the trellis decoding process is performed on the inputted data as the inverse process of the transmitting system.

The trellis decoded and block decoded data by the block decoder 1303 are then outputted to the RS frame decoder 1304. More specifically, the block decoder 1303 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 1303 outputs the processed data to the RS frame decoder 1304. Herein, the removal of the data may be performed before the block decoding process, or may be performed during or after the block decoding process.

Meanwhile, the data trellis-decoded by the block decoder 1303 are outputted to the data deinterleaver of the main service data processor. At this point, the data being trellis-decoded by the block decoder 1303 and outputted to the data deinterleaver may not only include the main service data but may also include the data within the RS frame and the signaling information. Furthermore, the RS parity data that are added by the transmitting system after the pre-processor 230 may also be included in the data being outputted to the data deinterleaver.

According to another embodiment of the present invention, data that are not processed with block decoding and only processed with trellis encoding by the transmitting system may directly bypass the block decoder 1303 so as to be outputted to the data deinterleaver. In this case, a trellis decoder should be provided before the data deinterleaver. More specifically, if the inputted data correspond to the data having only trellis encoding performed thereon and not block encoding, the block decoder 1303 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 1303 outputs a soft decision value with respect to the inputted data.

In other words, if the inputted data correspond to data being processed with block encoding by the block processor 302 and being processed with trellis encoding by the trellis encoding module 256, in the transmitting system, the block decoder 1303 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder.

When decoding such concatenated codes, in order to allow the block decoder 1303 to maximize its performance of decoding externally encoded data, the decoder of the internal code should output a soft decision value.

FIG. 51 illustrates a detailed block diagram showing a block decoder 1303 according to an embodiment of the present invention. The block decoder 1303 includes an input buffer 5011, a Trellis Code Modulation (TCM) decoder 5012, a data demultiplexer 5013, a symbol deinterleaver 5014, a symbol decoder 5015, a symbol interleaver 5016, and a data multiplexer 5017. The TCM decoder 5012 is referred to as an inner decoder, and the symbol decoder 5015 is referred to as an outer decoder or a trellis decoder. The block decoder 1303 according to the embodiment of the present invention performs SCCC block decoding in SCCC block units on the inputted data. In FIG. 51, 'U' and 'C' marked on the TCM decoder 5012 and the symbol decoder 5015 respectively indicate 4 ports of soft input soft output (SISO).

The input buffer 5011 temporarily stores values of mobile service data symbols (i.e., including RS parity data symbols that were added during RS frame encoding, and CRC data symbols) being channel-equalized and outputted from the channel equalizer 1302 in SCCC block units. Thereafter, the input buffer 5011 repeatedly outputs the stored values to the TCM decoder 5012.

Also, among the symbol values being outputted from the channel equalizer 1302, input symbol values of section do not include any mobile service data symbol (i.e., including RS parity data symbols that were added during RS frame encoding, and CRC data symbols) values bypass the input buffer 5011 without being stored. More specifically, since only trellis-decoding is performed on the input symbol value of sections that are not processed with SCCC block encoding, the input buffer 5011 directly outputs such input to the TCM decoder 5012 without performing any temporary storing or repeated outputting processes.

The input buffer 5011 refers to information associated to SCCC being outputted from the operation controller 1307 or the signaling decoder 1306, e.g., the SCCC block mode and SCCC outer code mode, so as to control the storage and output of the input data.

In correspondence with the 12-way trellis encoder, the TCM decoder 5012 includes a 12-way Trellis Coded Modulation (TCM) decoder. Herein, 12-way trellis-decoding is performed on the input symbol value as an inverse process of the 12-way trellis-encoder.

More specifically, the TCM decoder 5012 receives as many output symbol values of the input buffer 5011 and soft-decision values being fed-back through the data multiplexer 5017 as each SCCC blocks, so as to perform TCM decoding on each symbol.

At this point, the soft-decision values that are fed-back are matched to be in a one-to-one correspondence with a number of symbol positions corresponding to the number of SCCC blocks being outputted from the input buffer 5011, so that the matched soft-decision values can be inputted to the TCM decoder 5012 based upon the control of the data multiplexer 5017. More specifically, the symbol values being outputted from the input buffer 5011 and the turbo-decoded and inputted data are matched to one another in accordance with the same position within the respective SCCC block, thereby being outputted to the TCM decoder 5012. For example, if the turbo-decoded data correspond to the third symbol value within the SCCC block, the corresponding turbo-decoded data are matched with the third symbol value within the SCCC block being outputted from the input buffer 5011, thereby being outputted to the TCM decoder 5012.

In order to do so, the data multiplexer 5017 controls the system so that the input buffer 5011 can store the corresponding SCCC block data while the iterative turbo decoding is being performed. And, by using a delay method, the data multiplexer 5017 also controls the system so that the soft-decision value (e.g., LLR) of the output symbol of the symbol interleaver 5016 can be matched, so as to be in a one-to-one correspondence, with the symbol value of the input buffer 5011 corresponding to the same position (or location) within the block of the output symbol, thereby being inputted to the TCM decoder of the corresponding way. At this point, in case of a symbol value that is not block decoded, since the corresponding symbol value is not turbo decoded, a null bit is inputted in the matched output position (or location).

After performing this process for a predetermined number of iteration of turbo decoding, the data of the next SCCC block is stored in the input buffer 5011 and then outputted, so as to repeat the turbo-decoding process.

The output of the TCM decoder 5012 signifies the reliability of the symbols being inputted to the trellis encoder of the transmitting system with respect to the transmitted symbols. For example, since the 2-bit input of the trellis encoding module 256 of the transmitting system corresponds to one symbol, a Log Likelihood Ratio (LLR) between the likelihood (or probability) of one bit being '1' and the likelihood (or probability) of another bit being '0' may be respectively outputted (bit-unit output) for the upper bit and the lower bit. The Log Likelihood Ratio (LLR) signifies a log value on a ratio between the likelihood value of the input bit being '1' and the likelihood value of the input bit being '0'. Alternatively, a log likelihood ratio of the likelihood value of 2 bits, i.e., one symbol being "00", "01", "10", and "11" may be outputted (symbol-unit output) for all four combinations (00, 01,10,11). This eventually corresponds to the soft-decision value of the received symbol, which indicates the reliability of the bits that were inputted to the trellis encoder. Herein, a Maximum A posteriori Probability (MAP), a Soft-Out Viterbi Algorithm (SOYA) may be used as the decoding algorithm of each TCM decoder included in the TCM decoder 5012.

The data demultiplexer 5013 identifies the soft-decision values corresponding mobile service data symbols (i.e., including RS parity data added when performing RS frame encoding, and CRC data symbols) from the output of the TCM decoder 5012, thereby outputting the identified soft-decision values to the symbol deinterleaver 5014. At this point, the data demultiplexer 5013 performs an inverse process of process reordering of a mobile service data symbol generated from an intermediate step, wherein the output symbols outputted from the block processor 302 of the transmitting system are being inputted to the trellis encoding module 256 (e.g., when the symbols pass through the group formatter, the data deinterleaver, the packet formatter, and the data interleaver). Thereafter, the data demultiplexer 5013 performs reordering of the process order of soft decision values corresponding to the mobile service data symbols and, then, outputs the processed mobile service data symbols to the symbol deinterleaver 5014.

This is because a plurality of blocks exist between the block processor 302 and the trellis encoding module 256, and because, due to these blocks, the order of the mobile service data symbols being outputted from the block processor 302 and the order of the mobile service data symbols being inputted to the trellis encoding module 256 are not identical to one another. More specifically, the data demultiplexer 5013 reorders (or rearranges) the order of the mobile service data symbols being outputted from the outer TCM decoder 5012, so that the order of the mobile service data symbols being inputted to the symbol deinterleaver 5014 matches the order of the mobile service data symbols outputted from the block processor 302 of the transmitting system. The reordering process may be embodied as one of software, middleware, and hardware.

The symbol deinterleaver 5014 performs symbol deinterleaving on the soft decision values of data symbols being reordered and outputted from the data demultiplexer 5013 as an inverse process of the symbol interleaver 514 included in the transmitting system. The size of the SCCC block being used by the symbol deinterleaver 5014, during the symbol deinterleaving process, is identical to the interleaving size (i.e., B) of an actual symbol of the symbol interleaver included in the transmitting system. This is because turbo decoding is performed between the TCM decoder 5012 and the symbol decoder 5015.

The input and output of the symbol interleaver 5014 all corresponds to soft-decision values, and the deinterleaved soft-decision values are outputted to the symbol decoder 5015.

The symbol decoder 5015 has 4 memory states. If the symbol decoder is in a 1/2 coding rate mode, the memory states are changed in accordance with an input LLR set respective to a symbol. More specifically, in case of data being 1/2-rate encoded and outputted, the output LLR of the symbol deinterleaver 5014 is directly outputted to the symbol decoder 5015.

However, if the symbol decoder is in a 1/4 coding rate mode, i.e., in case of data being 1/4-rate encoded and outputted from the symbol encoder of the transmitting system, the memory states are changed in accordance with 2 input LLR sets respective to 2 successive symbols. Therefore, 2 input LLR sets should be merged into one LLR set during the input stage of the symbol decoder 5015. In the present invention, the merged LLR set may be obtained by adding first input LLRs and second input LLRs. If Li(x) is defined as an input LLR value having a condition of 'x', the merged LLR set may be expressed by using Equation 14 shown below.

$$Li(\text{merged nibble} = `0000\text{'}) =$$
$$Li(\text{first symbol} = `00\text{'}) + Li(\text{second symbol} = `00\text{'})$$
$$Li(\text{merged nibble} = `0001\text{'}) =$$
$$Li(\text{first symbol} = `00\text{'}) + Li(\text{second symbol} = `01\text{'})$$
$$Li(\text{merged nibble} = `0010\text{'}) =$$
$$Li(\text{first symbol} = `00\text{'}) + Li(\text{second symbol} = `10\text{'})$$
$$Li(\text{merged nibble} = `0011\text{'}) =$$
$$Li(\text{first symbol} = `00\text{'}) + Li(\text{second symbol} = `11\text{'})$$
$$Li(\text{merged nibble} = `0100\text{'}) =$$
$$Li(\text{first symbol} = `01\text{'}) + Li(\text{second symbol} = `00\text{'})$$
$$\ldots$$
$$Li(\text{merged nibble} = `1111\text{'}) =$$
$$Li(\text{first symbol} = `11\text{'}) + Li(\text{second symbol} = `11\text{'})$$

Equation 14

Meanwhile, as the opposite of the input LLR processing, the processing of the LLR that is to be outputted from the symbol decoder 5015 is divided into 2 symbol LLRs in the 1/4-code rate mode, as shown in Equation 15 below, thereby being outputted.

$$Lo(\text{first symbol}=`00\text{'})=\text{Maximum Probability whose LLR is from the sets } \{Lo(\text{merged nibble}=`00XY\text{'})+\text{Delta}\}$$

$$Lo(\text{first symbol}=`01\text{'})=\text{Maximum Probability whose LLR is from the sets } \{Lo(\text{merged nibble}=`01XY\text{'})+\text{Delta}\}$$

$$Lo(\text{first symbol}=`10\text{'})=\text{Maximum Probability whose LLR is from the sets } \{Lo(\text{merged nibble}=`10XY\text{'})+\text{Delta}\}$$

$$Lo(\text{first symbol}=`11\text{'})=\text{Maximum Probability whose LLR is from the sets } \{Lo(\text{merged nibble}=`00XY\text{'})+\text{Delta}\}$$

$$Lo(\text{second symbol}=`00\text{'})=\text{Maximum Probability whose LLR is from the sets } \{Lo(\text{merged nibble}=`XY00\text{'})+\text{Delta}\}$$

$$Lo(\text{second symbol}=`01\text{'})=\text{Maximum Probability whose LLR is from the sets } \{Lo(\text{merged nibble}=`XY01\text{'})+\text{Delta}\}$$

$$Lo(\text{second symbol}=`10\text{'})=\text{Maximum Probability whose LLR is from the sets } \{Lo(\text{merged nibble}=`XY10\text{'})+\text{Delta}\}$$

$$Lo(\text{second symbol}=`11\text{'})=\text{Maximum Probability whose LLR is from the sets } \{Lo(\text{merged nibble}=`XY00\text{'})+\text{Delta}\}$$

Equation 15

Herein, X and Y are the arbitrary selected digits from digit 0 or 1. Also, according to an embodiment of the present invention, a correction term 'Delta' value is calculated from an IETF RFC 3926 "FLUTE—File Delivery over Unidirectional Transport".

At this point, the symbol decoder 5015 output 2 types of soft-decision values. One corresponds to a soft-decision value being matched with an output symbol of the symbol decoder 513 (hereinafter referred to as a first soft-decision value). And, the other corresponds to a soft-decision value being matched with an input symbol of the symbol decoder 513 (hereinafter referred to as a second soft-decision value). The first soft-decision value represents a reliability of the output symbol, i.e., two bits, of the symbol encoder 513. And, a Log Likelihood Ratio (LLR) between the likelihood (or probability) of one bit being '1' and the likelihood (or probability) of another bit being '0' may be respectively outputted (bit-unit output) for the upper bit and the lower bit, which configure a symbol. Alternatively, a log likelihood ratio of the likelihood value of 2 bits, i.e., one symbol being "00", "01", "10", and "11" may be outputted (symbol-unit output) for all combinations. The first soft-decision value is fed-back to the TCM decoder 5012 through the symbol interleaver 5016 and the data multiplexer 5017. The second soft-decision value represents a reliability of the input symbol of the symbol encoder 513 of the transmitting system. Herein, the second soft-decision value is expressed as a Log Likelihood Ratio (LLR) between the likelihood (or probability) of one bit being '1' and the likelihood (or probability) of another bit being '0', thereby being outputted to the RS frame decoder 1304. Herein, a Maximum A posteriori Probability (MAP), a Soft-Out Viterbi Algorithm (SOYA) may be used as the decoding algorithm of the symbol decoder 5015.

At this point, when the first soft-decision value being outputted from the symbol decoder 5015 is in a 1/4 coding rate mode, the first soft-decision value is divided into 2 symbol LLRs, as shown in Equation 15, so as to be outputted to the symbol interleaver 5016.

For example, when the input/output unit of the symbol decoder 5015 corresponds to symbol units, 16 ($2^4$=16) different types of soft-decision values (LLRs) are inputted to the symbol decoder 5015. At this point, the 16 ($2^4=16$) different types of soft-decision values (i.e., LLRs) being inputted to the symbol decoder 5015 correspond to results of adding the respective first input LLR and the respective second input LLR.

If 1/4-rate coding is performed by the symbol encoder 513, the symbol decoder 5015 receives the LLR respective to the 16 different symbols and performs symbol decoding. Thereafter, the symbol decoder 5015 may output the LLR respective to the different symbols as the first soft-decision value. Alternatively, the symbol decoder 5015 may receive the LLR respective to 4 bits and performs symbol decoding. Thereafter, the symbol decoder 5015 may output the LLR respective to the 4 bits as the first soft-decision value.

And, if 1/2-rate coding is performed by the symbol encoder 513, the symbol decoder 5015 receives the LLR respective to the 4 different symbols and performs symbol decoding. Thereafter, the symbol decoder 5015 may output the LLR respective to the 4 different symbols as the first soft-decision value. Alternatively, the symbol decoder 5015 may receive the LLR respective to 2 bits and performs symbol decoding. Thereafter, the symbol decoder 5015 may output the LLR respective to the 2 bits as the first soft-decision value.

According to an embodiment of the present invention, the symbol interleaver 5016 performs symbol interleaving on the first soft-decision value being outputted from the symbol decoder 5015, as shown in FIG. 30, thereby outputting the symbol-interleaved first soft-decision value to the data multiplexer 5017. Herein, the output of the symbol interleaver 5020 also becomes a soft-decision value. According to another embodiment of the present invention, the symbol interleaver 5016 performs symbol interleaving on the first soft-decision value being outputted from the symbol decoder 5015, as shown in FIG. 52, thereby outputting the symbol-interleaved first soft-decision value to the data multiplexer 5017.

If the SCCC block mode is '00', a data group is configured of 10 SCCC blocks. And, if the SCCC block mode is '01', a data group is configured of 5 SCCC blocks. At this point, the symbol interleaving pattern of the 15 SCCC blocks are different from one another. Therefore, in order to store all symbol interleaving patterns, a memory having a very large capacity (e.g., ROM) is required. FIG. 52 illustrates a block diagram showing the structure of a symbol interleaver according to the present invention, wherein the symbol interleaver can perform symbol interleaving without requiring a memory, such as ROM. More specifically, when the SCCC block is inputted, symbol interleaved data may be directly outputted without having to use a memory, such as ROM.

The symbol interleaver 5016 of FIG. 52 includes a pattern generator 5110 and a pattern output unit 5220. The pattern generator 5110 may include a modulo counter 5111, a multiplexer 5113, an accumulator 5114, a multiplier 5115, and a modulo operator 5116. The pattern output unit 5220 may include a data remover 5221 and a buffer 5222. Herein, a modulo operation may be further included between the accumulator 5114 and the multiplier 5115. Also, the multiplier 5115 may be configured of multiple adders (or shifters).

In FIG. 52, B represents a Block length in symbols (e.g., SCCC block length) being inputted for symbol interleaving. And, L corresponds to a symbol unit block length actually being interleaved y the symbol interleaver 5016. At this point, $L=2^m$ (wherein m is an integer), wherein L should satisfy the condition of L≥B.

The modulo counter 5111 performs sequential counting starting from 0 to L. The accumulator 5114 receives a count value of the modulo counter 5111 starting from 0. The multiplexer 5113 selects a constant when starting the symbol interleaving process on an SCCC block. Thereafter, the multiplexer 5113 is fed-back with the output of the accumulator 5114, thereby outputting the feedback to the accumulator 5114. In this case, an initial offset value of symbol interleaving is equal to 0.

The accumulator 5114 adds the output of the modulo counter 5111 and the output of the multiplexer 5113 and, then outputs the added value to the multiplier 5113.

The multiplier 5115 multiplies the output of the accumulator 5114 by a constant 89, thereby outputting the multiplied result to the modulo operator 5116. The modulo operator 5116 performs a modulo L operation on the output of the multiplier 5115, thereby outputting the processed data to the pattern output unit 5220. According to an embodiment of the present invention, the modulo operator 5116 uses a bitwise mask function to perform the modulo L operation. For example, when the L value is equal to $2^{10}$, and when only the lower 10 bits among the output of the multiplier 5115 are outputted from the modulo operator 5116 and inputted to the pattern output unit 5220, the modulo L operation is performed.

When the output value is equal to or greater than B, the data remover 5221 of the pattern output unit 5220 discards the input value and outputs the processed data to the buffer 5222. According to an embodiment of the present invention, the buffer 5222 is configured to have a First Input First Output (FIFO) structure. The buffer 5222 condenses the remaining values that have not been discarded by the data remover 5221 and then stores the condensed values, which are then outputted in accordance with the stored order. Therefore, the first output B outputted from the buffer 5222 corresponds to the symbol interleaving pattern P(i). At this point, the index i value of the symbol interleaving pattern P(i) increases from 0 to B-1. If the modulo counter 5111 continues to be operated, and when the next output B is collected from the buffer 5222, the symbol interleaving pattern at this point becomes the inverse order of the symbol interleaving pattern P(i). More specifically, the index i value of the symbol interleaving pattern P(i) decreases from B−1 to 0.

Therefore, when the initial offset is set to an L/2 value and not to '0', and when symbol interleaving is started, the first B output becomes an inverse order of the interleaving pattern P(i). In this case, the initial offset value of symbol interleaving becomes an L/2 value.

If 0 is used as the initial offset value, the $L^{th}$ value being fed-back from the accumulator 5114 becomes (L−1)*L/2, and the modulo L of the feedback value is L/2.

For example, when the initial offset value is set to 0, the symbol interleaving pattern P(i) may be obtained. And, when the initial offset value is set to an L/2 value, an inverse order of the interleaving pattern P(i), i.e., a symbol deinterleaving pattern $P(i)^{-1}$ may be obtained from the beginning. For example, when the symbol deinterleaver 5014 sets an L/2 value as the initial offset value, and when the symbol interleaver 5016 sets '0' as the initial offset value, only one symbol interleaving pattern P(i) is used to performed both the symbol deinterleving and symbol interleaving processes.

Alternatively, when only one initial offset is set, and when the modulo operator 5111 performs a counting process up to 2 L, a symbol interleaving pattern and a symbol deinterleaving pattern may be generated by using a single initial offset.

FIG. 53 illustrates an example of a symbol interleaving pattern generated when the offset value is equal to 0 according to the present invention. In the example shown in FIG. 53, L is equal to 12000, and the SCCC block length is equal to 16384. Herein, the output pattern in an index starting from 12000 to 23999 corresponds to an inverse order of the output pattern in an index starting from 0 to 11999.

Also, since interleaving and deinterleaving are inverse processes of one another, the interleaving pattern P(i) and the deinterleaving pattern P(i)$^{-1}$ are not required to be separately generated by the block decoder 1303. More specifically, symbol interleaving and deinterleaving operations may both be performed by using only the symbol interleaving pattern P(i).

(a) of FIG. 54 shows an exemplary process of performing symbol interleaving by using only the symbol interleaving pattern P(i). And, (b) of FIG. 54 shows an exemplary process of performing symbol deinterleaving by using only the symbol interleaving pattern P(i).

In (a) of FIG. 54, the symbol interleaving process is as described below.

1*a*. An interleaving pattern P(i) is generated.
1*b*. The i$^{th}$ input data symbol is written in location P(i) of the memory.
1*c*. Starting from location i of the memory, an i$^{th}$ output data symbol is read.

When the processes 1*a* to 1*c* are performed from 0 to B−1, the symbol interleaving process for one SCCC block is completed. Herein, the memory may correspond to a buffer 5222.

In (b) of FIG. 54, the symbol deinterleaving process is as described below.

2*a*. An interleaving pattern P(i) is generated.
2*b*. The i$^{th}$ input data symbol is written in location i of the memory.
2*c*. Starting from location P(i) of the memory, an i$^{th}$ output data symbol is read.

When the processes 2*a* to 2*c* are performed from 0 to B−1, the symbol deinterleaving process for one SCCC block is completed. Herein, the value of i ranges from 0 to B−1.

More specifically, in (a) and (b) of FIG. 54, step 1*b* and step 2*c* access the same address of the memory, and step 1*c* and step 2*b* access the same address of the memory.

Therefore, after reading previous data starting from a specific location (or position) of the memory, when current data are written in the corresponding location (or position), the symbol interleaver 5016 and the symbol deinterleaver 5014 may use a single permutation memory so as to perform symbol interleaving and symbol deinterleaving. More specifically, since an address of the memory can be shared during the symbol interleaving and symbol deinterleaving processes, the memory size may be reduced.

As described above, in the present invention, only one symbol interleaving pattern is used to perform symbol interleaving and symbol deinterleaving, thereby having the effect of reducing the memory size.

More specifically, the data multiplexer 5017 of the block decoder 1303 reorders (or rearranges) the output order of the symbol interleaver 5016 in accordance with the processing order of the symbol generated from an intermediate step (e.g., the group data formatter, the packet formatter, the data interleaver). Thereafter, the data multiplexer 5017 outputs the processed symbols to the TCM decoder 5012. Herein, the reordering process of the data multiplexer 5017 may be embodied as at least one of software, middleware, and hardware.

The soft-decision values being outputted from the symbol interleaver 5016 are matched to be in a one-to-one correspondence with mobile service data symbol positions corresponding to the number of SCCC blocks being outputted from the input buffer 5011. Then, the matched soft-decision values are inputted to the TCM decoder 5012. At this point, since a main service data symbol or an RS parity symbol, known data symbol, signaling information data, and so on, of the main service data do not correspond to mobile service data symbols, the data multiplexer 5017 inserts null data in the corresponding location (or position), thereby outputting the processed data to the TCM decoder 5012. Also, each time the symbols of the SCCC blocks are turbo-decoded, since there is no value being fed-back from the symbol interleaver 5016 at the beginning of the first decoding process, the data multiplexer 5017 inserts null data in all symbol positions including a mobile service data symbol, thereby transmitting the processed data to the TCM decoder 5012.

The second soft-decision values being outputted from the symbol decoder 5015 are inputted to the RS frame decoder 1304. For example, the symbol decoder 5015 does not output any second soft-decision value until turbo decoding is performed for a predetermined number of repetition (or iteration) times (e.g., M number of times). Thereafter, when M number of turbo-decoding processes on one SCCC block is all performed, the second soft-decision value of that specific point is outputted to the RS Frame decoder 1304. More specifically, after performing turbo-decoding for a predetermined number of times, the soft decision value of the symbol decoder 5015 is outputted to the RS frame decoder 1304. And, thus, the block decoding process on one SCCC block is completed.

In the present invention, this will be referred to as an iterative turbo decoding process for simplicity.

At this point, the number of iterative turbo decoding performed between the TCM decoder 5012 and the symbol decoder 5015 may be defined by considering hardware complexity and error correction performance. Accordingly, when the number of iterative turbo decoding increases, the error correction can be enhanced. However, this case disadvantageous in that the hardware may also increase.

RS Frame Decoder

The data outputted from the block decoder 1303 are in portion units. More specifically, in the transmitting system, the RS frame is divided into several portions, and the mobile service data of each portion are assigned either to regions A/B/C/D within the data group or to any one of regions A/B and regions C/D, thereby being transmitted to the receiving system. Therefore, the RS frame decoder 1304 groups several portions included in a parade so as to form an RS frame. Alternatively, the RS frame decoder 1304 may also group several portions included in a parade so as to form two RS frames. Thereafter, error correction decoding is performed in RS frame units.

For example, when the RS frame mode value is equal to '00', then one parade transmits one RS frame. At this point, one RS frame is divided into several portions, and the mobile service data of each portion are assigned to regions A/B/C/D of the corresponding data group, thereby being transmitted. In this case, the RS frame decoder 1304 extracts mobile service data from regions A/B/C/D of the corresponding data group, as shown in FIG. 55(*a*). Subsequently, the RS frame decoder 1304 may perform the process of forming (or creating) a portion on a plurality of data group within a parade, thereby forming several portions. Then, the several portions of mobile service data may be grouped to form an RS frame. Herein, if stuffing bytes are added to the last portion, the RS frame may be formed after removing the stuffing byte.

In another example, when the RS frame mode value is equal to '01', then one parade transmits two RS frames (i.e., a primary RS frame and a secondary RS frame). At this point, a primary RS frame is divided into several primary portions, and the mobile service data of each primary portion are assigned to regions A/B of the corresponding data group, thereby being transmitted. Also, a secondary RS frame is divided into several secondary portions, and the mobile service data of each secondary portion are assigned to regions C/D of the corresponding data group, thereby being transmitted.

In this case, the RS frame decoder 1304 extracts mobile service data from regions A/B of the corresponding data group, as shown in FIG. 55(*b*). Subsequently, the RS frame decoder 1304 may perform the process of forming (or creating) a primary portion on a plurality of data group within a parade, thereby forming several primary portions. Then, the several primary portions of mobile service data may be grouped to form a primary RS frame. Herein, if stuffing bytes are added to the last primary portion, the primary RS frame may be formed after removing the stuffing byte. Also, the RS frame decoder 1304 extracts mobile service data from regions C/D of the corresponding data group. Subsequently, the RS frame decoder 1304 may perform the process of forming (or creating) a secondary portion on a plurality of data group within a parade, thereby forming several secondary portions. Then, the several secondary portions of mobile service data may be grouped to form a secondary RS frame. Herein, if stuffing bytes are added to the last secondary portion, the secondary RS frame may be formed after removing the stuffing byte.

More specifically, the RS frame decoder 1304 receives the RS-encoded and/or CRC-encoded mobile service data of each portion from the block decoder 1303. Then, the RS frame decoder 1304 groups several portions, which are inputted based upon RS frame-associated information outputted from the signaling decoder 1306 or the operation controller 1307, thereby performing error correction. By referring to the RS frame mode value included in the RS frame-associated information, the RS frame decoder 1304 may form an RS frame and may also be informed of the number of RS code parity data bytes and the code size. Herein, the RS code is used to configure (or form) the RS frame.

The RS frame decoder 1304 also refers to the RS frame-associated information in order to perform an inverse process of the RS frame encoder, which is included in the transmitting system, thereby correcting the errors within the RS frame. Thereafter, the RS frame decoder 1304 performs a derandomizing process on the payload of the error-corrected RS frame.

FIG. 56 illustrates a block diagram showing the structure of an RS frame decoder 1304 according to an embodiment of the present invention. Herein, the RS frame decoder 1304 includes an RS frame builder 6111 and a RS-CRC decoder 6112.

When a primary RS frame and a secondary RS frame are both transmitted, the RS frame decoder 1304 of FIG. 56 may decode at least one of the RS frames among the primary RS frame and the secondary RS frame. According to an embodiment of the present invention, if decoding is performed on both the primary RS frame and the secondary RS frame, RS decoding is sequentially performed. According to an embodiment of the present invention, the operation controller 1307 uses RS frame mode information and SCCC mode information, so as to control the RS frame builder 6111 and the RS-CRC decoder 6112.

According to an embodiment of the present invention, the RS frame decoder 1304 performs error correction decoding on an RS frame configuring an ensemble selected by the user or by the system.

In order to do so, the RS frame builder 6111 collects (or gathers) data of the selected ensemble among the data outputted from the block decoder 1303, so as to configure an RS frame. Then, the RS frame builder 6111 outputs the configured RS frame to the CRC-RS decoder 6112. More specifically, the RS frame builder 6111 configures a portion from data of an SCCC block corresponding to the selected ensemble among the SCCC blocks being block decoded and outputted from the block decoder 1303. Subsequently, the RS frame builder 6111 collects a plurality of the portions so as to configure an RS frame. The CRC-RS decoder 6112 performs CRC-decoding and RS-decoding on the inputted RS frame, so as to correct the errors included in the RS frame. Then, after derandomizing the error-corrected RS frame, the CRC-RS decoder 6112 outputs the derandomized RS frame to the M/H TP interface block 1305.

FIG. 57 illustrates, when the RS frame mode value is equal to '00', an exemplary process of grouping several portion being transmitted to a parade, thereby forming an RS frame and an RS frame reliability map.

More specifically, the RS frame decoder 1304 receives and groups a plurality of mobile service data bytes, so as to form an RS frame. According to the present invention, in transmitting system, the mobile service data correspond to data RS-encoded in RS frame units. At this point, the mobile service data may already be error correction encoded (e.g., CRC-encoded). Alternatively, the error correction encoding process may be omitted.

It is assumed that, in the transmitting system, an RS frame having the size of (N+2)×(187+P) bytes is divided into M number of portions, and that the M number of mobile service data portions are assigned and transmitted to regions A/B/C/D in M number of data groups, respectively. In this case, in the receiving system, each mobile service data portion is grouped, as shown in FIG. 57(*a*), thereby forming an RS frame having the size of (N+2)×(187+P) bytes.

At this point, when stuffing bytes (S) are added to at least one portion included in the corresponding RS frame and then transmitted, the stuffing bytes are removed, thereby configuring an RS frame and an RS frame reliability map. For example, as shown in FIG. 27, when S number of stuffing bytes are added to the corresponding portion, the S number of stuffing bytes are removed, thereby configuring the RS frame and the RS frame reliability map.

Herein, when it is assumed that the block decoder 1303 outputs a soft decision value for the decoding result, the RS frame decoder 1304 may decide the '0' and '1' of the corresponding bit by using the codes of the soft decision value. 8 bits that are each decided as described above are grouped to create 1 data byte. If the above-described process is performed on all soft decision values of several portions (or data groups) included in a parade, the RS frame having the size of (N+2)×(187+P) bytes may be configured.

Additionally, the present invention uses the soft decision value not only to configure the RS frame but also to configure a reliability map.

Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)×(187+P) bytes, the reliability map is also configured to have the size of (N+2)×(187+P) bytes. FIG. 57($a'$) and FIG. 57($b'$) respectively illustrate the process steps of configuring the reliability map according to the present invention.

Subsequently, the RS frame reliability map is used on the RS frames so as to perform error correction.

FIG. 58 illustrates an error correction decoding process according to an embodiment of the present invention.

According to an embodiment of the present invention, in case of FIG. 58, a CRC syndrome check process is performed once again on the CRC-RS decoded RS frame. And, the result of the CRC syndrome check process is marked in an error_indicator field within each M/H service data packet configuring the payload of the RS frame. Thereafter, the marked result is outputted for A/V decoding. For example, the error_indicator field of the M/H service data packet having an error existing therein is marked as '1', and the error_indicator field of the M/H service data packet having no error existing therein is marked as '0'. According to the embodiment of the present invention, if the error_indicator field value of all M/H service data packets within the RS frame payload is set to '0' and transmitted by the transmitting system, then based upon the CRC syndrome check result, only the error_indicator fields of the M/H service data packet rows are marked as '1'.

Thus, the probability of malfunctioning in blocks receiving and processing M/H service data packets (e.g., M/H TP interface block 1305) in later processes may be reduced. For example, the M/H TP interface block 1305 may discard any M/H service data packet having the error_indicator field marked as '1' without using the corresponding M/H service data packet. Accordingly, since the probability of malfunctioning in the M/H TP interface block 1305 can be reduced, the overall performance of the receiving system may be enhanced.

More specifically, when a (N+2)×(187+P)-byte size RS frame and a (N+2)×(187+P)-bit size RF frame reliability map are configured, as shown in (a) and (a') of FIG. 58, a CRC syndrome check is performed on the RS frame, so as to check whether or not an error has occurred in each row. Subsequently, the presence or absence of an error is marked on a CRC error flag corresponding to each row, as shown in (b) of FIG. 58. At this point, since the portion of the reliability map corresponding to the CRC checksum as no applicability, the corresponding portion is removed (or deleted or discarded), so that only N×(187+P) number of reliability information remains, as shown in (b') of FIG. 58.

As described above, after performing the CRC syndrome check, (187+P, 187)-RS decoding is performed on N number of columns. At this point, RS-decoding is performed on only N number of columns excluding the last 2 columns from the overall (N+2) number of columns because the last 2 columns are configured only of CRC checksum and also because the transmitting system did not perform RS-encoding on the last 2 columns.

At this point, depending upon the number of errors marked on the CRC error flag, either an erasure decoding process is performed or a general RS-decoding process is performed.

For example, when the number of rows including CRC error is less than or equal to a maximum number of errors correctable by RS erasure decoding (according to the embodiment of the present invention, the maximum number is '48'), (235,187)-RS erasure decoding is performed on the RS frame having (18+P) number of N-byte rows, i.e., the RS frame having 235 N-byte rows in a column direction, as shown in (d) of FIG. 58. However, when the number of rows including CRC error is greater than the maximum number of errors (i.e., 48 errors) correctable by RS erasure decoding, RS erasure decoding cannot be performed. In this case, error correction may be performed through a general RS-decoding process. Herein, the present invention may further enhance the error correcting ability by using the reliability map, which was generated when configuring the RS frame, from a soft decision value.

More specifically, the RS frame decoder 1304 compares the absolute value of the soft decision value of the block decoder 1303 with the pre-determined threshold value, so as to determine the reliability of the bit value decided by the code of the corresponding soft decision value. Also, 8 bits, each being determined by the code of the soft decision value, are grouped to form one data byte. Accordingly, the reliability information on this one data byte is indicated on the reliability map.

Therefore, as shown in (d) of FIG. 58, even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points.

Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column.

As described above, the present invention may apply the process (d) of FIG. 58 or the process (d') of FIG. 58, so as to perform error correction decoding on N number of columns excluding the last 2 columns within the RS frame.

After performing error correction decoding on the N number of columns, the number of RS errors is counted as shown in (e) of FIG. 58.

At this point, if an error did not occur in any of the columns, or if all errors have been corrected in process (d) of FIG. 58 or process (d') of FIG. 58, i.e., if the number of RS errors is equal to '0', this indicates that there is no error in the (N+187)-byte RS frame payload configuring the M/H service data packet within the corresponding RS frame. Herein, as shown in (f) of FIG. 58, derandomizing is performed on the (N+187)-byte RS frame payload as an inverse process of the transmitting system. Thereafter, when outputting each M/H service data packet (i.e., M/H TP packet) of the derandomized RS frame payload to the M/H TP interface block 1305, the output is performed by setting the value of the error_indicator field within the M/H service data packet to '0' (i.e., indicating that there is no error), as shown in (g) of FIG. 58. More specifically, the value of the error_indicator field within each of the M/H service data packets configuring the RS frame payload is equally set to '0'.

Meanwhile, even though RS-decoding is performed, errors in N number of columns may all remain without being corrected. In this case, the number of RS errors is not equal to '0'.

In this case, as shown in (h) of FIG. 58, a CRC syndrome check is performed once again on the RS-decoded RS frame, thereby checking once again whether or not an error exists in 187 rows.

The CRC syndrome check is repeated in (h) of FIG. 58 because, although RS-decoding has not been performed on the last 2 columns (i.e., CRC checksum data) of the RS frame, RS-decoding has been performed on the N number of columns including M/H service data packet. Accordingly, the effects (or influence) of the error corrected by RS-decoding may be verified and reflected (or applied).

More specifically, after performing CRC-RS decoding, when the present invention repeats the CRC syndrome check process once again on each row, as shown in (h) of FIG. 58, and derandomizes the RS frame payload processed with CRC syndrome checking, as shown in (i) of FIG. 58, and when the present invention outputs the derandomized RS frame payload, the present invention marks the CRC syndrome check result in the error_indicator field of the M/H service data packet configuring the corresponding row, as shown in (j) of FIG. 58.

For example, when performing the CRC syndrome check once again, if it is determined that there is not CRC error in the RS frame, the value of the error_indicator field within each M/H service data packet of the derandomized RS frame payload is equally set to '0'.

When performing the CRC syndrome check once again, if it is determined that a CRC error exists in a specific row of the RS frame, for example, the second and third rows of the RS frame, the values of the error_indicator field within the second and third M/H service data packets of the derandomized RS frame payload are marked to be equal to '1', and the value of the error_indicator field within the remaining M/H service data packets is equally marked to be equal to '0'.

The present invention is provided with a number (=M) of RS frame decoders aligned in parallel, wherein the number corresponds to the number of parades included in one M/H frame. Herein, the RS frame decoder may be configured by being provided with a multiplexer connected to the input end of each of the M number of RS frame decoders, so as to multiplex a plurality of portions, and a demultiplexer connected to the output end of each of the M number of RS frame decoders.

Signaling Decoding

The signaling decoder 1306 extracts and decodes signaling information (e.g., TPC and FIC information), which was inserted and transmitted by the transmitting system, from the received (or inputted) data. Thereafter, the signaling decoder 1306 provides the decoded signaling information to the block(s) requiring such information.

More specifically, the signaling decoder 1306 extracts and decodes TPC data and FIC data, which were inserted and transmitted by the transmitting system, from the equalized data. Then, the signaling decoder 1306 outputs the TPC data to the operation controller 1307, and the signaling decoder 1306 outputs the FIC data to the FIC processor 1308. For example, the TPC data and the FIC data are inserted in the signaling information region of each data group, thereby being received.

At this point, the signaling information area within the data group may be known by using the known data position information that is outputted from the known sequence detector 1506. The signaling information area corresponds to the area starting from the first segment to a portion of the second segment of M/H block B4 within the data group, as shown in FIG. 33. More specifically, in the present invention, 276 (=207+69) bytes of the M/H block B4 within each data group are allocated to an area for inserting the signaling information. In other words, the signaling information area is configured of 207 bytes corresponding to the first segment of M/H block B4 and of the first 69 bytes of the second segment of M/H block B4. Additionally, the first known data sequence (i.e., first training sequence) is inserted in the last 2 segments of M/H block B3, and the second known data sequence (i.e., second training sequence) is inserted in the second and third segments of M/H block B4. At this point, since the second known data sequence is inserted after the signaling information area and then received, the signaling decoder 1306 may extract and decode signaling information of the signaling information area from the data being outputted from the channel synchronizer 1301 or the channel equalizer 1302.

FIG. 59 illustrates a block diagram of the signaling decoder 1306 according to an embodiment of the present invention. The signaling decoder 1306 performs iterative turbo decoding and RS-decoding on the data of the signaling information region among the equalized data. Thereafter, the transmission parameter (i.e., TPC data) obtained as a result of the above-described process is outputted to the operation controller 1307, and the FIC data are outputted to the FIC processor 1308.

For this operation, the signaling decoder 1306 may include an iterative turbo decoder 7111, a derandomizer 7112, a demultiplexer 7113, an RS decoder 7114, a block deinterleaver 7115, and an RS decoder 7116.

FIG. 60 is a detailed block diagram illustrating the iterative turbo decoder 7111. Referring to FIG. 60, upon receiving the signaling information area's data from among the equalized data, a demultiplexer (DeMux) 7200 discriminates symbols corresponding to respective branches of the signaling encoder 304 of the transmission system, and outputs the discriminated symbols to buffers 7201 and 7401, respectively.

The buffers 7201 and 7401 store input data corresponding to the signaling information area, and respectively repeatedly output the stored input data to the demultiplexers 7202 and 7402 during the turbo decoding process.

In accordance with one embodiment of the present invention, it is assumed that output data of the even encoder 573 in the signaling encoder of the transmission system is processed to be input to $0^{th}$, $2^{nd}$, ..., $10^{th}$ trellis encoders (i.e., even number trellis encoders), and output data of the odd encoder 575 is processed to be input to $1^{st}$, $3^{rd}$, ..., $11^{th}$ trellis encoders. In this case, the demultiplexer 7202 outputs output data of the buffer 7201 to a trellis decoder (i.e., TCM decoder) corresponding to the even number trellis encoder. The demultiplexer 7202 receives data fed back from the block deinterleaver 7507, and outputs the feed-back data to the same trellis decoder (i.e., TCM decoder) corresponding to the even number trellis encoder.

Figure 37:
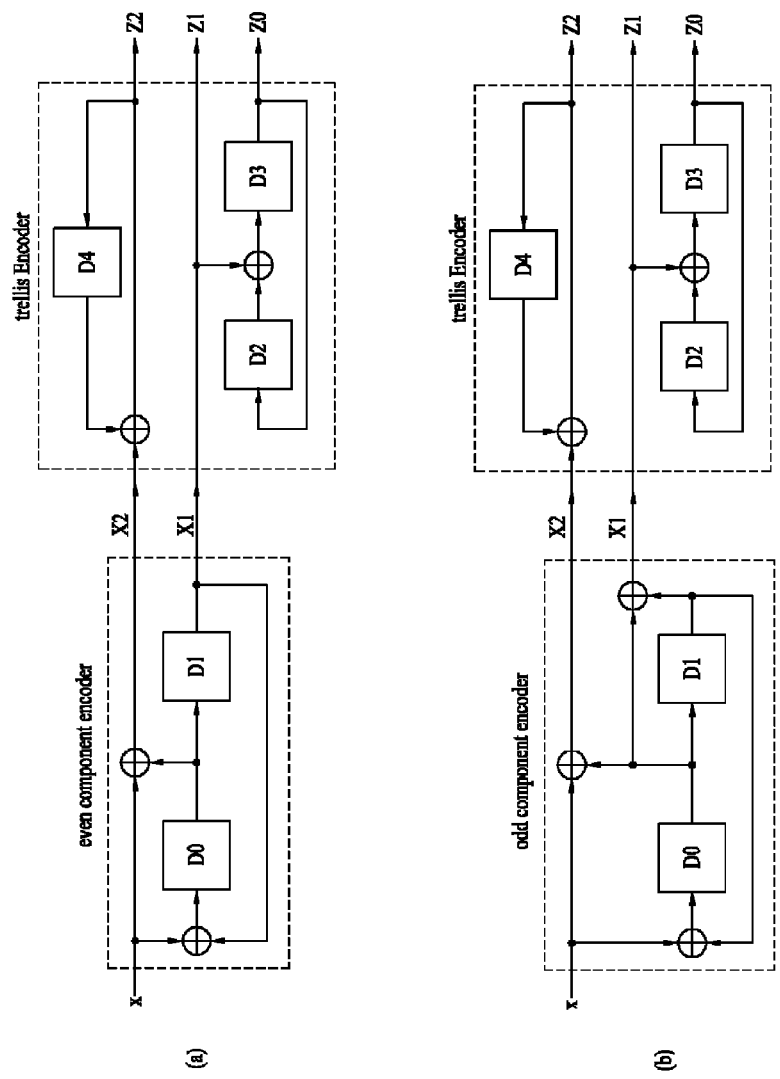
FIG. 37(*b*) illustrates an exemplary case in which a trellis encoder is serially concatenated with the odd component encoder shown in FIG. 36(*b*)

In this case, output data of each trellis decoder (TCM decoder) corresponds to a log likelihood ratio (LLR) value. The LLR value is a result from taking a logarithm of a soft decision value. More specifically, the LLR value corresponds to a log likelihood ratio (LLR) between a likelihood of input bit being equal to '1' and a likelihood of input bit being equal to '0'. An initial value of the LLR is set to zero. The LLR value is transferred to the even component decoder corresponding to the even component encoder contained in the signaling encoder of the transmission system. Input/output (I/O) data of the even component decoder is such an LLR value as well. In this case, since a single even number trellis decoder interoperates with a single even component decoder, an even component encoder and an even number trellis encoder are considered as a single encoder (effective component encoder) as shown in FIG. 37 (a). Hence, the even number trellis decoder and the even component decoder can be merged into a single effective component decoder. In the case where the two decoders configure a single decoder, decoding performance will be enhanced although complexity increases due to the increased number of states.

Output signals of the even component decoders 7300 to 7305 are sequentially transferred to the multiplexer 7306 and are then transferred to the block interleaver 7307. The block interleaver 7307 has the same configuration as a block interleaver used for the signaling encoder of the transmitting side.

The LLR value block-interleaved by the block interleaver 7307 is fed back to the demultiplexer 7402. The demultiplexer 7402 outputs the LLR value to a corresponding trellis decoder (i.e., TCM decoder) from among six trellis decoders, and at the same time transmits output data of the buffer 7401 to the trellis decoder. For example, provided that the LLR value fed back from the block deinterleaver 7507 is an LLR value of the first decoder 7500, the demultiplexer 7402 outputs this feed-back LLR value and the output data of the buffer 7401 to the trellis decoder of the first decoder 7500.

The above-mentioned rules are equally applied to the demultiplexer 7202. The odd number trellis decoder and the odd component decoder can be operated in the same manner as in the even number trellis decoder and the even component decoder. Likewise, the odd number trellis decoder and the odd component decoder can be implemented as a single effective component decoder.

Output signals of the odd number decoders 7500 to 7505 are sequentially transferred to the multiplexer 7506, and are then forwarded to the block deinterleaver 7507. The block deinterleaver 7507 is an inverse process of the block interleaver. Thus, the LLR value block-deinterleaved by the block deinterleaver 7507 is input to the demultiplexer 7202 to accomplish the iterative turbo decoding.

After the iterative turbo decoding has been repeatedly performed at a predetermined level, the iterative turbo-decoded result is output to the derandomizer 7112.

At this point, in the above-mentioned iterative turbo decoding process, the even and odd decoders must have trellis diagram information of a corresponding encoder. Each of the encoders shown in FIGS. 37(a) and 37(b) has five memories D0 to D4 so as to obtain 32 states (i.e., $2^5$ states). However, the number of states acquired when start states of all the signaling information areas are constant may be limited to the number of only some states among a total of 32 states. That is, if it is assumed that a start state of the effective component encoder is limited to a specific state, the effective component encoder may have a smaller number of states as compared to 32 states.

For example, all memories of the even/odd component encoders of the iterative turbo encoder (i.e., PCCC encoder) are each set to zero at the beginning of each signaling information area of a single data group. Because the signaling information area just follows a first known data sequence (i.e., $1^{st}$ training sequence) and the first known data sequence is designed to allow all memories in each of the twelve trellis encoders to have a state of zero at the end of the first known data sequence. As a result, the respective memories of the effective component encoder always start from a state '00000'. That is, all memories of the effective component encoder are each set to a state of zero at the beginning of the signaling information area. In this way, provided that all memories of the effective component encoders in the signaling information area start from the state '00000', the data encoding can be achieved using only specific states among 32 states although data of the signaling information area is considered to be random.

The signaling information area ranges from a first segment of an M/H block 'B4' of a data group to some parts of a second segment thereof. That is, 276 (=207+69) bytes of the M/H block 'B4' of each data group are assigned to an area for inserting signaling information. In other words, the signaling information area is composed of 207 bytes corresponding to a first segment of the M/H block 'B4' and first 69 bytes of a second segment thereof. In addition, the first known data sequence (i.e., the first training sequence) is inserted into the last 2 segments of an M/H block 'B3', and a second known data sequence (i.e., the second training sequence) is inserted into second and third segments of an M/H block 'B4'. In this case, the second known data sequence is located just behind the signaling information area. Third to sixth known data sequences (i.e., third to sixth training sequences) are respectively inserted into the last 2 segments of the M/H blocks B4, B5, B6, and B7.

FIG. 61 is a trellis diagram including states capable of being acquired when a start state for the even decoder is set to '00000'. FIG. 62 is a trellis diagram including states capable of being acquired when a start state for the odd decoder is set to '00000'.

For example, if it is assumed that the even component encoder and the trellis encoder are regarded as a single encoder (i.e., a single effective component encoder) in the same manner as in FIG. 37(a), only 16 states from among 32 states are effective. For another example, if it is assumed that the odd component encoder and the trellis encoder are regarded as a single encoder (i.e., a single effective trellis encoder) in the same manner as in FIG. 37(b), only 8 states are effective as shown in FIG. 62.

In this way, in the case where the component encoder and the trellis encoder are implemented as a single effective component encoder and then the encoding of data is carried out in the single effective component encoder, the number of states to be selected from among 32 states for the above-mentioned encoding process is changed according to the component encoder structures. In this case, states to be used for the encoding process are changed according to which one of states is used as a start state.

For example, if it is assumed that the odd component encoder and the trellis encoder are regarded as a single effective component encoder in the same manner as in FIG. 37(b), the number of states to be used for the encoding is 8. In addition, if it is assumed that memories of the effective component encoder shown in FIG. 37(b) are designed to always start from the state '00000' in the signaling information area, the above 8 states become '00000', '00111', '01010', '01101', '10001', '10110', '11011', and '11100', respectively.

In this way, since only some states from among a total of states are used when the transmission system encodes data of the signaling information area, the iterative turbo decoder 7111 of the signaling decoder 1306 can perform turbo decoding of data using only the effective states, thereby greatly reducing complexity of the turbo decoder.

Meanwhile, the derandomizer 7112 performs derandomizing of the iterative turbo-decoded data, and outputs the derandomized result to the demultiplexer 7113. The demultiplexer (Demux) 7113 discriminates between TPC data composed of 18 bytes and FIC data composed of 51 bytes on the basis of the derandomized data.

Here, the TPC data is output to the RS decoder 7114 corresponding to an RS (18, 10) of a GF 256. The RS decoder 7114 receives a result of hard decision from the iterative turbo decoder 7111 so as to perform general RS decoding, or the RS decoder 7114 receives the result of soft decision from the iterative turbo decoder 7111 so as to perform RS erasure decoding. TPC data (i.e., transmission parameter information) error-corrected by the RS decoder 7114 is output to the operation controller 1307. In this case, the RS decoder 7114 further transmits the decision result to the operation controller 1307, so that it prevents the occurrence of operational failure which may be generated from misjudgment of the transmission parameter.

Also, since some information of the TPC data is repeatedly transmitted to each group, decoding performance can be improved using such a feature. For example, in case of FEC mode information such as SCCC or RS, since information of next M/H frame is repeatedly transmitted to three sub frames at the rear of one M/H frame, even though decoding is successfully performed once within the three subframes, there is no problem in receiving the next M/H frame.

The FIC data discriminated by the demultiplexer 7113 is output to a (TNoG×51) block deinterleaver 7115. The block deinterleaver 7115 is an inverse process of the (TNoG×51) block interleaver of the signaling encoder of the transmitting side.

For example, the (TNoG×51) block interleaver of the transmitting side is a variable-length block interleaver, and interleaves FIC data contained in each subframe in units of a (TNoG (columns)×51 (rows)) block. In this case, 'TNoG' is indicative of a total number of data groups allocated to a subframe contained in a single M/H frame.

The FIC data block-deinterleaved by the block deinterleaver 7115 is input to the RS decoder 7116 corresponding to the RS (51, 37) of the GF 256. In the same manner as in the RS decoder 7114 for TPC data, the RS decoder 7116 is able to use both the hard decision value and the soft decision value, and FIC data error-corrected by the RS decoder 7116 is output to the FIC processor 1308.

Meanwhile, TNoG value required by the block deinterleaver 7115 can be acquired from the TPC data output from the RS decoder 7114. To this end, the block deinterleaver 7115 includes a controller.

However, since TNoG of next M/H frame is transmitted to three subframes at the rear of one M/H frame, information of TNoG of the current subframe may not be obtained through TPC data decoding. For example, if the broadcast receiver is turned on at the third subframe (sub-frame #2) and starts to perform FIC decoding to obtain channel information, and performs FIC block deinterleaving using TNoG within the TPC data, the broadcast receiver cannot decode the FIC data until it reaches the next M/H frame.

Accordingly, the present invention suggests a method for decoding FIC data by acquiring TNoG even without using RS-decoded TPC data.

FIG. 63 illustrates a detailed embodiment of a process of extracting TNoG in accordance with the present invention.

The process of acquiring TNoG according to the present invention may be performed by the signaling decoder 1306, or may be performed by the operation controller 1307. According to one embodiment of the present invention, TNoG is acquired by the signaling decoder 1306. In particular, according to one embodiment of the present invention, a controller is provided at the block deinterleaver 7115 within the signaling decoder 1306, and acquires TNoG. This is only one example, and the controller may be provided outside the block deinterleaver 7115.

In other words, if a command to start FIC decoding is input, the signaling decoder 1306 searches start of next subframe. For example, it is supposed that a command to start FIC decoding is input at the middle of the n−1th subframe within one M/H frame as shown in (a) of FIG. 63. In this case, start of the nth subframe is searched.

Namely, if the command to start FIC decoding is input, in order to extract start of the subframe, it is identified whether a data group exists in a corresponding slot. For example, 16 slots are assigned to one subframe. At this time, since known data exist in the data group, it is identified whether the data group exists in the corresponding slot as shown in (b) of FIG. 63 through correlation between a pre-determined pattern of known data and received data. As another example, information as to whether the data group exists in the corresponding slot may be provided from the operation controller 1307.

At this time, if it is identified whether the data group exists in the corresponding slot, the signaling decoder 1306 performs turbo decoding, signaling derandomizing, and demultiplexing for data of the signaling information area within the data group to split TPC data, and performs RS decoding for the split TPC data. Then, the signaling decoder 1306 acquires a slot number from the RS-decoded TPC data as shown in (d) of FIG. 63.

The slot number becomes 0 at a start slot of each sub frame, and has a value of 15 at the last slot of the corresponding subframe. Accordingly, start of the subframe can be identified by using the slot number.

In other words, the signaling decoder 1306 repeatedly performs the signaling decoding process until the slot number having a value of 0 is detected from the TPC data. If the data group within the subframe is assigned and transmitted as shown in (a) of FIG. 63 and the command to start FIC decoding is input at the middle of the n−1th subframe, start of the nth subframe is detected through the signaling decoding process. If the start of the subframe is detected, the group counter value is reset to 0.

If start of the nth subframe is detected through the above process, the signaling decoder 1306 detects a data group from the nth sub frame.

The presence of the data group may be identified using the correlation between the known data pattern and the received data, or may be provided from the operation controller 1307.

If the data group is detected, the group counter value increases by 1 as shown in (f) of FIG. 63. The turbo decoder 7111 and the derandomizer 7112 perform turbo decoding and derandomizing for data of the signaling information area within the data group. Subsequently, the demultiplexer 7113 performs demultiplexing for the derandomized data to split TPC data from FIC data, and the RS decoder 7114 performs RS decoding for the split TPC data. The slot number is acquired from the RS-decoded TPC data. Also, the split FIC data (i.e., 51 bytes) are stored in a buffer (not shown) of the block deinterleaver 7115.

The steps are performed whenever the data group is detected from the subframe to increase the group counter value by 1, and the buffer of the block deinterleaver 7115 stores the split FIC data by the demultiplexer 7113.

This process is performed until the end of the subframe is detected. According to one embodiment of the present invention, the end of the subframe is detected using the slot number such as (d) of FIG. 63. According to another embodiment of the present invention, the end of the subframe is detected using the field synchronizing counter value such as (e) of FIG. 63.

If the end of the subframe is identified, TNoG is calculated using the group counter value.

The TNoG value is applied to the FIC data stored in the buffer of the block deinterleaver 7115 to perform block deinterleaving. The block deinterleaved FIC data are input to the RS decoder 7116 and then RS-decoded by the RS decoder 7116. In case of (g) and (h) of FIG. 63, turbo decoding and derandomizing are performed for the FIC data included in each data group of the nth sub frame for the nth subframe interval and then stored in the buffer of the block deinterleaver 7115. The TNoG calculated is applied to the FIC data of the nth subframe stored in the buffer of the block deinterleaver 7115 to perform block deinterleaving, RS decoding is performed for the block deinterleaved FIC data.

Meanwhile, the end of the subframe may be detected using either the slot number such as (d) of FIG. 63 or the field synchronizing counter value such as (e) of FIG. 63.

In other words, if the slot number acquired from the RS-decoded TPC data becomes 0, it means that a new subframe starts. Accordingly, if the slot number becomes 0, it is determined that the previous subframe has ended. In this case, since the group counter value increases by 1, the value obtained by subtracting 1 from the group counter value becomes the TNoG value.

However, next subframe is the first subframe of new M/H frame, and data group may not exist in next M/H frame due to PRC. Under the circumstances, if the end of the subframe is detected using the slot number, TNoG cannot be identified until M/H frame where data group exists is detected, whereby FIC decoding time may be delayed. In this case, start of the subframe can be determined using the new slot number, and the number of field synchronization values can be counted to identify the end of the subframe. This is because that eight field synchronization values in one subframe and field synchronization values are transmitted regardless of the presence of the data group. For example, if the field synchronization counter value is 8, it is determined as the end of the subframe. In this case, the group counter value becomes the TNoG value. The field synchronization values can also be detected through correlation.

As described above, the transmitting system, the receiving system, and the method of processing broadcast signals according to the present invention have the following advantages.

When transmitting mobile service data through a channel, the present invention may be robust against errors and backward compatible with the conventional digital broadcast receiving system.

Moreover, the present invention may also receive the mobile service data without any error even in channels having severe ghost effect and noise. Furthermore, by inserting known data in a particular position (or place) within a data region and transmitting the processed data, the receiving performance of the receiving system may be enhanced even in a channel environment that is liable to frequent changes.

When performing block deinterleaving on the turbo-decoded FIC data, by acquiring TNoG using slot information and data group information, the present invention may decode the FIC data, even when the TNoG information of the current subframe cannot be acquired by TPC data decoding. Therefore, the decoding performance of the FIC data may be enhanced.

After performing CRC-RS decoding, a CRC syndrome check may be performed once again on the RS frame, and the checked result is marked on an error_indicator field of the M/H service data packets configuring the payload of the RS frame. Thus, the likelihood of malfunction occurring in the block receiving and processing the M/H service data packet may be reduced, thereby enhancing the overall performance of the receiving system.

Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A receiving system comprising:
    a tuner configured to receive a passband broadcast signal including a data group that comprises mobile service data, signaling data, and a plurality of known data sequences,
    wherein one of the plurality of known data sequences includes a first M symbol sequence and a second M symbol sequence each having a first data pattern and the remaining known data sequences include N symbol sequences each having a second data pattern that is different from the first data pattern;
    a known sequence detector configured to:
        estimate an initial frequency offsets; and detect a position of at least one known data sequence based on the known data sequence having the first data pattern;

a carrier recovery unit configured to perform carrier recovery based on the estimated initial frequency offset and position information of the at least one known data sequence;

a baseband converter configured to perform complex multiplication between the passband broadcast signal and an output of the carrier recovery unit in order to convert the passband broadcast signal to a baseband broadcast signal;

a channel equalizer configured to estimate a channel impulse response (CIR) based on the position information of the at least one known data sequence and compensate for a channel distortion in the baseband broadcast signal; and a turbo decoder configured to perform Parallel Concatenated Convolutional Code (PCCC) decoding on the signaling data in the channel-distortion-compensated baseband broadcast signal, wherein the turbo decoder comprises:
a first decoder configured to perform a first decoding process to generate first-decoded signaling data in response to receiving the signaling data in the channel-distortion-compensated baseband broadcast signal and receiving deinterleaved signaling data;
an interleaver configured to interleave the first-decoded signaling data;
a second decoder configured to perform a second decoding process to generate second-decoded signaling data in response to receiving the signaling data in the channel-distortion-compensated broadcast signal and receiving the interleaved signaling data; and
a deinterleaver configured to deinterleave the second-decoded signaling data and provide the deinterleaved signaling data to the first decoder,
wherein the first decoder repeatedly performs the first decoding process and the second decoder repeatedly performs the second decoding process for a predetermined number of times.

2. The receiving system of claim 1, wherein the initial frequency offset comprises a rough frequency offset and a fine frequency offset.

3. The receiving system of claim 2, wherein the known sequence detector is further configured to:
divide the known data sequence having the first data pattern into multiple parts,
calculate a partial correlation value between the received passband broadcast signal and a known data sequence for each part;
estimate the rough frequency offset by calculating a correlation value between the first M symbol sequence and the second M symbol sequence; and
estimate the fine frequency offset.

4. The receiving system of claim 1, wherein the known data sequences having the second data pattern are spaced 16 segments apart within the data group.

5. The receiving system of claim 4, wherein the carrier recovery unit comprises:
an estimator configured to:
calculate correlation values between successive known data sequences having the second data pattern spaced 16 segments apart; and
estimate a residual frequency offset based on an argument of the calculated correlation values;

a multiplexer configured to select the estimated residual frequency offset based on the position information of the at least one known data sequence;
a loop filter configured to perform low pass filtering on the initial frequency offset and upon the selected residual frequency offset output; and
an oscillator configured to output a complex signal to the baseband converter, the complex signal corresponding to the frequency offset output from the loop filter.

6. The receiving system of claim 1, wherein:
the signaling data comprises fast information channel (FIC) data and transmission parameter channel (TPC) data,
the FIC data includes information for rapid mobile service acquisition, and
the TPC data includes version information of the FIC data.

7. The receiving system of claim 6, wherein the FIC data and the TPC data are positioned between the known data sequence having the first data pattern and one of the known data sequences having the second data pattern.

8. The receiving system of claim 1, further comprising
a block decoder configured to perform Serial Concatenated Convolutional Code (SCCC) decoding on the mobile service data in the channel-distortion-compensated baseband broadcast signal.

9. The receiving system of claim 8, further comprising a Reed-Solomon (RS) frame decoder configured to:
generate an RS frame by obtaining the SCCC-decoded mobile service data; and
perform Cyclic Redundancy Check (CRC)-decoding and RS-decoding on the generated RS frame.

10. The receiving system of claim 1, wherein:
the first decoder comprises N1-way trellis decoders and N1 component decoders connected to the N1-way trellis decoders; and
the second decoder comprises N2-way trellis decoders and N2 component decoders connected to the N2-way trellis decoders,
wherein N1 and N2 are greater than 1.

11. The receiving system of claim 1, wherein M is 528 and N is 1416.

12. A method of processing a broadcast signal, the method comprising:
receiving a passband broadcast signal including a data group that comprises mobile service data, signaling data, and a plurality of known data sequences;
wherein one of the plurality of known data sequences includes a first M symbol sequence and a second M symbol sequence each having a first data pattern and the remaining known data sequences include N symbol sequences each having a second data pattern that is different from the first data pattern;
estimating an initial frequency offset;
detecting a position of at least one known data sequence based on the known data sequence having the first data pattern;
performing carrier recovery based on the estimated initial frequency offset and position information of the at least one known data sequence in a carrier recovery unit;
performing complex multiplication between the passband broadcast signal and an output of the carrier recovery unit in order to convert the passband broadcast signal to a baseband broadcast signal;
estimating a channel impulse response (CIR) based on the position information of the at least one known data sequence;

compensating for channel distortion in the baseband broadcast signal; and performing Parallel Concatenated Convolutional Code (PCCC) decoding on the signaling data in the channel-distortion-compensated baseband broadcast signal, wherein performing PCCC decoding on the signaling data comprises:

performing a first decoding process to generate first-decoded signaling data in response to receiving the signaling data in the channel-distortion-compensated baseband broadcast signal and receiving deinterleaved signaling data;

interleaving the first-decoded signaling data;

performing a second decoding process to generate second-decoded signaling data in response to receiving the signaling data in the channel-distortion-compensated baseband broadcast signal and receiving the interleaved signaling data;

deinterleaving the second-decoded signaling data; and providing the deinterleaved signaling data to the first decoding process, and wherein the first decoding process and the second decoding process are repeatedly performed a predetermined number of times.

13. The method of claim 12, wherein the initial frequency offset comprises a rough frequency offset and a fine frequency offset.

14. The method of claim 13, wherein estimating the initial frequency offset further includes:

dividing the known data sequence having the first data pattern into multiple parts, calculating a partial correlation value between the received passband broadcast signal and a known data sequence for each part; and estimating the rough frequency offset by calculating a correlation value between the first M symbol sequence and the second M symbol sequence.

15. The method of claim 12, wherein the known data sequences having the second data pattern are spaced 16 segments apart within the data group.

16. The method of claim 15, wherein performing the carrier recovery comprises:

calculating correlation values between successive known data sequences having the second data pattern spaced 16 segments apart;

estimating a residual frequency offset based on an argument of the calculated correlation values;

selecting the estimated residual frequency offset based upon the position information of at least one known data sequence;

performing low pass filtering on the initial frequency offset and the selected residual frequency offset; and outputting a complex signal corresponding to the low-pass-filtered frequency offset.

17. The method of claim 12, wherein:

the signaling data comprises fast information channel (FIC) data and transmission parameter channel (TPC) data;

the FIC data include information for rapid mobile service acquisition; and the TPC data include version information of the FIC data.

18. The method of claim 17, wherein the FIC data and the TPC data are positioned between the known data sequence having the first data pattern and one of the known data sequences having the second data pattern.

19. The method of claim 12, further comprising performing Serial Concatenated Convolutional Code (SCCC) decoding on the mobile service data in the channel-distortion-compensated baseband broadcast signal.

20. The method of claim 19, further comprising:

generating an RS frame by obtaining the SCCC-decoded mobile service data; and performing Cyclic Redundancy Check (CRC)-decoding and RS-decoding on the generated RS frame.

21. The method of claim 12, wherein M is 528 and N is 1416.

* * * * *